US012283625B2

(12) United States Patent
Huang

(10) Patent No.: US 12,283,625 B2
(45) Date of Patent: Apr. 22, 2025

(54) MANUFACTURING METHOD OF SEMICONDUCTOR DEVICE

(71) Applicant: TAIWAN SEMICONDUCTOR MANUFACTURING COMPANY, LTD., Hsinchu (TW)

(72) Inventor: Yu-Lien Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/526,444

(22) Filed: Dec. 1, 2023

(65) Prior Publication Data

US 2024/0113206 A1   Apr. 4, 2024

Related U.S. Application Data

(62) Division of application No. 17/400,622, filed on Aug. 12, 2021, now Pat. No. 11,855,186.
(Continued)

(51) Int. Cl.
H01L 29/76 (2006.01)
H01L 21/8234 (2006.01)
H01L 27/088 (2006.01)
H01L 29/06 (2006.01)
H01L 29/66 (2006.01)
(Continued)

(52) U.S. Cl.
CPC .......... H01L 29/66795 (2013.01); H01L 21/823418 (2013.01); H01L 21/823431 (2013.01); H01L 27/0886 (2013.01); H01L 29/0649 (2013.01); H01L 29/7851 (2013.01)

(58) Field of Classification Search
CPC ....... H01L 29/66795; H01L 21/823418; H01L 21/823431; H01L 27/0886; H01L 29/0649; H01L 29/7851; H01L 21/743; H01L 21/76838; H01L 21/76895; H01L 21/76897; H01L 21/76898; H01L 21/823475; H01L 29/41791;
(Continued)

(56) References Cited

U.S. PATENT DOCUMENTS 9,105,490 B2   8/2015   Wang et al.
9,236,267 B2   1/2016   De et al.
(Continued)

Primary Examiner — Theresa T Doan
(74) Attorney, Agent, or Firm — Birch, Stewart, Kolasch & Birch, LLP

(57) ABSTRACT

A method includes forming a first multilayer interconnection structure over a carrier substrate. A first interlayer dielectric (ILD) layer is deposited over the first multilayer interconnection structure. A first source/drain contact is formed in the first ILD layer. After forming the first source/drain contact, a semiconductive layer is formed over the first source/drain contact and the first ILD layer. The semiconductive layer is patterned to form a semiconductor fin over the first source/drain contact. A gate structure is formed across the semiconductor fin. The semiconductor fin is patterned to form a first recess and a second recess in the semiconductor fin, such that the first recess exposes the first source/drain contact. First and second source/drain epitaxial structures are respectively formed in the first and second recesses of the semiconductor fin such that the first source/drain epitaxial structure is electrically connected to the first source/drain contact.

20 Claims, 73 Drawing Sheets

Related U.S. Application Data

(60) Provisional application No. 63/180,725, filed on Apr. 28, 2021.

(51) Int. Cl.
*H01L 29/78* (2006.01)
*H01L 29/94* (2006.01)

(58) Field of Classification Search
CPC ........... H01L 29/66439; H01L 29/0673; H01L 29/775; B82Y 10/00
USPC ........................................................ 257/288
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,304,932 B2 | 5/2019 | Kim et al. |
| 10,396,078 B2 | 8/2019 | Holt et al. |
| 10,896,957 B2 * | 1/2021 | Cho .................. H01L 21/02579 |
| 11,114,382 B2 * | 9/2021 | Varghese .......... H01L 21/76802 |

* cited by examiner

100

100

100

100

100

100a

100a

100a

100a

MANUFACTURING METHOD OF SEMICONDUCTOR DEVICE

PRIORITY CLAIM AND CROSS-REFERENCE

This application a Divisional application of the U.S. application Ser. No. 17/400,622, filed on Aug. 21, 2021, which claims priority to U.S. Provisional Application Ser. No. 63/180,725, filed Apr. 28, 2021, all of which are herein incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
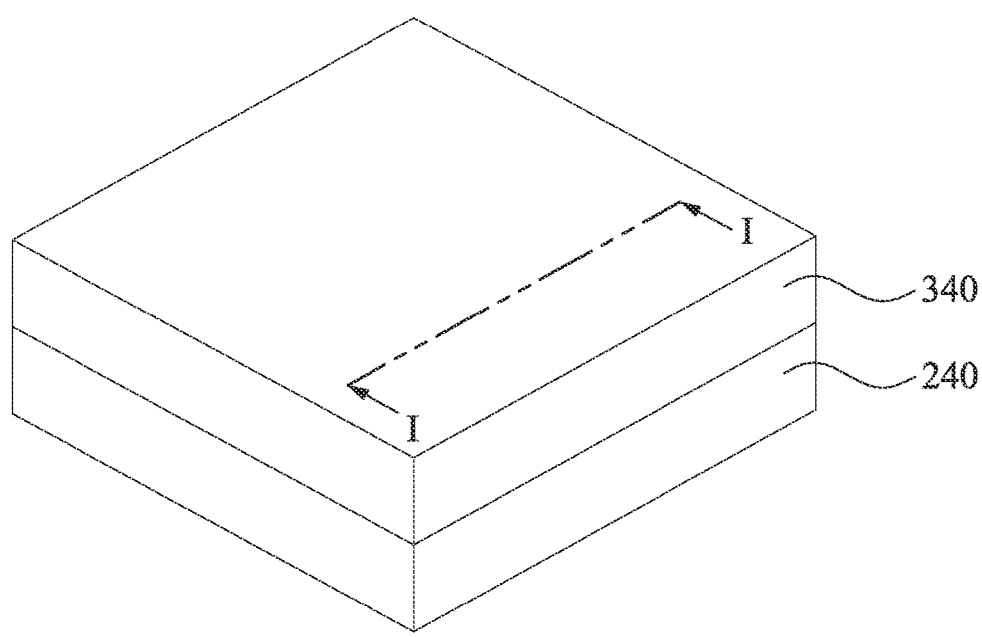
FIGS. 1A-16C illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present disclosure is related to semiconductor devices and methods of forming the same. More particularly, some embodiments of the present disclosure are related to semiconductor devices including a backside source/drain via under a source/drain structure for implementing a small-sized device.

FIGS. 1A-16C illustrate a method for manufacturing a semiconductor device (or an integrated circuit structure) 100 at various stages in accordance with some embodiments of the present disclosure. In addition to the semiconductor device 100, FIGS. 1A, 2A, 3A, 4A, 5A, 6A, 7A, 8A, 9A, 10A, 11A, 12A, and 16A depict X-axis, Y-axis, and Z-axis directions. In some embodiments, the semiconductor device 100 shown in FIGS. 1A-16C may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 1B:
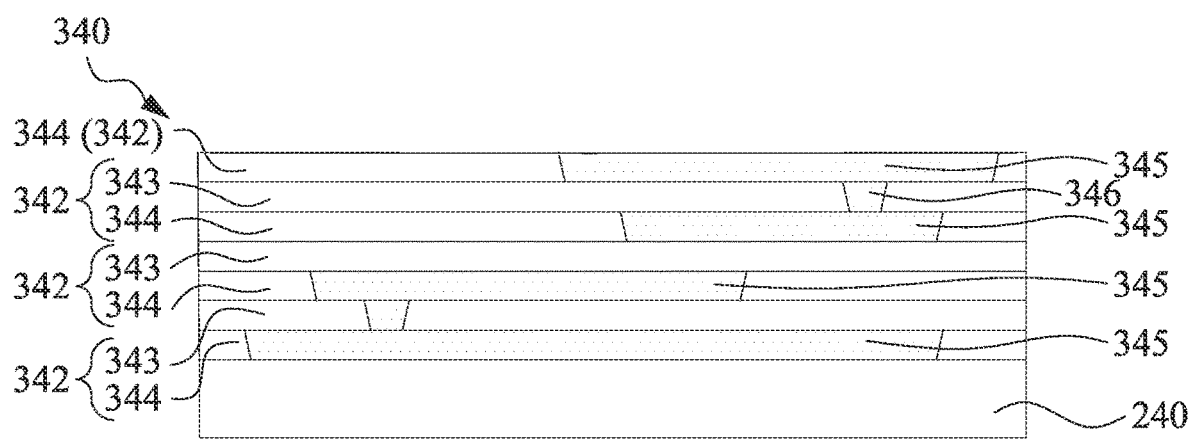

Reference is made to FIGS. 1A-1B, where FIG. 1B is a cross-sectional view taken along line I-I of FIG. 1A. A carrier substrate 240 is provided. The carrier substrate 240 may be silicon, doped or undoped, or may include other semiconductor materials, such as germanium; a compound semiconductor; or combinations thereof. The carrier substrate 240 may provide a structural support during subsequent processing on backside of the semiconductor device and may remain in the final product in some embodiments.

In some other embodiments, the carrier substrate 240 may be removed after the subsequent processing on front-side of semiconductor device is complete.

Subsequently, a backside multilayer interconnection (MLI) structure 340 is formed over the carrier substrate 240. The backside MLI structure 340 may include a plurality of backside metallization layers 342. For clarity, the backside metallization layers 342 are shown in FIG. 1B and are omitted in FIG. 1A. The number of backside metallization layers 342 may vary according to design specifications of the integrated circuit structure. Only three backside metallization layers 342 are illustrated in FIG. 1B for the sake of simplicity. Except the topmost backside metallization layers 342, the other backside metallization layers 342 each includes a first backside inter-metal dielectric (IMD) layer 343 and a second backside IMD layer 344. The first backside IMD layers 343 are formed over the corresponding second backside IMD layers 344. The backside metallization layers 342 include one or more horizontal interconnects, such as backside metal lines 345, respectively extending horizontally or laterally in the second backside IMD layers 344 and vertical interconnects, such as backside conductive vias 346, respectively extending vertically in the first backside IMD layers 343.

For example, a dielectric layer is formed over the carrier substrate 240, and openings are formed in the dielectric layer. Conductive materials are filled in the openings to form the backside metal lines 345. Another dielectric layer is then formed over the dielectric layer and the backside metal lines 345, and openings are formed in the dielectric layer. Another conductive material is then filled in the openings to form the backside conductive vias 346. These operations are performed cyclically, and the backside MLI structure 340 is formed. In some embodiments, since the backside metallization layers 342 are formed from bottom to top, the backside metal lines 345 and the backside conductive vias 346 are tapered downward (towards the carrier substrate 240) as shown in FIG. 1B.

The backside metal lines 345 and backside metal vias 346 can be formed using, for example, a single damascene process, a dual damascene process, the like, or combinations thereof. In some embodiments, the backside IMD layers 343-344 may include low-k dielectric materials having k values, for example, lower than about 4.0 or even 3.0 disposed between such conductive features. In some embodiments, the backside IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The backside metal lines and vias 345 and 346 may include metal materials such as copper, aluminum, tungsten, combinations thereof, or the like. In some embodiments, the backside metal lines and vias 345 and 346 may further include one or more barrier/adhesion layers (not shown) to protect the respective backside IMD layers 343-344 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

Figure 2A:
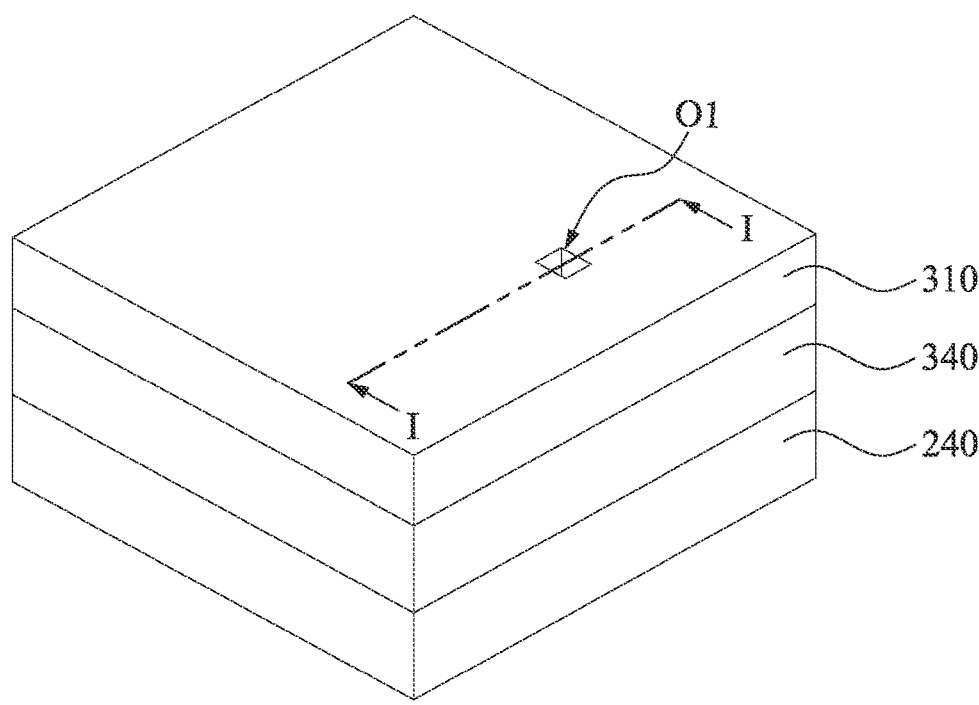
Figure 2B:
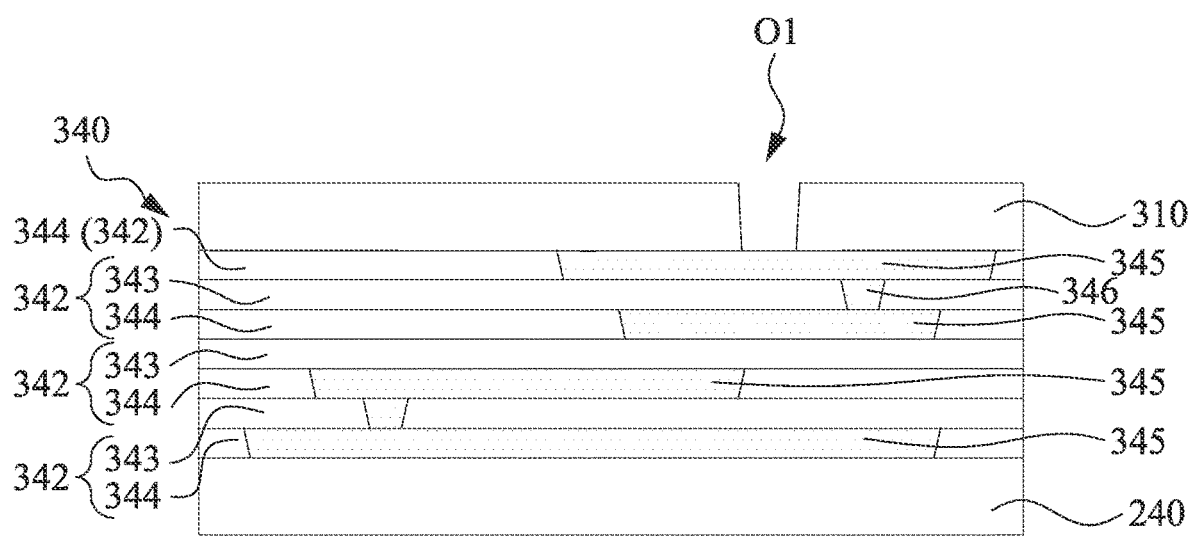

Reference is made to FIGS. 2A-2B, where FIG. 2B is a cross-sectional view taken along line I-I of FIG. 2A. As shown in FIG. 2A, a first interlayer dielectric (ILD) layer 310 is formed to cover the backside MLI structure 340. In some embodiments, the first ILD layer 310 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), or low-k dielectrics, and/or other suitable dielectric materials. The first ILD layer 310 may be deposited by a PECVD process, a flow-able depositing process, a spin on depositing process, or other suitable deposition technique. In some embodiments, after formation of the first ILD layer 310, the wafer may be subject to a high thermal budget process to anneal the first ILD layer 310.

Subsequently, at least one backside source/drain via O1 is formed in the first ILD layer 310 and extends to the backside MLI structure 340. As such, the backside source/drain via O1 exposes at least one of the backside metal lines 345. The backside source/drain via O1 may be formed by using a single or multiple etching process(es).

Figure 3A:
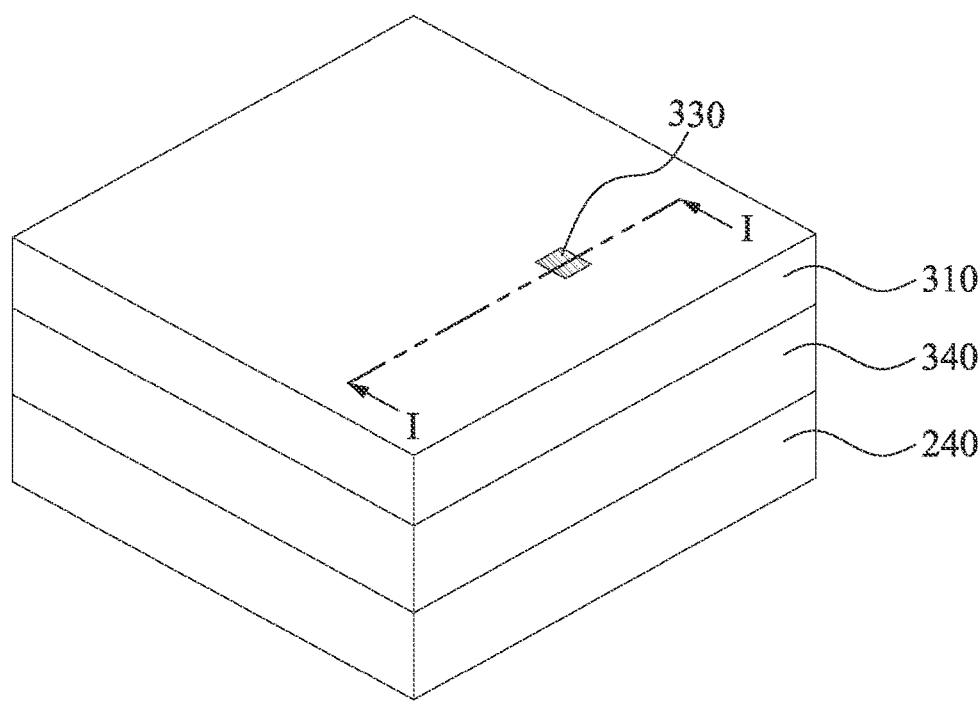
Figure 3B:
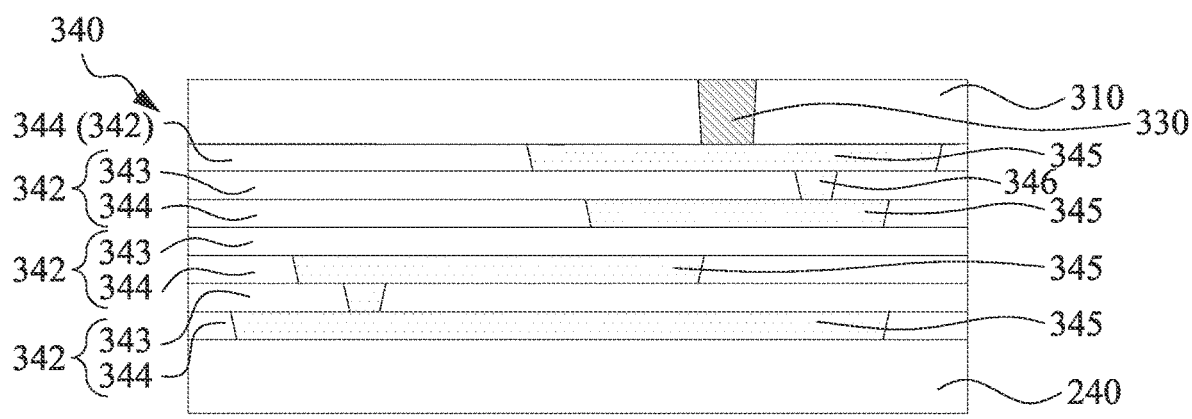

Reference is made to FIGS. 3A-3B, where FIG. 3B is a cross-sectional view taken along line I-I of FIG. 3A. A backside source/drain contact 330 is formed in the opening O1 (see FIG. 2A). Formation of the backside source/drain contact 330 includes depositing one or more metal materials overfilling the opening O1, and then performing a CMP process to remove excessive metal materials outside the opening O1. The backside source/drain contact 330 can be made of metals, such as tungsten, cobalt, aluminum, copper, or other suitable materials.

Figure 4A:
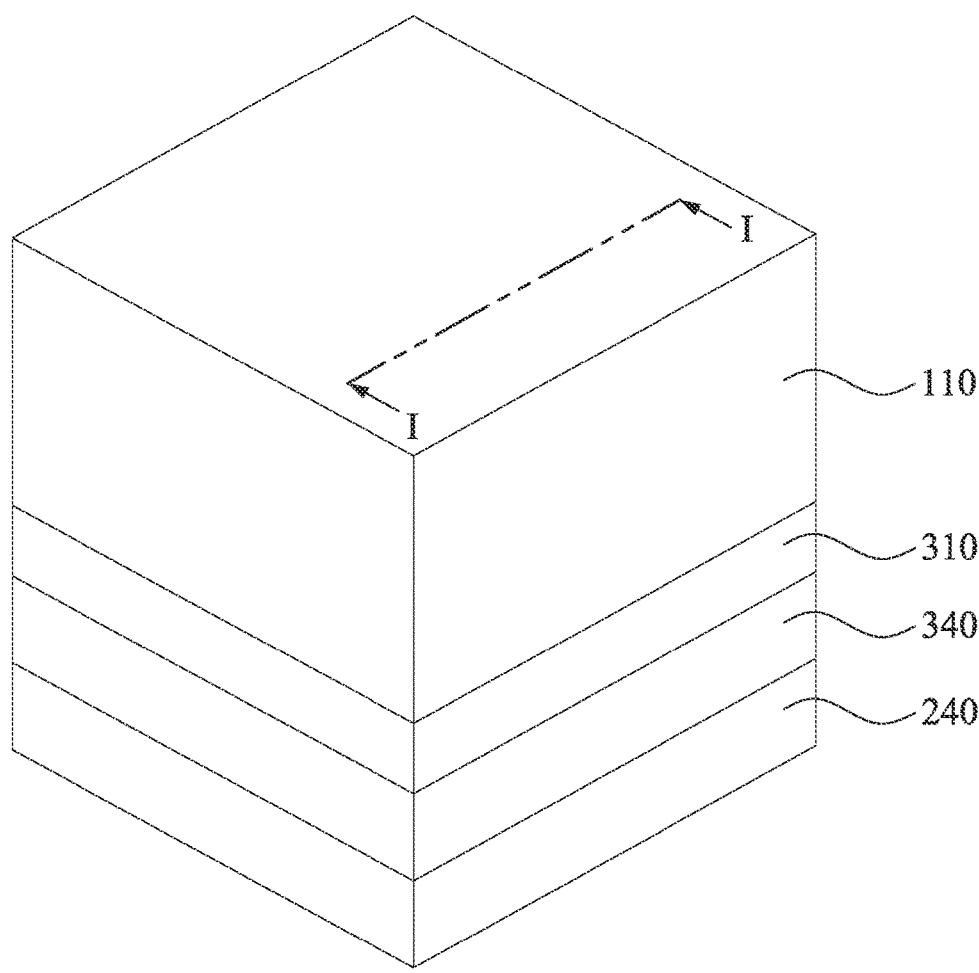
Figure 4B:
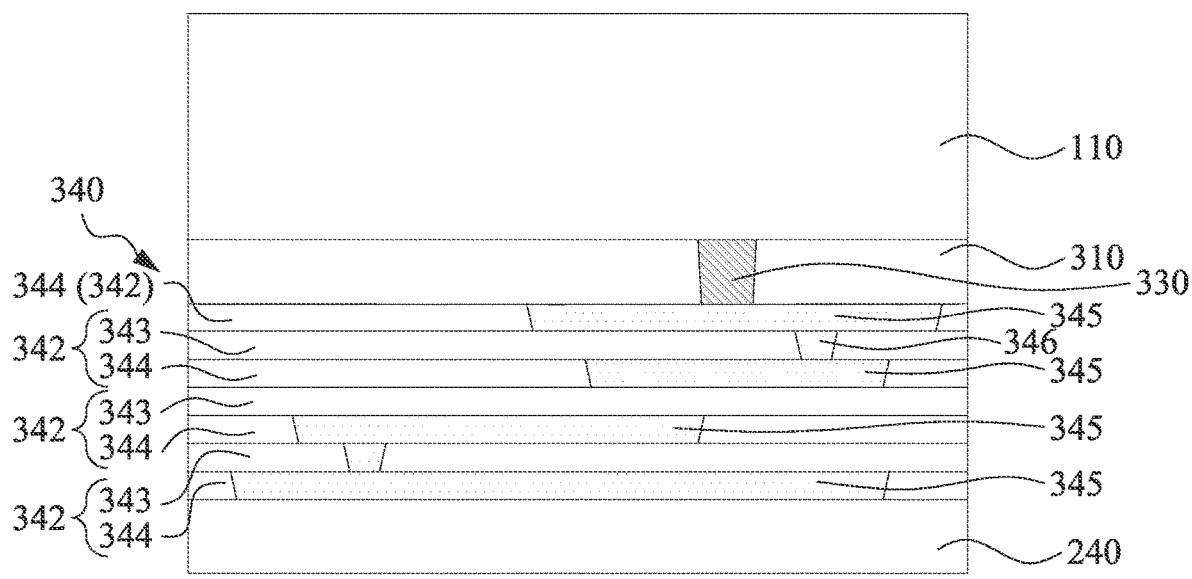

Reference is made to FIGS. 4A-4B, where FIG. 4B is a cross-sectional view taken along line I-I of FIG. 4A. Subsequently, a substrate 110 is formed over the first ILD layer 310. For example, a semiconductor material (such as a wafer) is bonded to the first ILD layer 310, and the semiconductor material is thin down to a predetermined thickness. Alternatively, the semiconductor material is epitaxially grown or CVD grown over the first ILD layer 310. In some embodiments, the substrate 110 is made of a suitable elemental semiconductor, such as silicon, germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 110 may include an epitaxial layer (epi-layer), which may be strained for performance enhancement, and/or may include a silicon-on-insulator (SOI) structure.

Figure 5A:
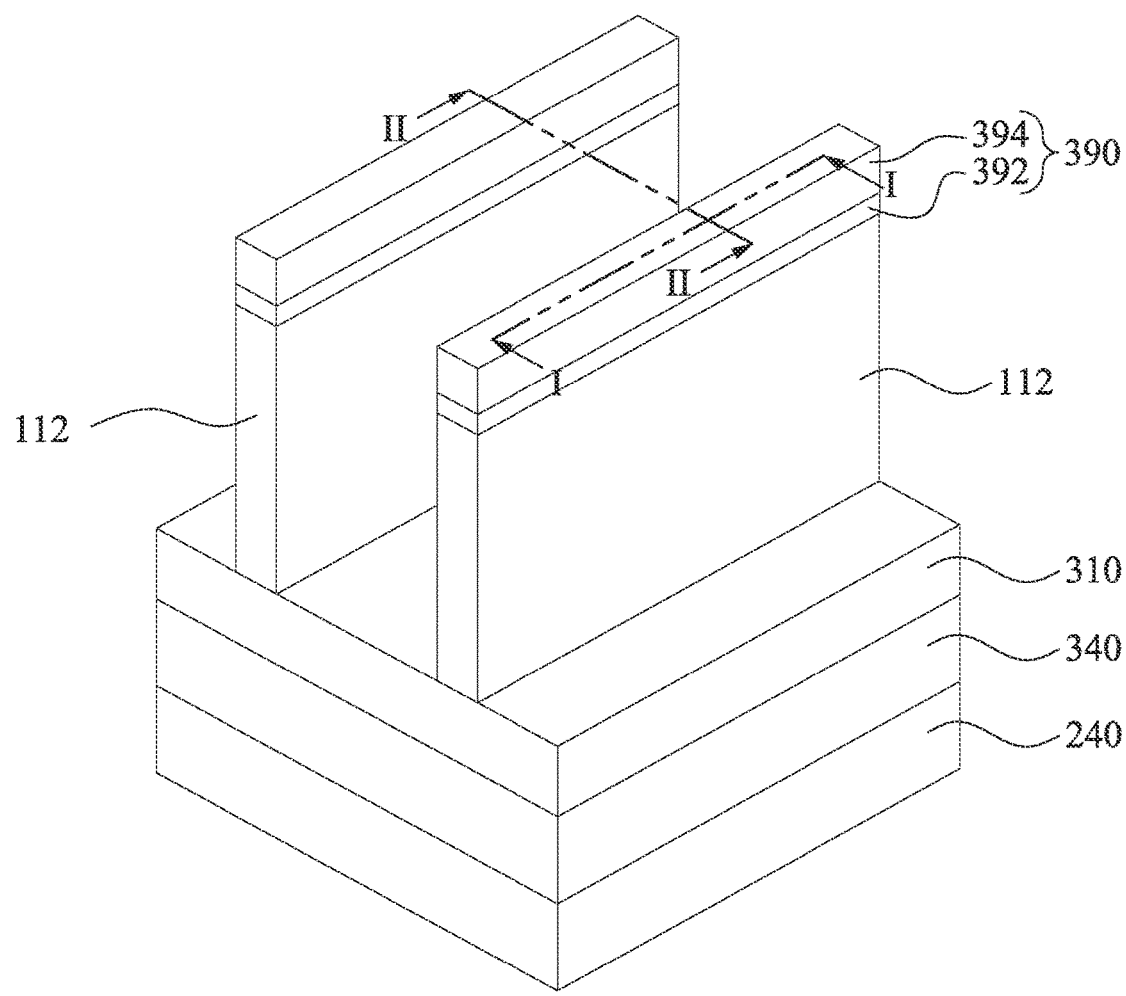
Figure 5B:
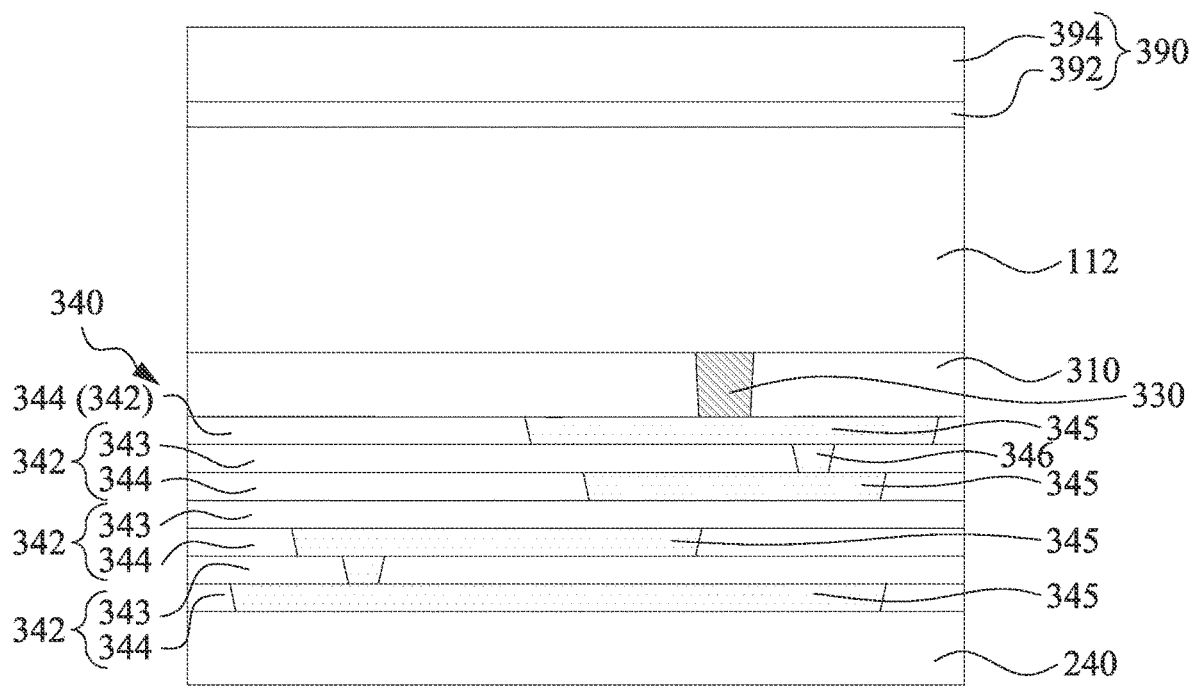
Figure 5C:
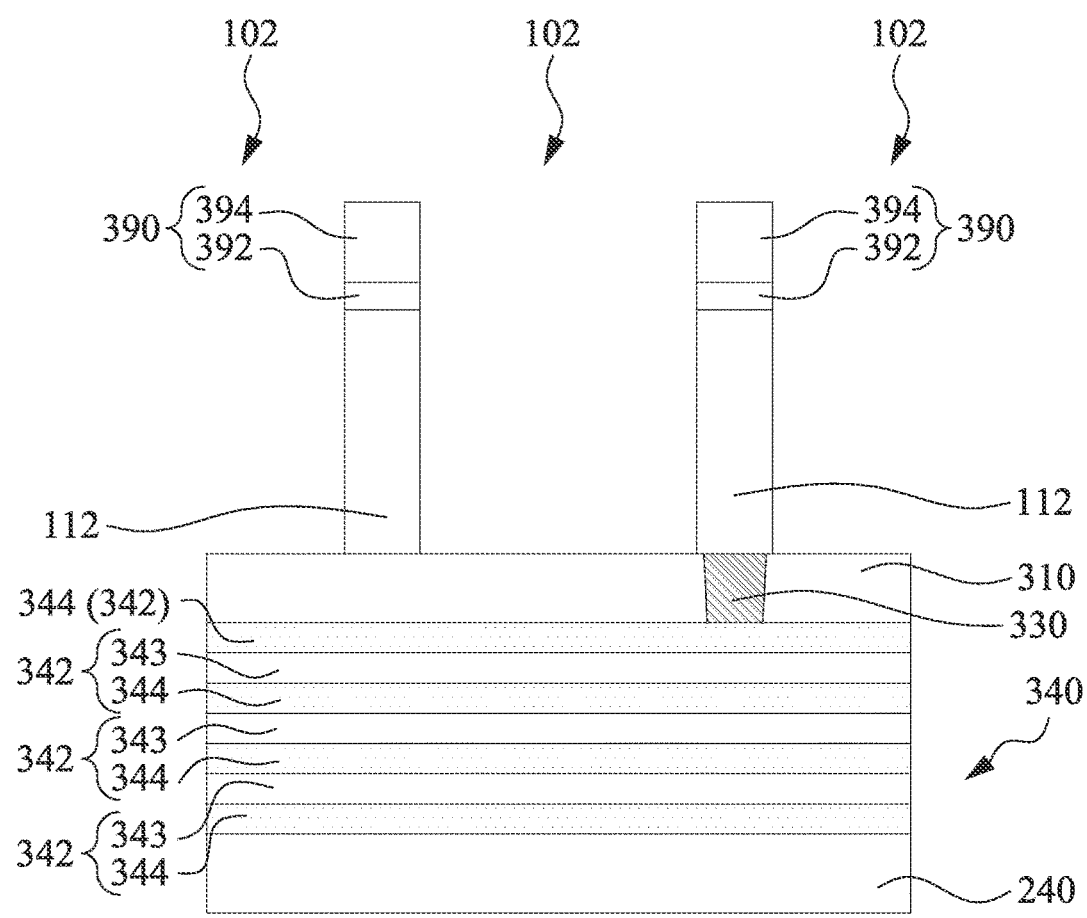

Reference is made to FIGS. 5A-5C, where FIG. 5B is a cross-sectional view taken along line I-I of FIG. 5A, and FIG. 5C is a cross-sectional view taken along line II-II of FIG. 5A. The substrate 110 (see FIG. 4A) is patterned to be one or more semiconductor fins (may be referred to as channel layers) 112. The semiconductor fins 112 may be N-type, P-type, or un-doped. For example, one or some of the semiconductor fins 112 are N-type, and one or some of the semiconductor fins 112 are P-type. The semiconductor fins 112 may be formed using, for example, a patterning process to form trenches such that trenches are formed between adjacent semiconductor fins 112. As discussed in greater detail below, the semiconductor fins 112 will be used to form FinFETs. It is understood that two semiconductor fins 112 are illustrated for purposes of illustration, but other embodiments may include any number of semiconductor fins. In some embodiments, one or more dummy semiconductor fins are formed adjacent to the semiconductor fins 112. As shown in FIGS. 5B and 5C, the backside source/drain via 330 is directly under the semiconductor fins 112.

The semiconductor fins 112 may be formed by performing an etching process to the substrate 110. Specifically, a patterned hard mask structure 390 is formed over the substrate 110. In some embodiments, the patterned hard mask structure 390 is formed of silicon nitride, silicon oxynitride, silicon carbide, silicon carbo-nitride, or the like. For example, the patterned hard mask structure 390 includes an oxide pad layer 392 and a nitride mask layer 394 over the oxide pad layer 392. The patterned hard mask structure 390 covers a portion of the substrate 110 while leaves another portion of the substrate 110 uncovered. The substrate 110 is then patterned using the patterned hard mask structure 390 as a mask to form trenches 102. Accordingly, the semiconductor fins 112 are formed. In some embodiments, one or more patterning process can be performed to cut at least one of the semiconductor fins 112 into plural sections, such that active regions of the semiconductor fins 112 can be defined according to different layout designs.

Figure 6A:
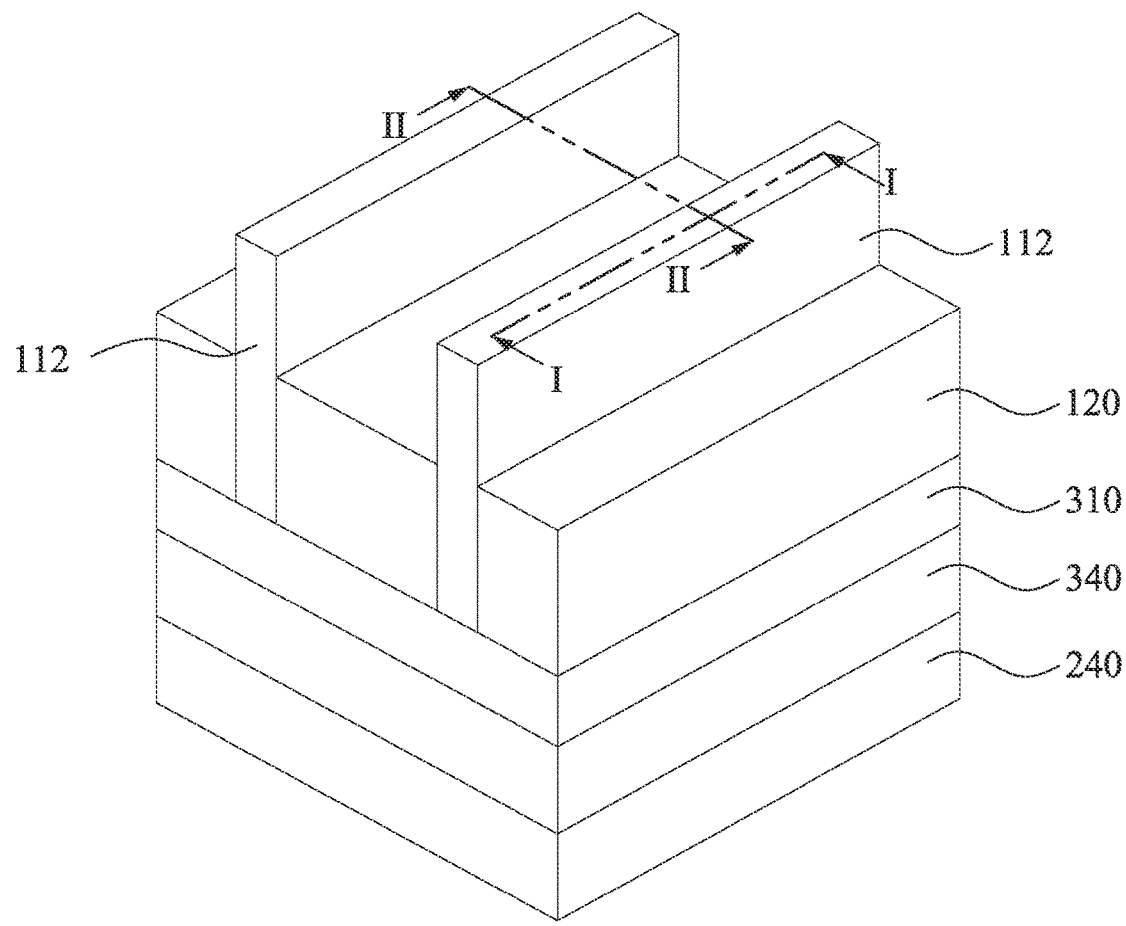
Figure 6B:
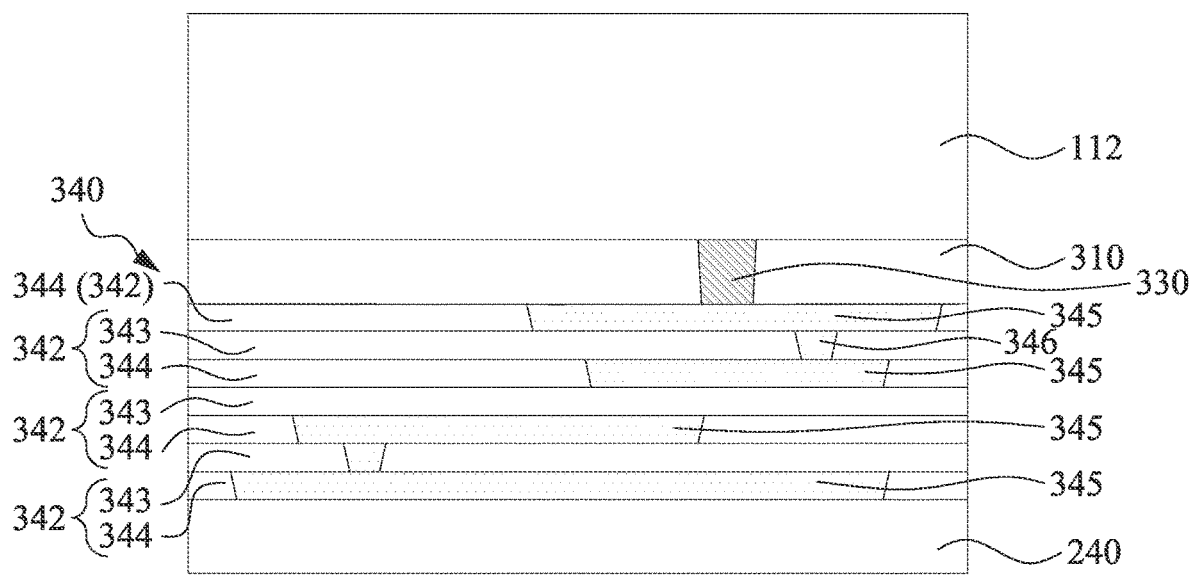
Figure 6C:
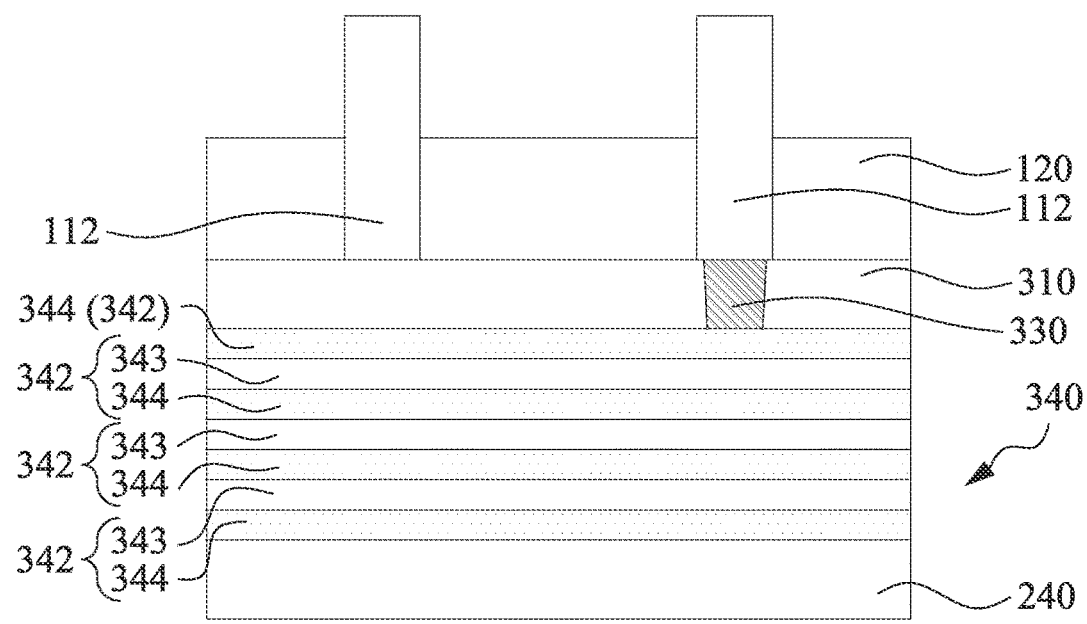

Reference is made to FIGS. 6A-6C, where FIG. 6B is a cross-sectional view taken along line I-I of FIG. 6A, and FIG. 6C is a cross-sectional view taken along line II-II of FIG. 6A. Isolation structures 120, such as shallow trench isolations (STI), are disposed in trenches 102 (see FIG. 5C) and over the first ILD layer 310. The isolation structures 120 can be equivalently referred to as an isolation insulating layer in some embodiments. The isolation structures 120 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, combinations of these, or the like. In some embodiments, the isolation structures 120 are formed through a process such as CVD, flowable CVD (FCVD), or a spin-on-glass process, although any acceptable process may be utilized. Subsequently, portions of the isolation structures 120 extending over the top surfaces of the semiconductor fins 112, are removed using, for example, an etch back process, chemical mechanical polishing (CMP), or the like. Further, the patterned hard mask structures 390 are removed as well.

The isolation structures 120 are then recessed to expose an upper portion of the semiconductor fin 112 as illustrated in FIG. 6A. In some embodiments, the isolation structures 120 are recessed using a single etch processes, or multiple etch processes. In some embodiments in which the isolation structures 120 is made of silicon oxide, the etch process may be, for example, a dry etch, a chemical etch, or a wet cleaning process. For example, the chemical etch may employ fluorine-containing chemical such as dilute hydrofluoric (dHF) acid.

Figure 7A:
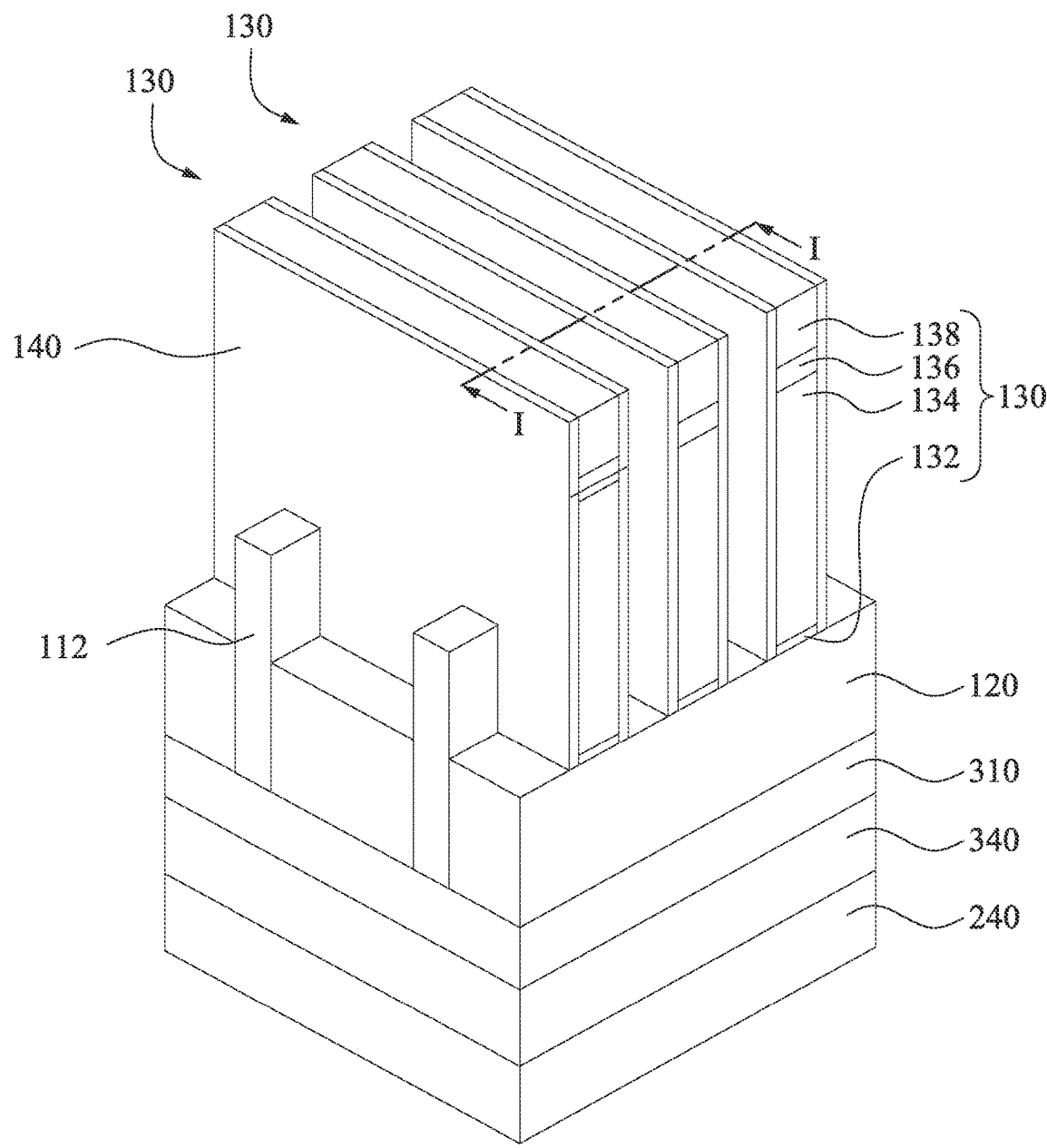
Figure 7B:
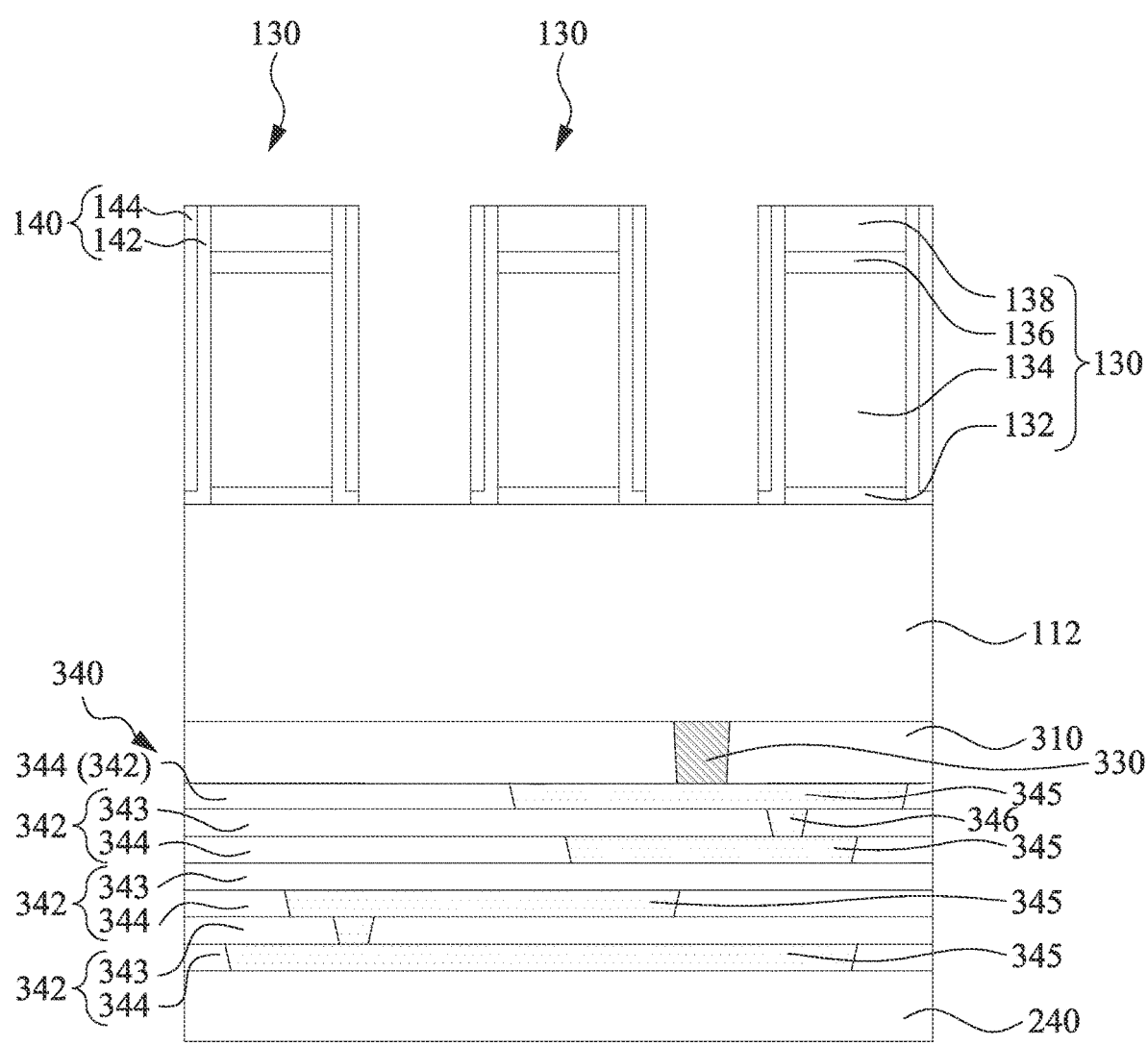

Reference is made to FIGS. 7A-7B, where FIG. 7B is a cross-sectional view taken along line I-I of FIG. 7A. After the isolation structures 120 are formed, dummy gate structures 130 are formed over the first ILD layer 310 and at least partially disposed over the semiconductor fins 112. The portions of the semiconductor fins 112 underlying the dummy gate structures 130 may be referred to as the channel regions, and the semiconductor fins 112 may be referred to as channel layers. The dummy gate structures 130 may also define source/drain (S/D) regions of the semiconductor fins 112, for example, the regions of the semiconductor fins 112 adjacent and on opposing sides of the channel regions.

Dummy gate formation operation first forms a dummy gate dielectric layer over the semiconductor fins 112. Subsequently, a dummy gate electrode layer and a hard mask which may include multiple layers (e.g., an oxide layer and a nitride layer) are formed over the dummy gate dielectric layer. The hard mask is then patterned to be nitride mask layers 138 and oxide mask layers 136, followed by patterning the dummy gate electrode layer to be dummy gate electrodes 134 by using the mask layers 138 and pad layers 136 as etch masks. The etch process may include a wet etch, a dry etch, and/or combinations thereof. The etch process is chosen to selectively etch the dummy gate dielectric layer without substantially etching the semiconductor fins 112, the dummy gate electrode layers 134, the oxide mask layers 136 and the nitride mask layers 138.

After formation of the dummy gate structures 130 is completed, gate spacers 140 are formed on sidewalls of the dummy gate structures 130. In some embodiments of the gate spacer formation operations, a spacer material layer is deposited on the substrate 110. The spacer material layer may be a conformal layer that is subsequently etched back to form gate spacers 140. In some embodiments, the spacer material layer includes multiple layers, such as a first spacer layer 142 (see FIG. 7B) and a second spacer layer 144 (see FIG. 7B) formed over the first spacer layer 142. The first and second spacer layers 142 and 144 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 142 and 144 may be formed by depositing in sequence two different dielectric materials over the dummy gate structures 130 using processes such as, an ALD process, a PEALD (plasma enhanced ALD) process, a PECVD process, a subatmospheric CVD (SACVD) process, or other suitable process. An anisotropic etching process is then performed on the deposited spacer layers 142 and 144 to expose portions of the semiconductor fins 112 not covered by the dummy gate structures 130 (e.g., in the source/drain regions of the semiconductor fins 112). Portions of the spacer layers 142 and 144 directly above the dummy gate structures 130 may be removed by this anisotropic etching process. Portions of the spacer layer 142 and 144 on sidewalls of the dummy gate structures 130 may remain, forming gate sidewall spacers, which are denoted as the gate spacers 140, for the sake of simplicity. In some embodiments, the first spacer layer 142 is formed of silicon oxide that has a lower dielectric constant than silicon nitride, and the second spacer layer 144 is formed of silicon nitride that has a higher etch resistance against subsequent etching processing (e.g., etching source/drain recesses in the semiconductor fins 112) than silicon oxide. In some embodiments, the gate spacers 140 may be used to offset subsequently formed doped regions, such as source/drain regions. The gate spacers 140 may further be used for designing or modifying the source/drain region profile.

Figure 8A:
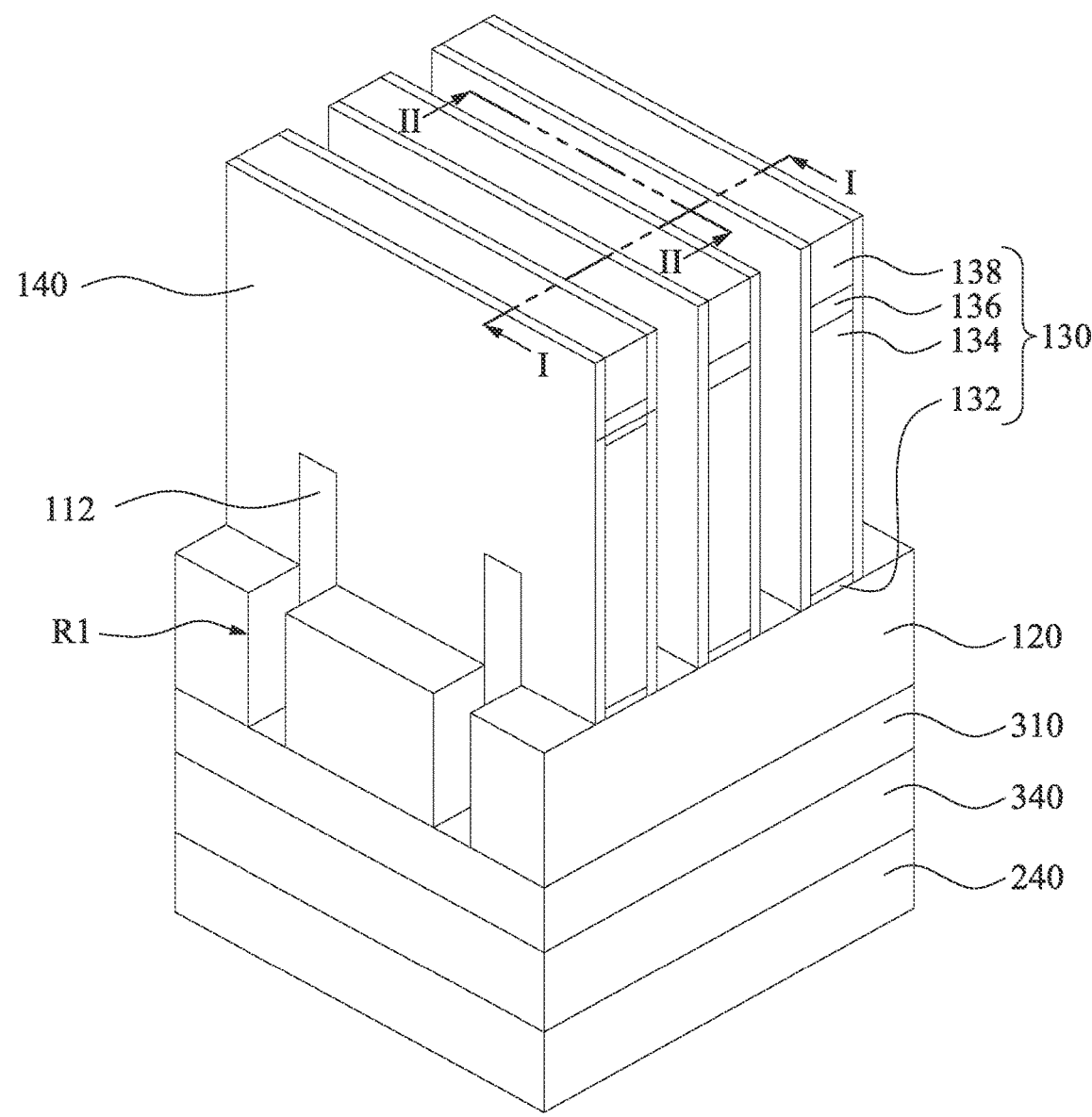
Figure 8B:
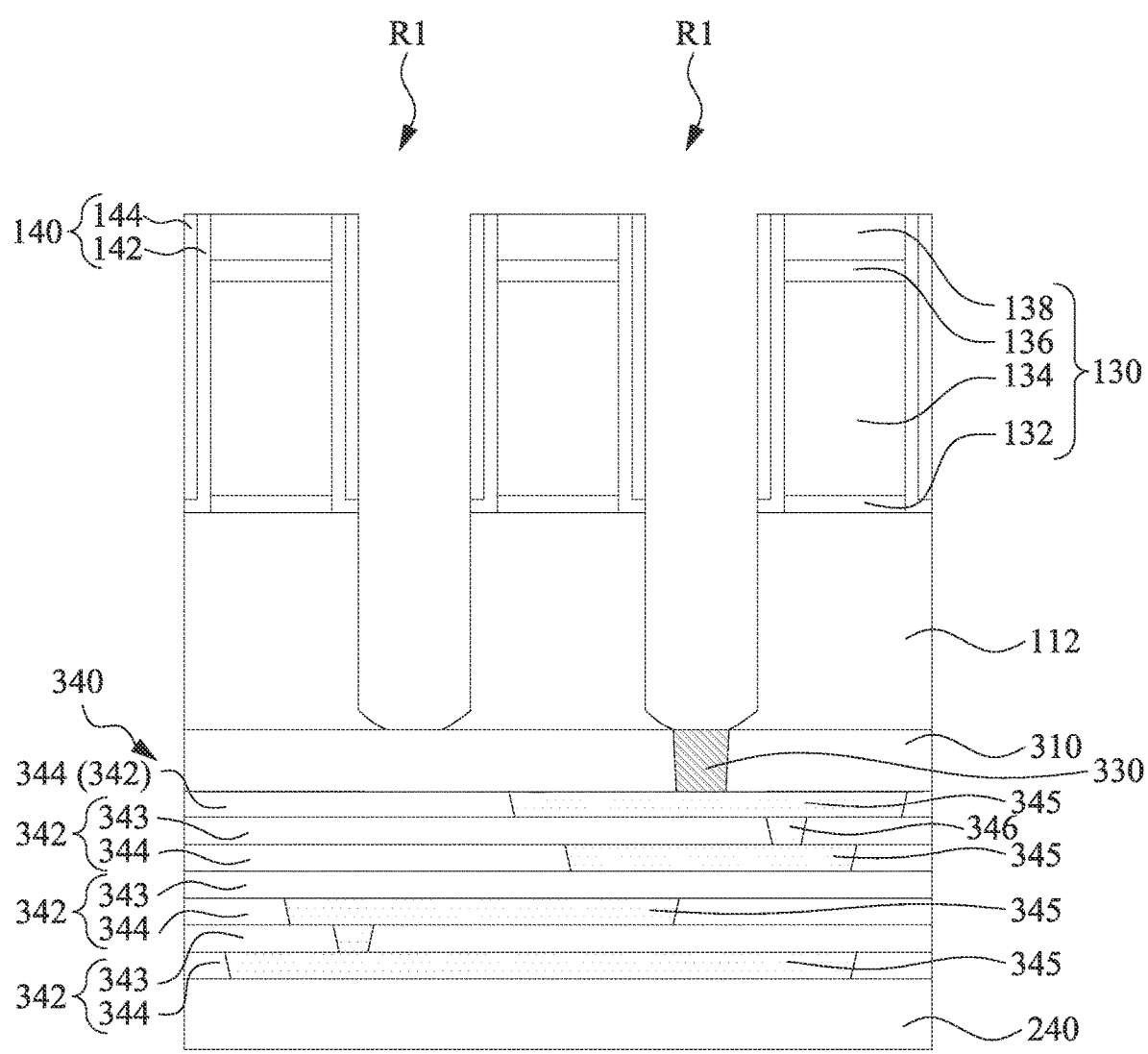
Figure 8C:
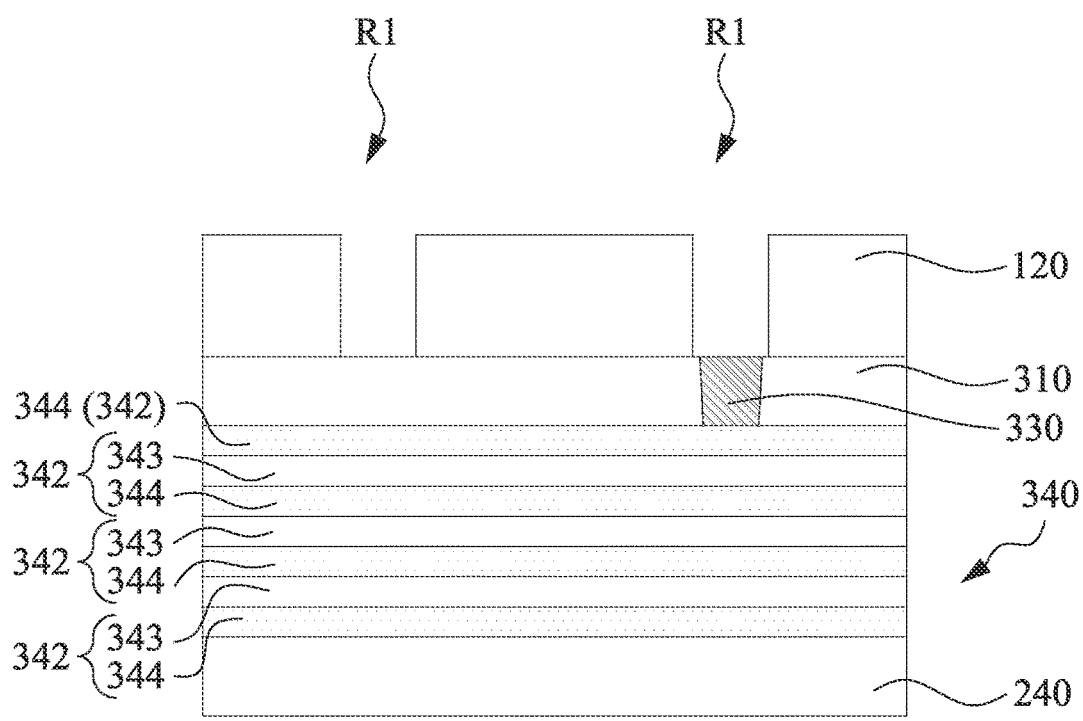

Reference is made to FIGS. 8A-8C, where FIG. 8B is a cross-sectional view taken along line I-I of FIG. 8A, and FIG. 8C is a cross-sectional view taken along line II-II of FIG. 8A. After the formation of the gate spacers 140 is completed, source/drain regions of the semiconductor fins 112 are recessed to form recesses R1 in the semiconductor fins 112. As such, at least one recess R1 exposes the backside source/drain contact 330. The source/drain regions of the semiconductor fins 112 can be recessed using suitable selective etching processing that attacks the semiconductor fins 112, but barely attacks the gate spacers 140 and the mask layers 138 of the dummy gate structures 130. For example, recessing the semiconductor fins 112 may be performed by a dry chemical etch with a plasma source and an etchant gas.

The plasma source may be inductively coupled plasma (ICP) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fins 112 at a faster etch rate than it etches the gate spacers 140 and the mask layers 138 of the dummy gate structures 130. In some other embodiments, recessing the semiconductor fin 112 may be performed by a wet chemical etch, such as ammonium peroxide mixture (APM), $NH_4OH$, tetramethylammonium hydroxide (TMAH), combinations thereof, or the like, which etches the semiconductor fins 112 at a faster etch rate than it etches the gate spacers 140 and the mask layers 138 of the dummy gate structures 130. In some other embodiments, recessing the semiconductor fins 112 may be performed by a combination of a dry chemical etch and a wet chemical etch.

Figure 9A:
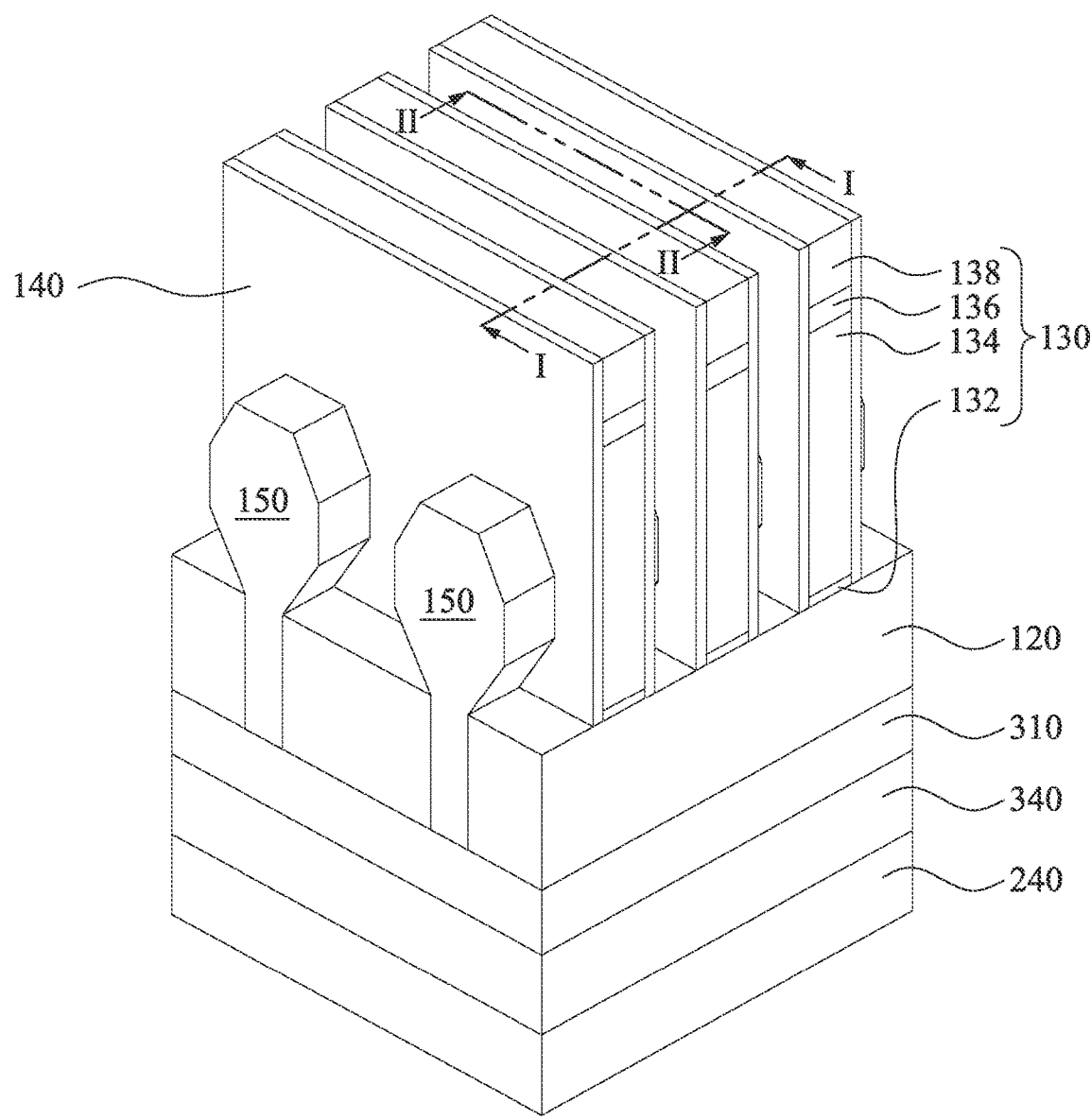
Figure 9B:
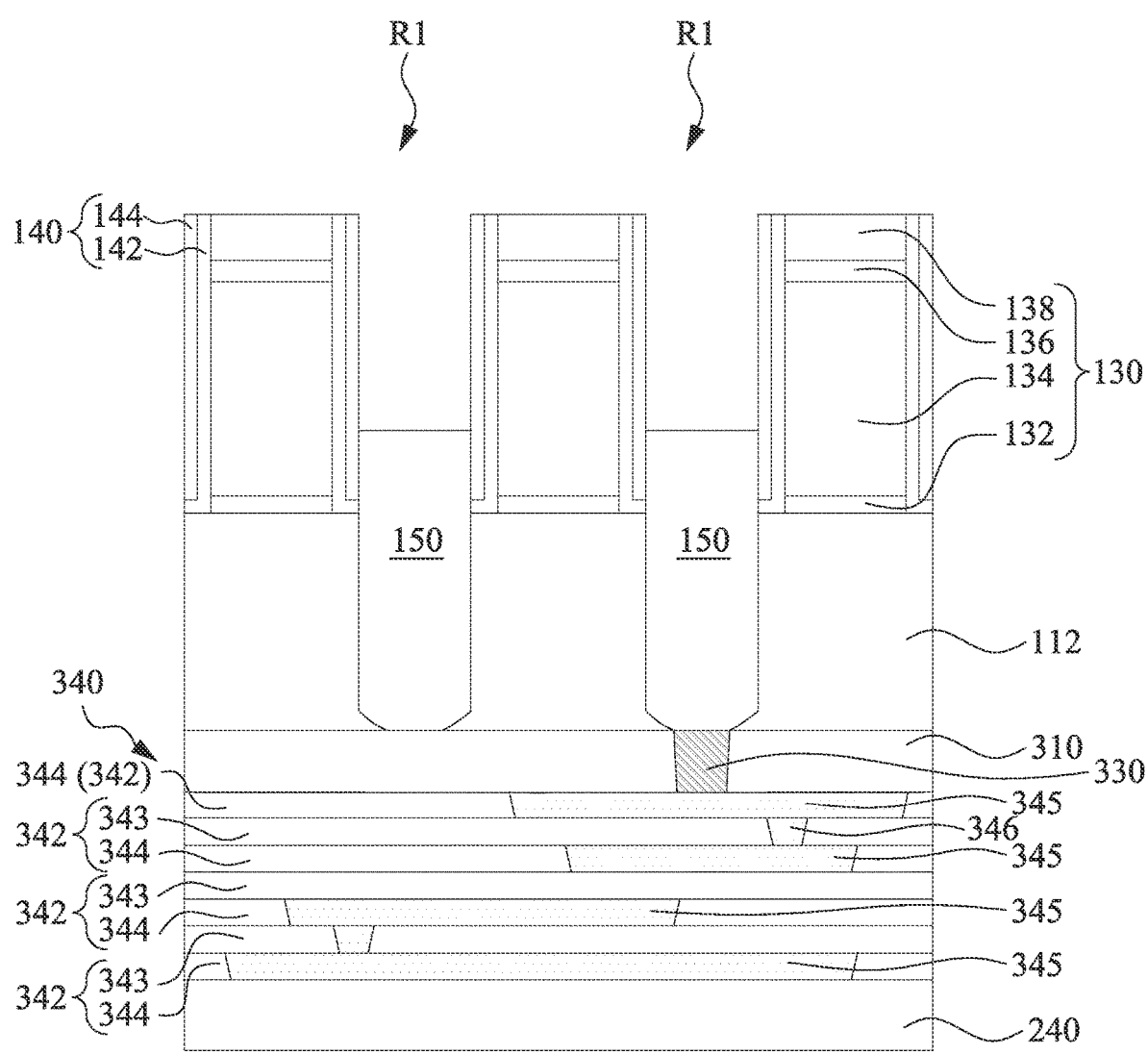
Figure 9C:
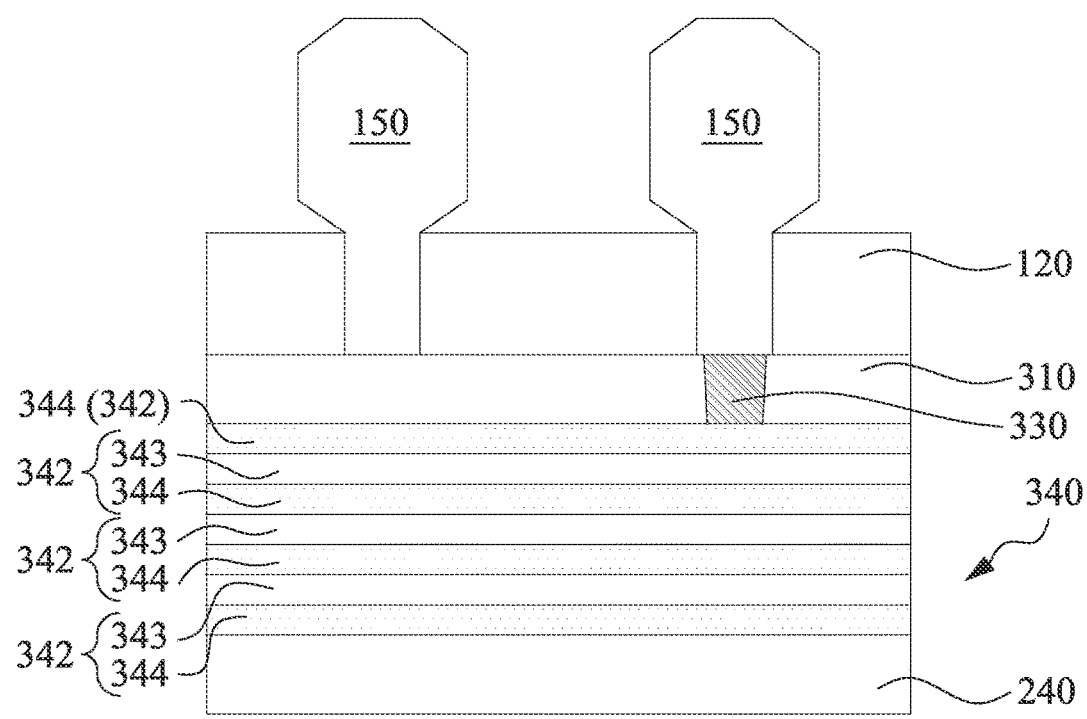

Reference is made to FIGS. 9A-9C, where FIG. 9B is a cross-sectional view taken along line I-I of FIG. 9A, and FIG. 9C is a cross-sectional view taken along line II-II of FIG. 9A. Once the recesses R1 are created in the source/drain regions of the semiconductor fins 112, source/drain epitaxial structures 150 are formed in the recesses R1 in the semiconductor fins 112 by using one or more epitaxy or epitaxial (epi) processes that provides one or more epitaxial materials on the semiconductor fins 112. As such, at least one of the source/drain epitaxial structures 150 is connected to the backside source/drain contact 330.

During the epitaxial growth process, the gate spacers 140 limit the one or more epitaxial materials to source/drain regions in the semiconductor fins 112. In some embodiments, the lattice constants of the source/drain epitaxial structures 150 are different from the lattice constant of the semiconductor fins 112, so that the channel region in the semiconductor fins 112 and between the source/drain epitaxial structures 150 can be strained or stressed by the source/drain epitaxial structures 150 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 112.

In some embodiments, the source/drain epitaxial structures 150 include Ge, Si, GaAs, AlGaAs, SiGe, GaAsP, SiP, or other suitable material. The source/drain epitaxial structures 150 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 150 are not in-situ doped, an implantation process (i.e., a junction implant process) is performed to dope the source/drain epitaxial structures 150. In some exemplary embodiments, the source/drain epitaxial structures 150 in an n-type transistor include SiP, while those in a p-type include SiGe or SiGeB or GeSnB and/or SiGeSnB. In embodiments with different device types, a mask, such as a photoresist or a hard mask, may be formed over n-type device regions, while exposing p-type device regions, and p-type epitaxial structures may be formed on the exposed semiconductor fins 112 in the p-type device regions. The mask may then be removed. Subsequently, a mask, such as a photoresist or a hard mask, may be formed over the p-type device region while exposing the n-type device regions, and n-type epitaxial structures may be formed on the exposed semiconductor fins 112 in the n-type device region. The mask may then be removed. In some embodiments, the top surface of the source/drain epitaxial structures 150 is higher than the bottom surface of gate structures 130. In some embodiments, the top surface of the source/drain epitaxial structures 150 is substantially coplanar with the bottom surface of gate structures 130. In some embodiments, the top surface of source/drain epitaxial structures 150 is slight below the bottom surface of gate structures 130.

Once the source/drain epitaxial structures 150 are formed, an annealing process can be performed to activate the p-type dopants or n-type dopants in the source/drain epitaxial structures 150. The annealing process may be, for example, a rapid thermal anneal (RTA), a laser anneal, a millisecond thermal annealing (MSA) process or the like.

Figure 10A:
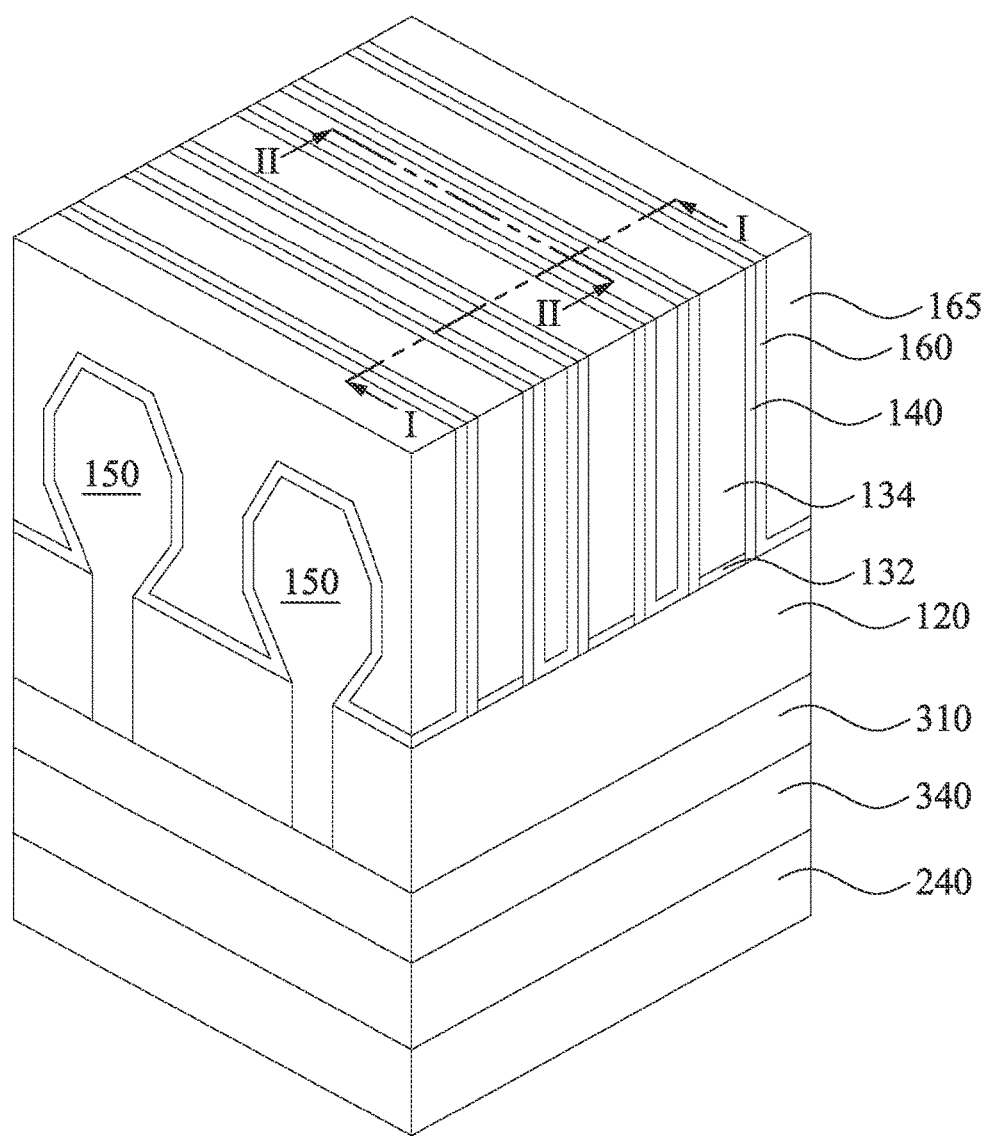
Figure 10B:
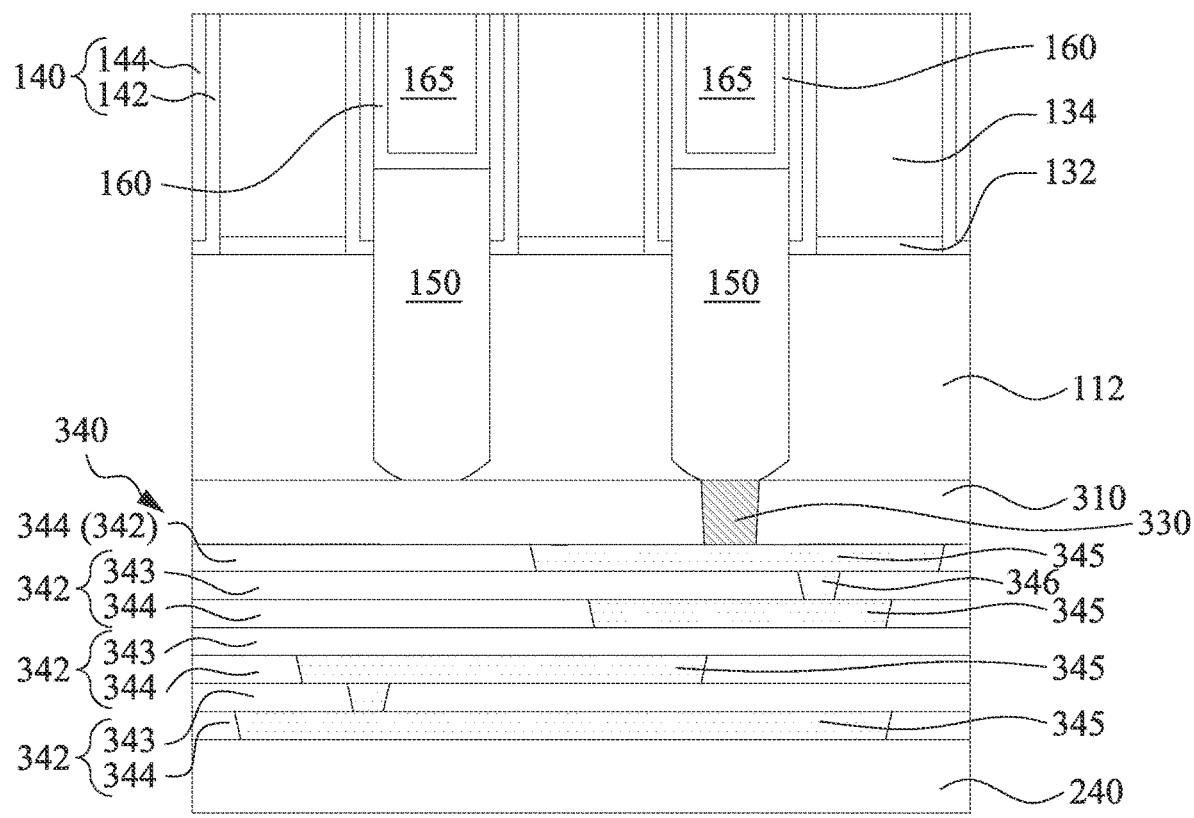
Figure 10C:
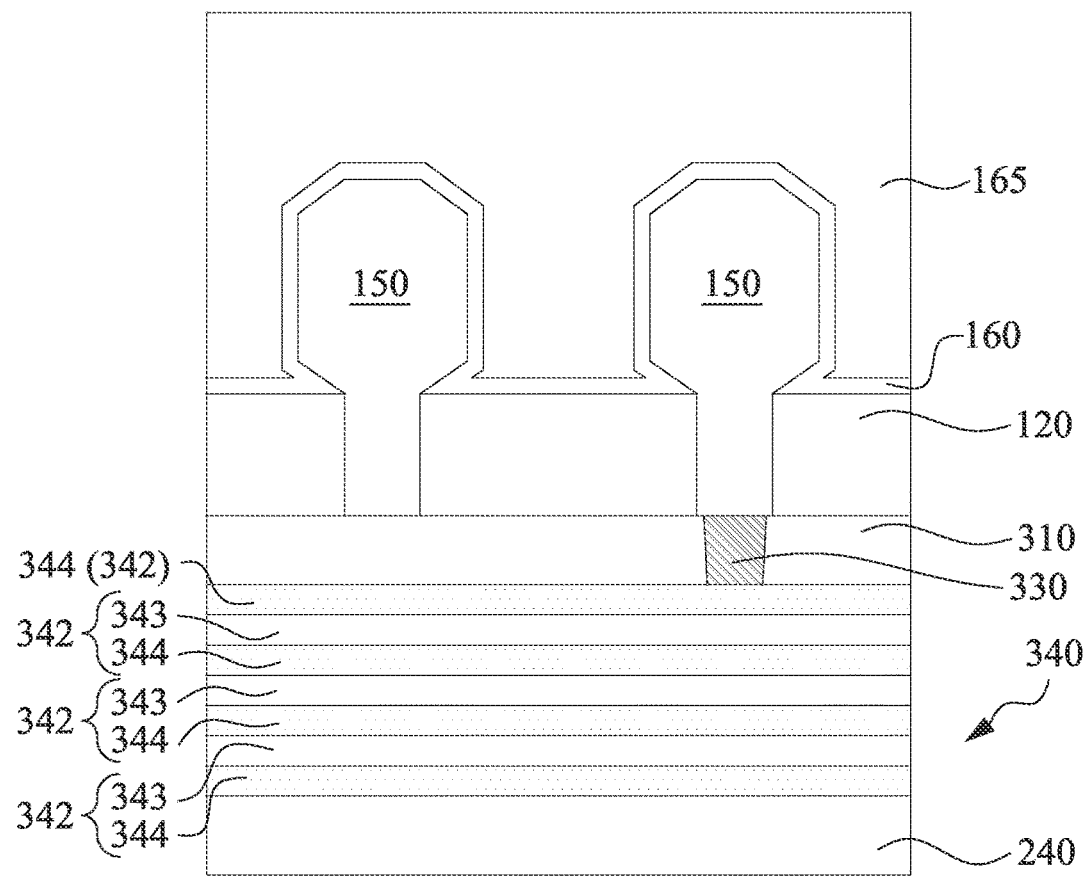

Reference is made to FIGS. 10A-10C, where FIG. 10B is a cross-sectional view taken along line I-I of FIG. 10A, and FIG. 10C is a cross-sectional view taken along line II-II of FIG. 10A. A second ILD layer 165 is formed over the first ILD layer 310. In some embodiments, a contact etch stop layer (CESL) 160 is also formed prior to forming the second ILD layer 165. In some embodiments, the CESL 160 includes a silicon nitride layer, a silicon oxynitride layer, and/or other suitable materials having a different etch selectivity than the second ILD layer 165. The CESL 160 may be formed by plasma-enhanced chemical vapor deposition (PECVD) process and/or other suitable deposition or oxidation processes. In some embodiments, the second ILD layer 165 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 160. The second ILD layer 165 may be deposited by a subatmospheric CVD (SACVD) process, a flowable CVD process, or other suitable deposition technique. In some embodiments, after formation of the second ILD layer 165, the wafer may be subject to a high thermal budget process to anneal the second ILD layer 165.

In some examples, after forming the second ILD layer 165, a planarization process may be performed to remove excessive materials of the second ILD layer 165. For example, a planarization process includes a chemical mechanical planarization (CMP) process which removes portions of the second ILD layer 165 (and the CESL 160, if present) overlying the dummy gate structures 130. In some embodiments, the CMP process also removes the oxide mask layers 136 and the nitride mask layers 138 (as shown in FIG. 9A) and exposes the dummy gate electrodes 134.

Figure 11A:
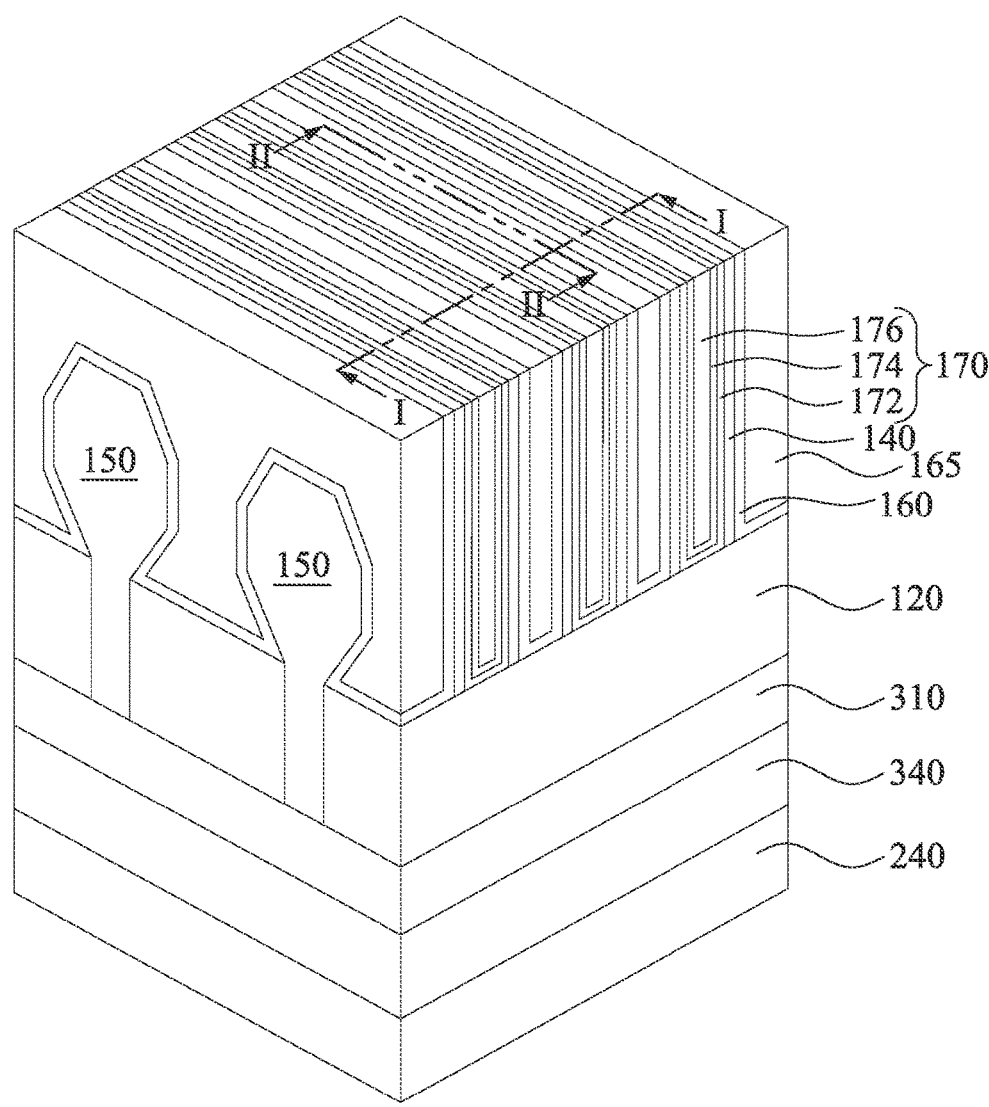
Figure 11B:
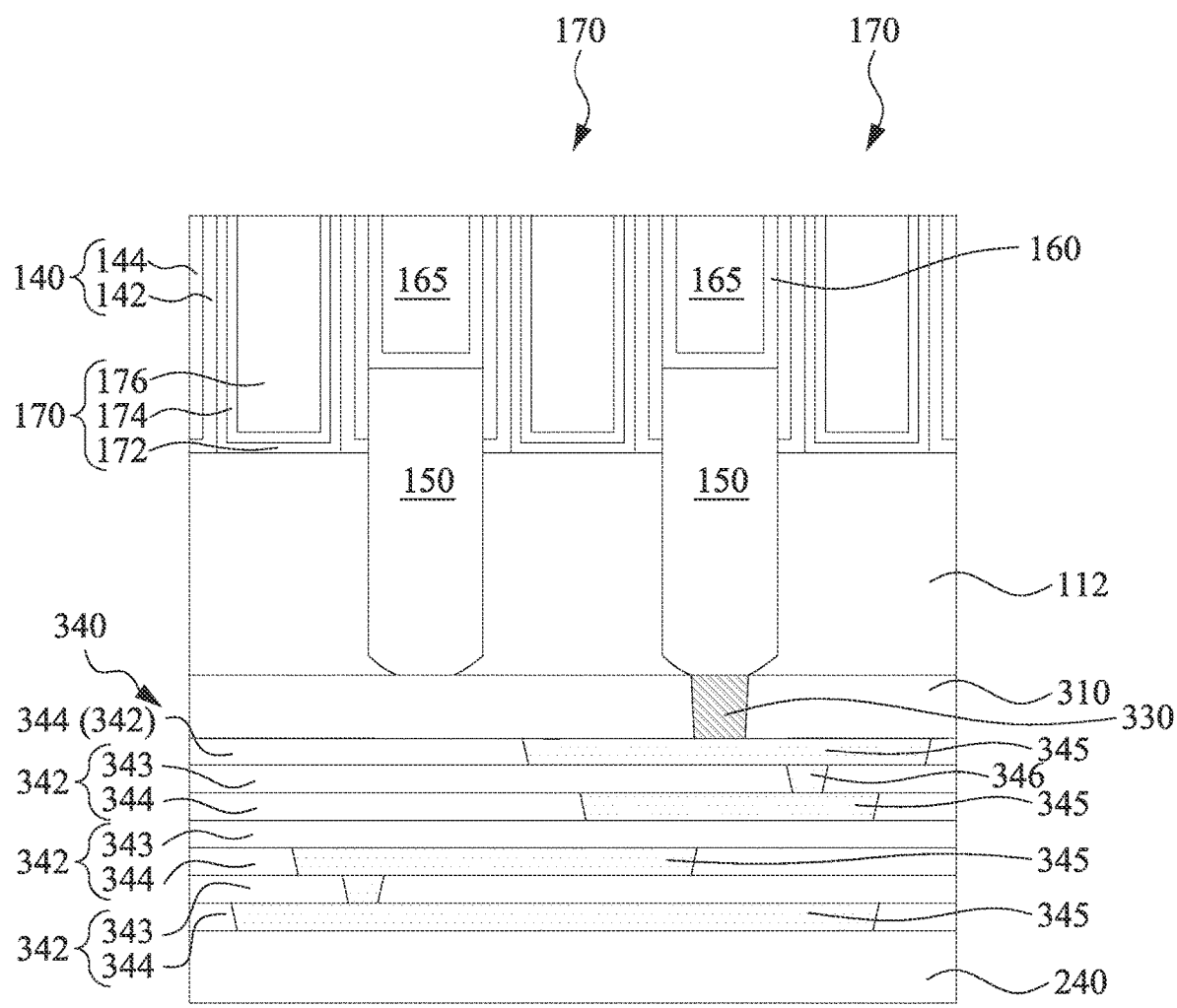
Figure 11C:
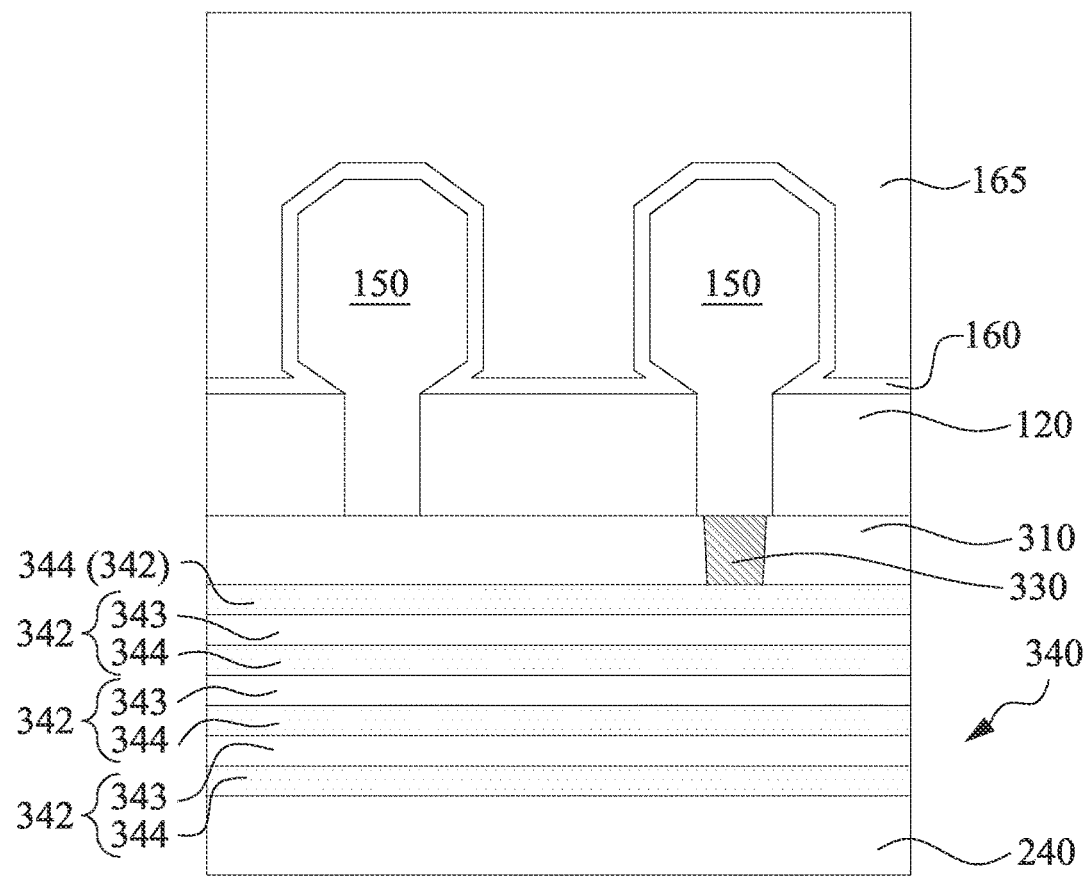

Reference is made to FIGS. 11A-11C, where FIG. 11B is a cross-sectional view taken along line I-I of FIG. 11A, and FIG. 11C is a cross-sectional view taken along line II-II of FIG. 11A. The dummy gate electrodes 134 and the dummy gate dielectric layers 132 (see FIGS. 10A-10B) are removed, resulting in gate trenches between corresponding gate spacers 140. The dummy gate electrodes 134 and the dummy gate dielectric layers 132 are removed using a selective etching process (e.g., selective dry etching, selective wet etching, or combinations thereof) that etches materials in the dummy gate electrodes 134 and the dummy gate dielectric layers 132 at a faster etch rate than it etches other materials (e.g., the gate spacers 140, the CESL 160, and/or the second ILD layer 165).

Thereafter, replacement gate structures 170 are respectively formed in the gate trenches. The gate structures 170 may be the final gates of FinFETs. The final gate structures each may be a high-k/metal gate stack, however other compositions are possible. In some embodiments, each of the gate structures 170 forms the gate associated with the three-sides of the channel region provided by the semiconductor fins 112. Stated another way, each of the gate structures 170 wraps around the semiconductor fins 112 on three sides. In various embodiments, the (high-k/metal) gate structure 170 includes a gate dielectric layer 172 lining the gate trench and a gate electrode over the gate dielectric layer 172. The gate electrode may include a work function metal layer 174 formed over the gate dielectric layer 172 and a fill metal 176 formed over the work function metal layer 174 and filling a remainder of gate trenches. The gate dielectric layer 172 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 174 and/or fill metal 176 used within high-k/metal gate structures 170 may include a metal, metal alloy, or metal silicide. Formation of the high-k/metal gate structures 170 may include multiple deposition processes to form various gate materials, one or more liner layers, and one or more CMP processes to remove excessive gate materials.

In some embodiments, the interfacial layer of the gate dielectric layer 172 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 172 may include hafnium oxide ($HfO_2$). Alternatively, the gate dielectric layer 172 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 174 may include work function metals to provide a suitable work function for the high-k/metal gate structures 170. For an n-type FinFET, the work function metal layer 174 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 174 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 176 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 12A:
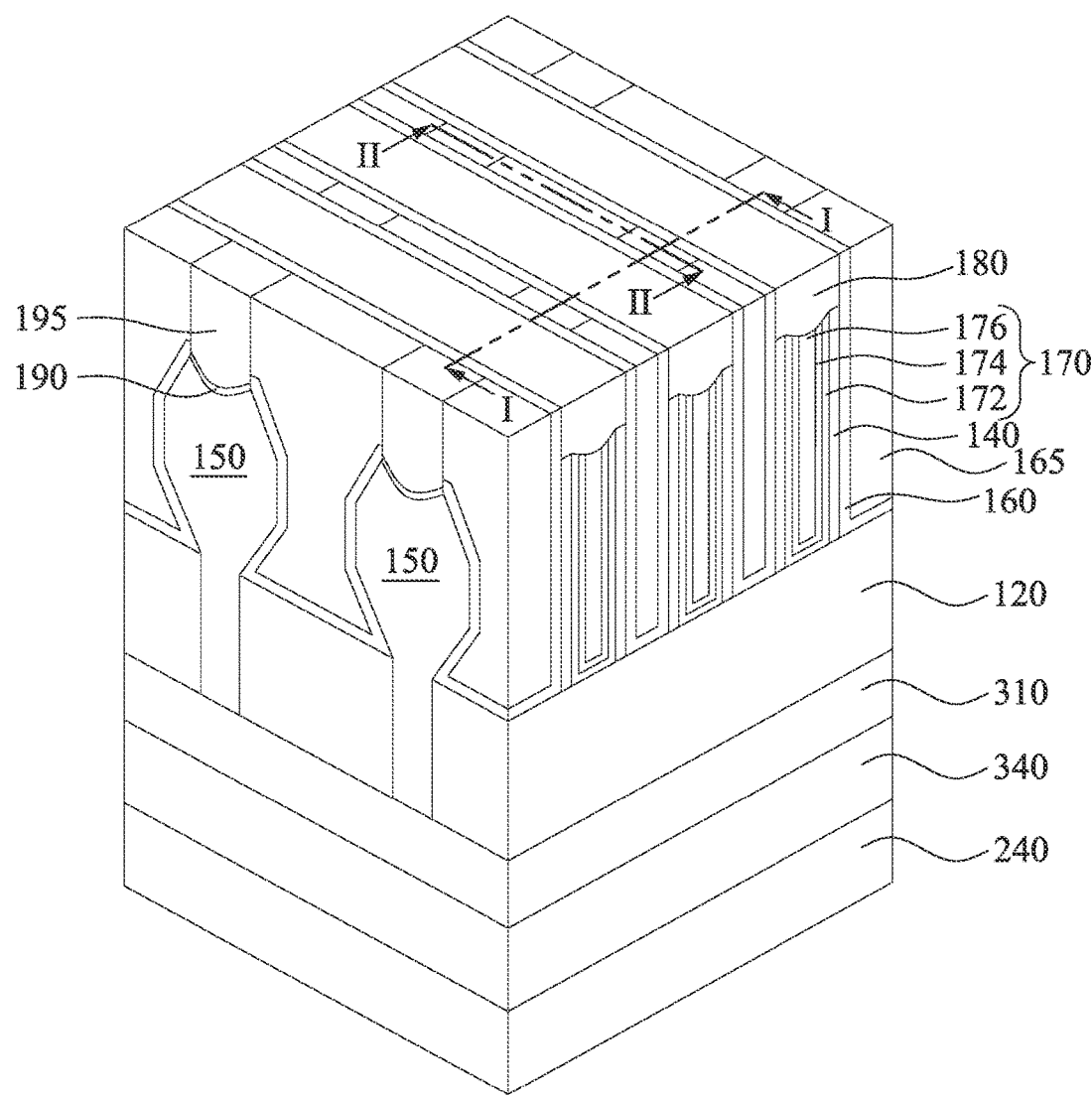
Figure 12B:
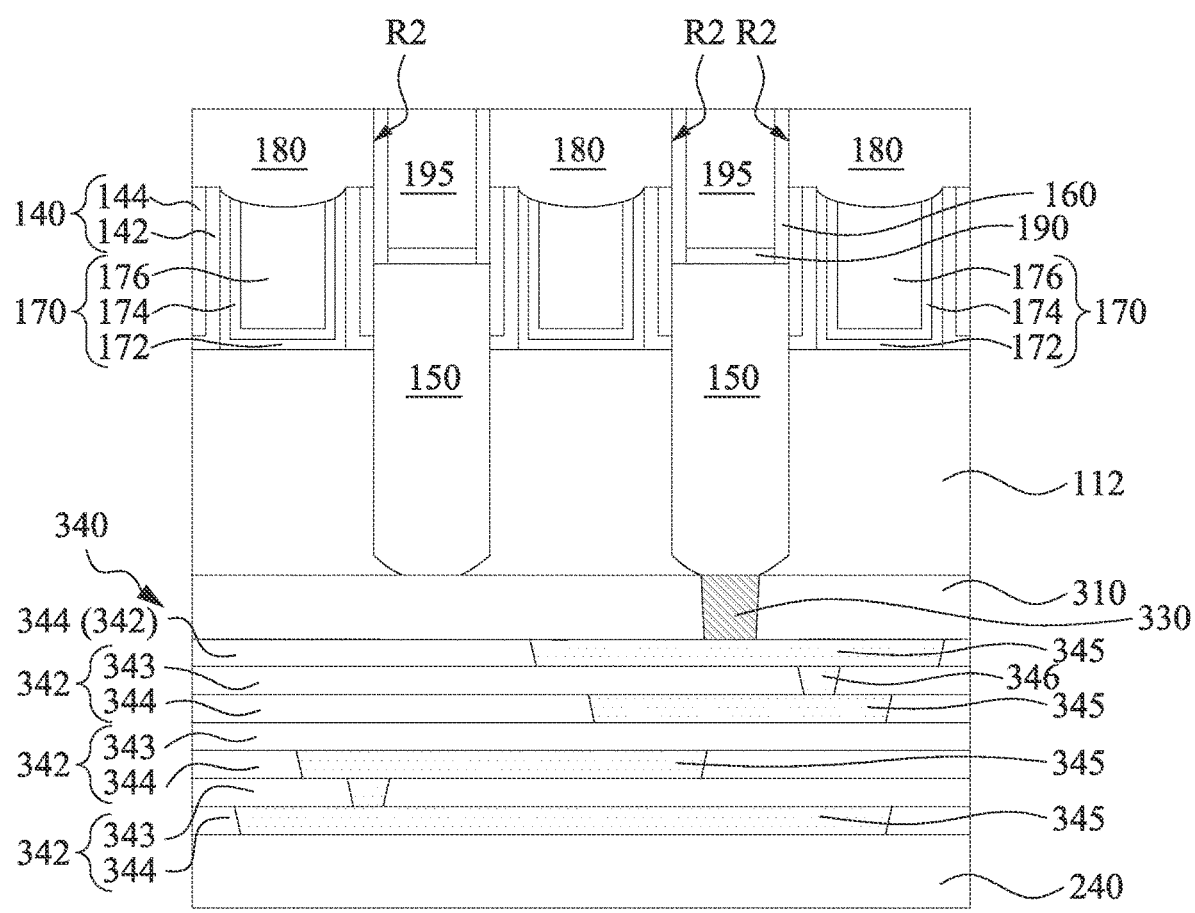
Figure 12C:
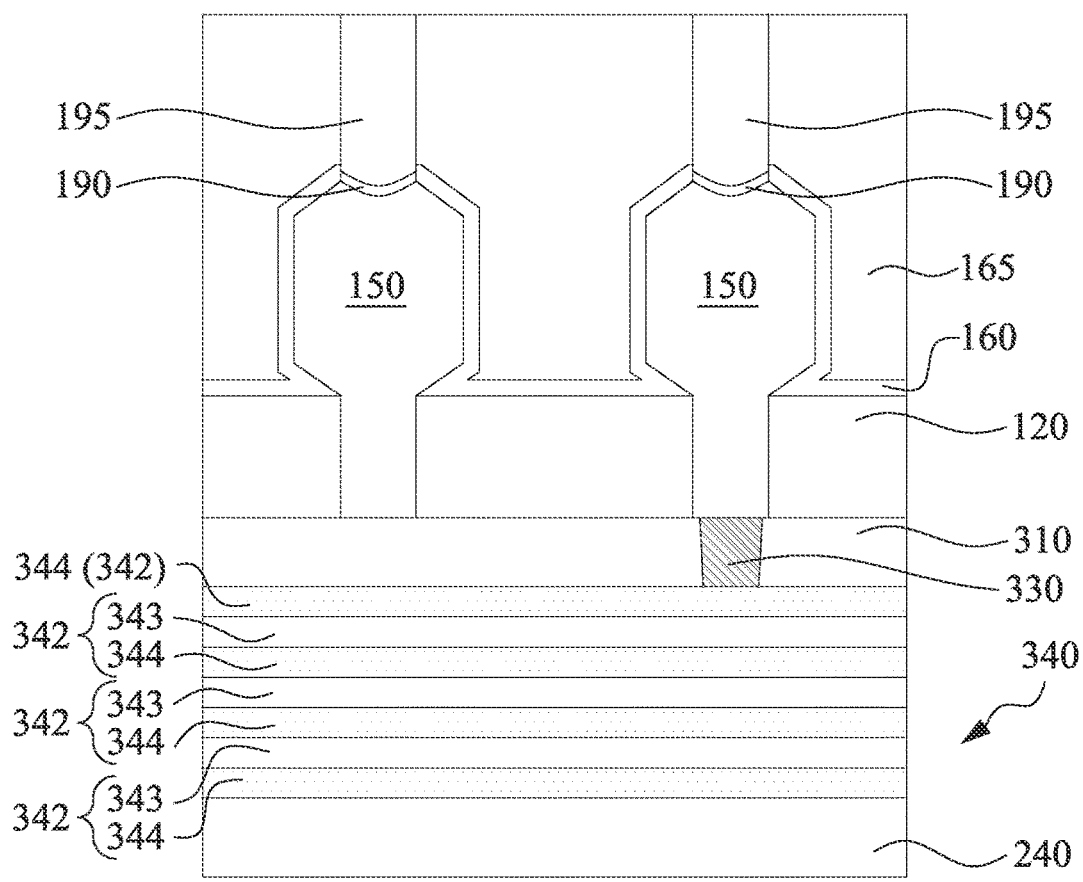

Reference is then made to FIGS. 12A-12C, where FIG. 12B is a cross-sectional view taken along line I-I of FIG. 12A, and FIG. 12C is a cross-sectional view taken along line II-II of FIG. 12A. An etching back process is performed to etch back the replacement gate structures 170 and the gate spacers 140, resulting in recesses R2 over the etched-back gate structures 170 and the etched-back gate spacers 140. In some embodiments, because the materials of the replacement gate structures 170 have a different etch selectivity than the gate spacers 140, a first selective etching process may be initially performed to etch back the replacement gate structures 170 to lower the replacement gate structures 170. Subsequently, a second selective etching process is performed to lower the gate spacers 140. As a result, the top surfaces of the replacement gate structures 170 may be at a different level than the top surfaces of the gate spacers 140.

Subsequently, dielectric caps 180 are respectively formed in the recesses R2. For example, a dielectric cap layer is deposited over the substrate 110 until the recesses R2 are overfilled. The dielectric cap layer includes SiN, SiC, SiCN, SiON, SiCON, combinations thereof or the like, and is formed by a suitable deposition technique such as CVD, plasma-enhanced CVD (PECVD), ALD, remote plasma ALD (RPALD), plasma-enhanced ALD (PEALD), combinations thereof or the like. A CMP process is then performed to remove the cap layer outside the recesses R2, leaving portions of the dielectric cap layer in the recesses R2 to serve as the dielectric caps 180.

Source/drain contacts 195 are formed extending through the second ILD layer 165. Formation of the source/drain contacts 195 includes, by way of example and not limitation, performing one or more etching processes to form contact openings extending though the second ILD layer 165 and the CESL 160 to expose the source/drain epitaxial structures 150, depositing one or more metal materials overfilling the contact openings, and then performing a CMP process to remove excessive metal materials outside the contact openings. In some embodiments, a first etching process is a selective etching that etches the second ILD layer 165 at a faster etch rate than etching the dielectric caps 180 and the CESL 160 and a second etching process is a selective etching that etches away the CESL 160. As a result, the selective etching is performed using the dielectric caps 180 as an etch mask, such that the contact openings and hence source/drain contacts 195 are formed self-aligned to the source/drain epitaxial structures 150 without using an additional photolithography process. In that case, the dielectric caps 180 allowing for forming the source/drain contacts 195 in a self-aligned manner can be called self-aligned-contact (SAC) caps 180.

In some embodiments, metal alloy layers 190 are respectively formed above the source/drain epitaxial structures 150 prior to forming the source/drain contacts 195. The front-side metal alloy layers 190, which may be silicide layers, are respectively formed in the trenches and over the exposed source/drain epitaxial structures 150 by a self-aligned silicide (salicide) process. The silicide process converts the surface portions of the source/drain epitaxial structures 150 into the silicide contacts. Silicide processing involves deposition of a metal that undergoes a silicidation reaction with silicon (Si). In order to form silicide contacts on the source/drain epitaxial structures 150, a metal material is blanket deposited on the source/drain epitaxial structures 150. After heating the wafer to a temperature at which the metal reacts with the silicon of the source/drain epitaxial structures 150 to form silicide, unreacted metal is removed. The silicide remains over the source/drain epitaxial structures 150, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 190 may include germanium.

Figure 13:
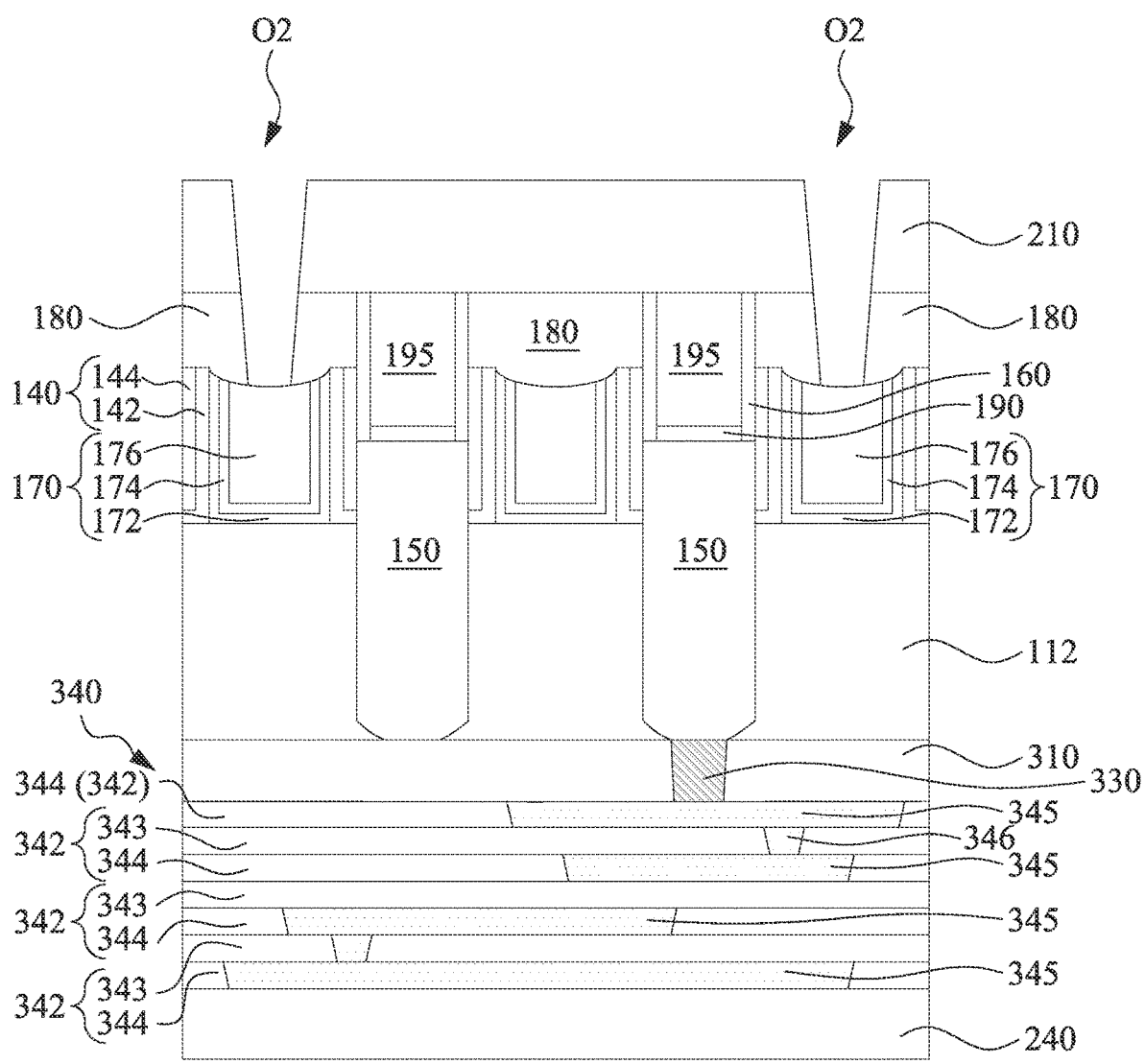

Reference is then made to FIG. 13. A third ILD layer 210 is formed over the substrate 110. In some embodiments, the third ILD layer 210 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), or low-k dielectrics and/or other suitable dielectric materials. The third ILD layer 210 may be deposited by a PECVD process or other suitable deposition technique. In some embodiments, after formation of the third ILD layer 210, the wafer may be subject to a high thermal budget process to anneal the third ILD layer 210.

Subsequently, the third ILD layer 210 is patterned to form gate contact openings O2 extending downward though the third ILD layer 210 and the dielectric cap 180 to the gate structures 170. The third ILD layer 210 can be patterned by using suitable photolithography and etching techniques.

Figure 14:
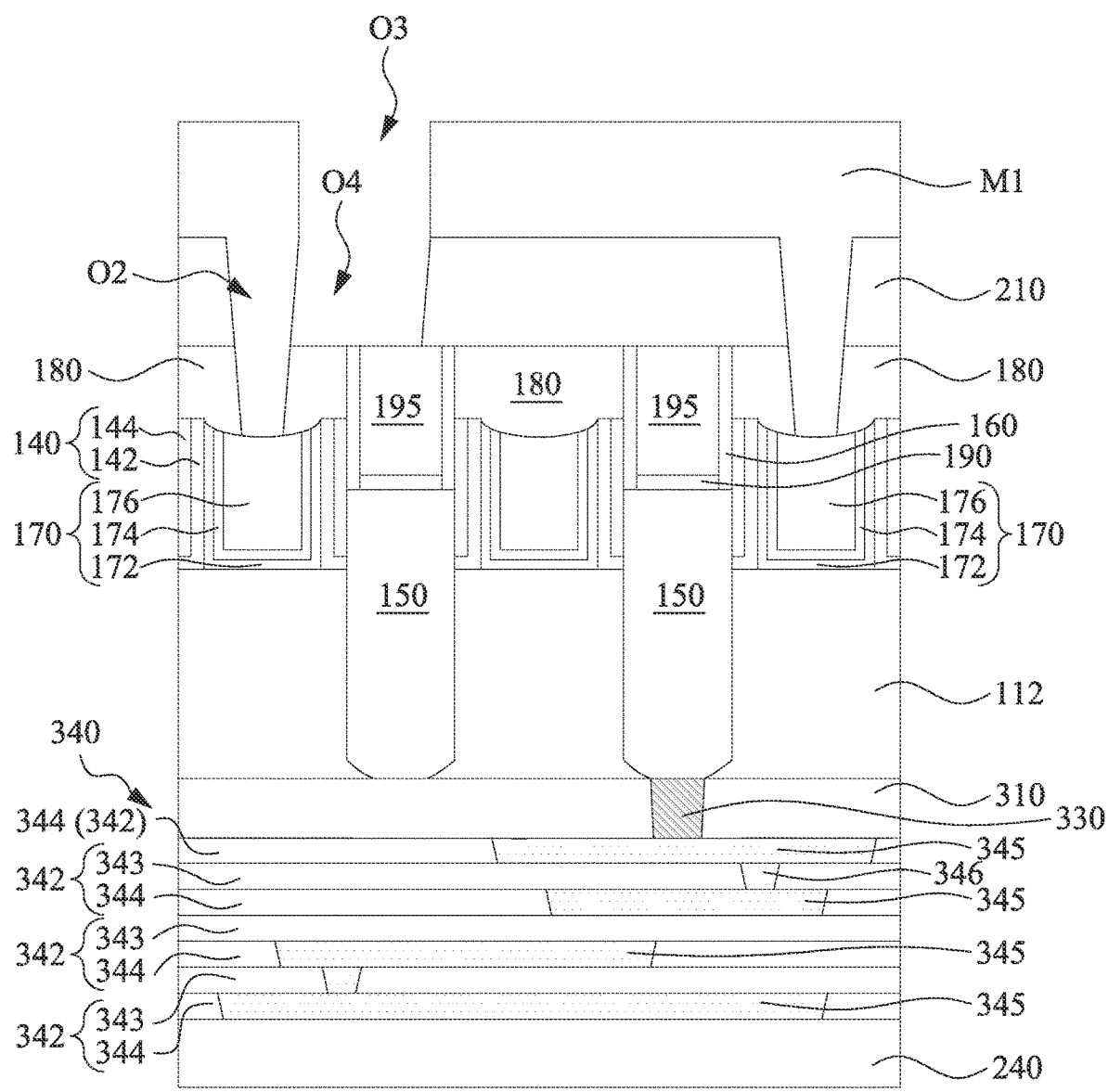

Reference is made to FIG. 14. A patterned mask layer M1 is formed over the substrate 110 to fill the gate contact openings O2. The patterned mask layer M1 has openings O3 vertically above some of the source/drain contacts 195. In some embodiments, the patterned mask layer M1 may be a photoresist mask formed by suitable photolithography process. For example, the photolithography process may include spin-on coating a photoresist layer over the structure as illustrated in FIG. 13, performing post-exposure bake processes, and developing the photoresist layer to form the patterned mask layer M1. In some embodiments, patterning the resist to form the patterned mask element may be performed using an electron beam (e-beam) lithography process or an extreme ultraviolet (EUV) lithography process.

Subsequently, with the patterned mask layer M1 in place, a via etching process is performed to form via openings O4 (see FIGS. 14 and 16C) extending through the third ILD layer 210. As a result of the etching process, the source/drain contacts 195 get exposed at bottoms of the via openings O4.

Figure 15:
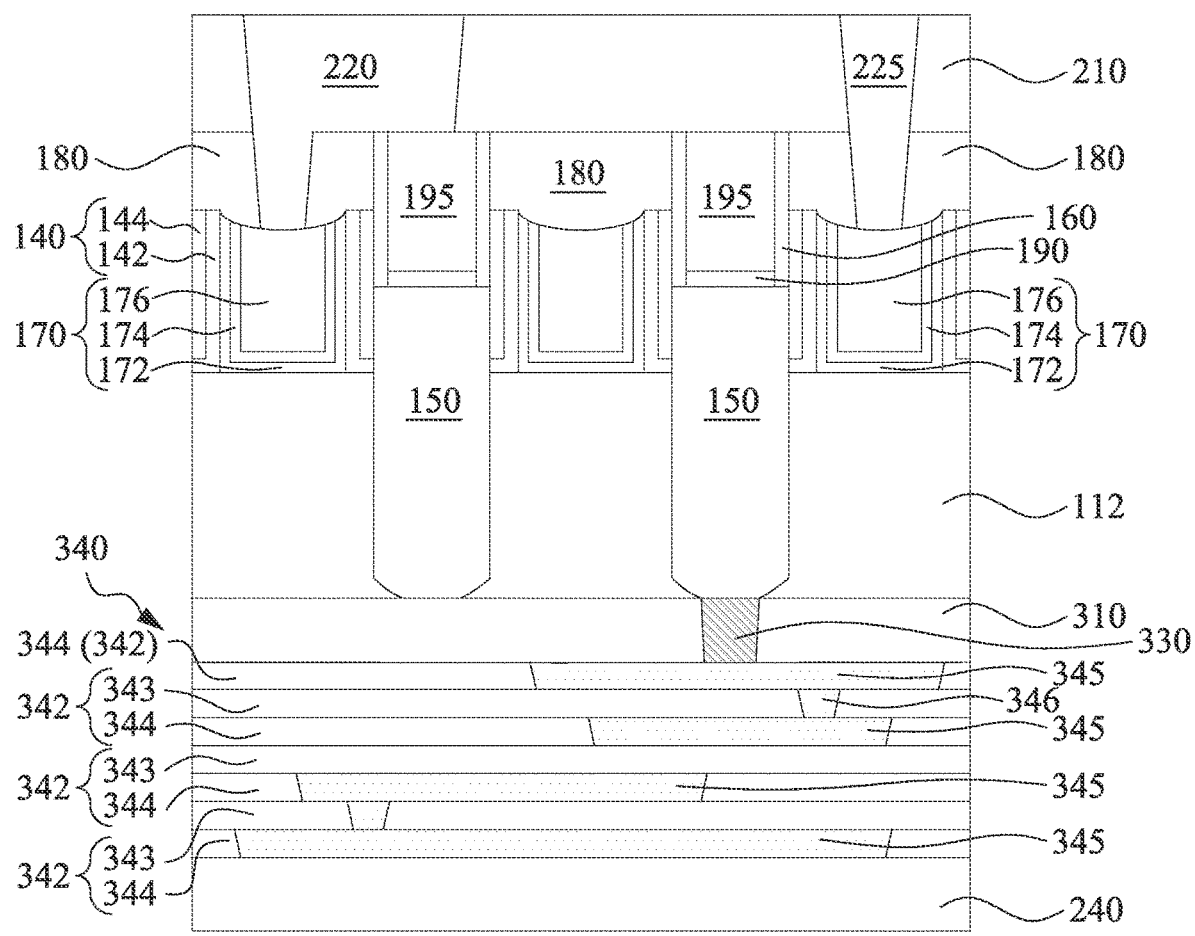

Reference is made to FIG. 15. The patterned mask layer M1 (referring to FIG. 14) is removed from the gate contact openings O2 by ashing and/or wet stripping, and then a front-side butted contact (or butted via) 220 is formed to fill one of the gate contact openings O2 and one of the via openings O4 and a gate via 225 is formed to fill another gate contact openings O2. In some embodiments, at least one source/drain via 227 (see FIG. 16C) is formed to fill another of the via openings O4. The butted via 220, the gate via 225, and the source/drain via 227 are formed using, by way of example and not limitation, depositing one or more metal materials overfilling the openings O2 and O4, followed by a CMP process to remove excessive metal material(s) outside the openings O2 and O4. As a result of the CMP process, the butted via 220, the gate via 225, and the source/drain via 227 have top surfaces substantially coplanar with the second ILD layer 210. The butted via 220, the gate via 225, and the source/drain via 227 may include metal materials such as copper, aluminum, tungsten, combinations thereof, or the like, and may be formed using PVD, CVD, ALD, or the like. In some embodiments, the butted via 220, the gate via 225, and the source/drain via 227 may further include one or more barrier/adhesion layers (not shown) to protect the second ILD layer 210 from metal diffusion (e.g., copper diffusion). The one or more barrier/adhesion layers may include titanium, titanium nitride, tantalum, tantalum nitride, or the like, and may be formed using PVD, CVD, ALD, or the like.

Figure 16A:
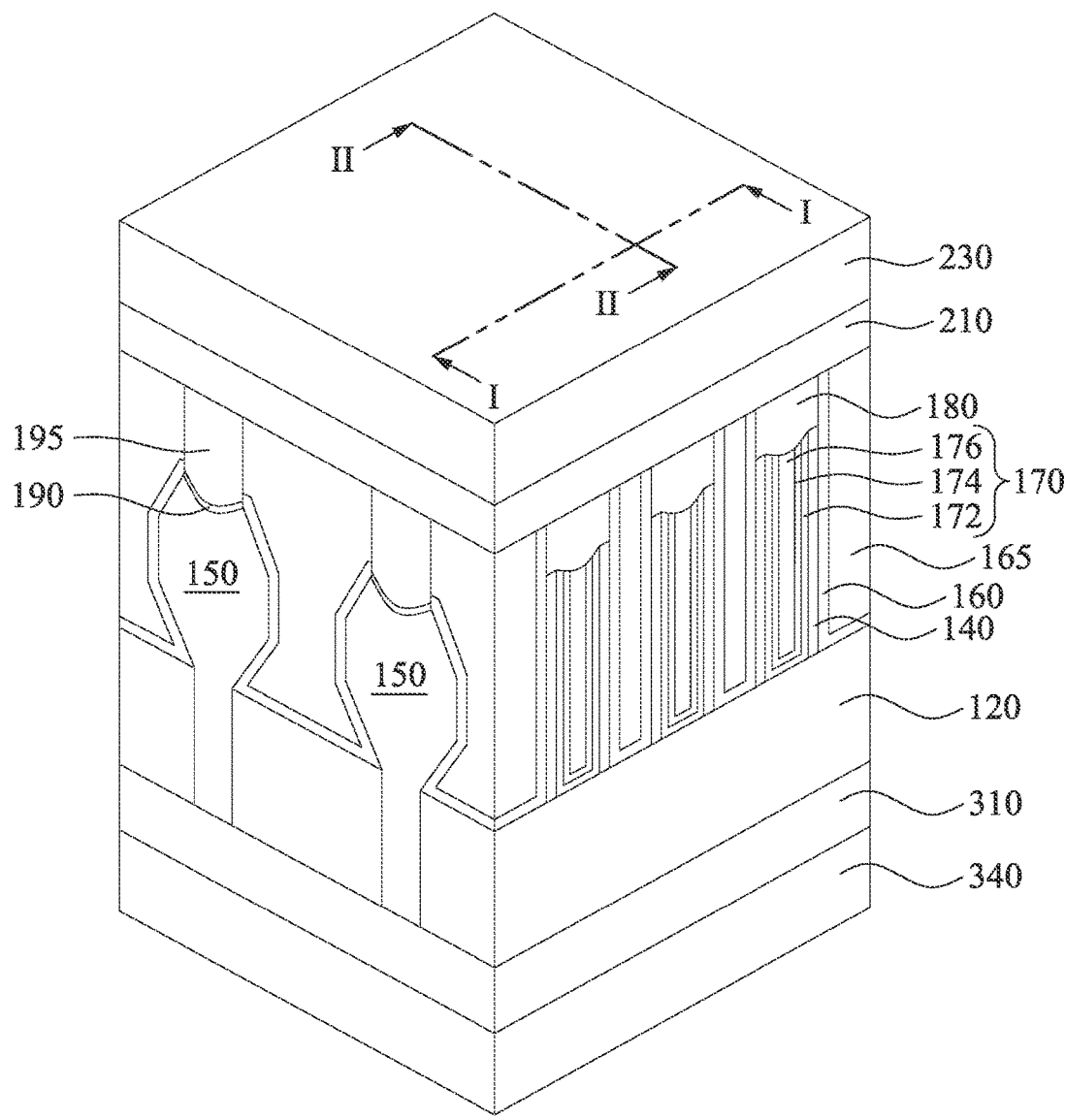
Figure 16B:
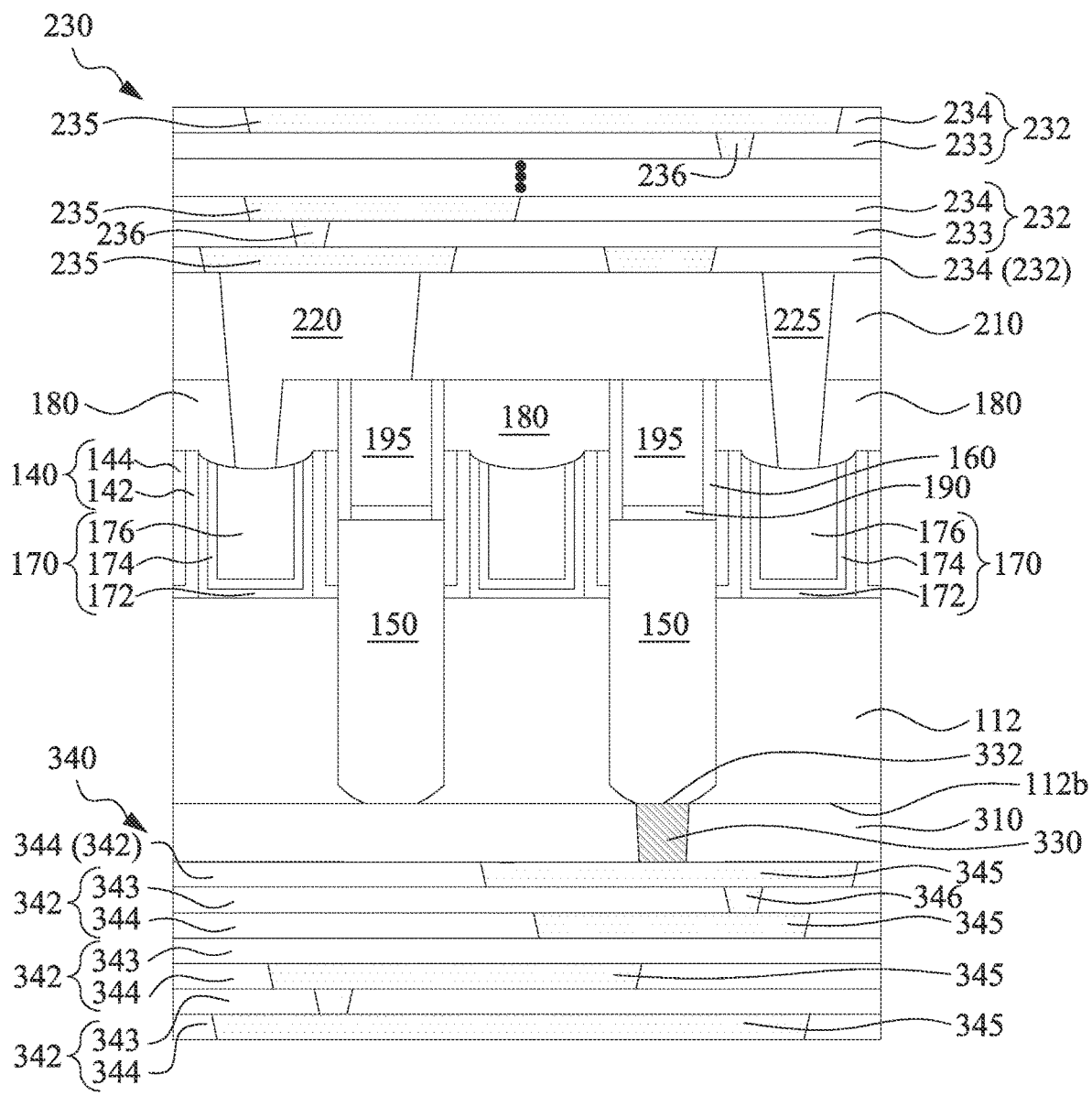
Figure 16C:
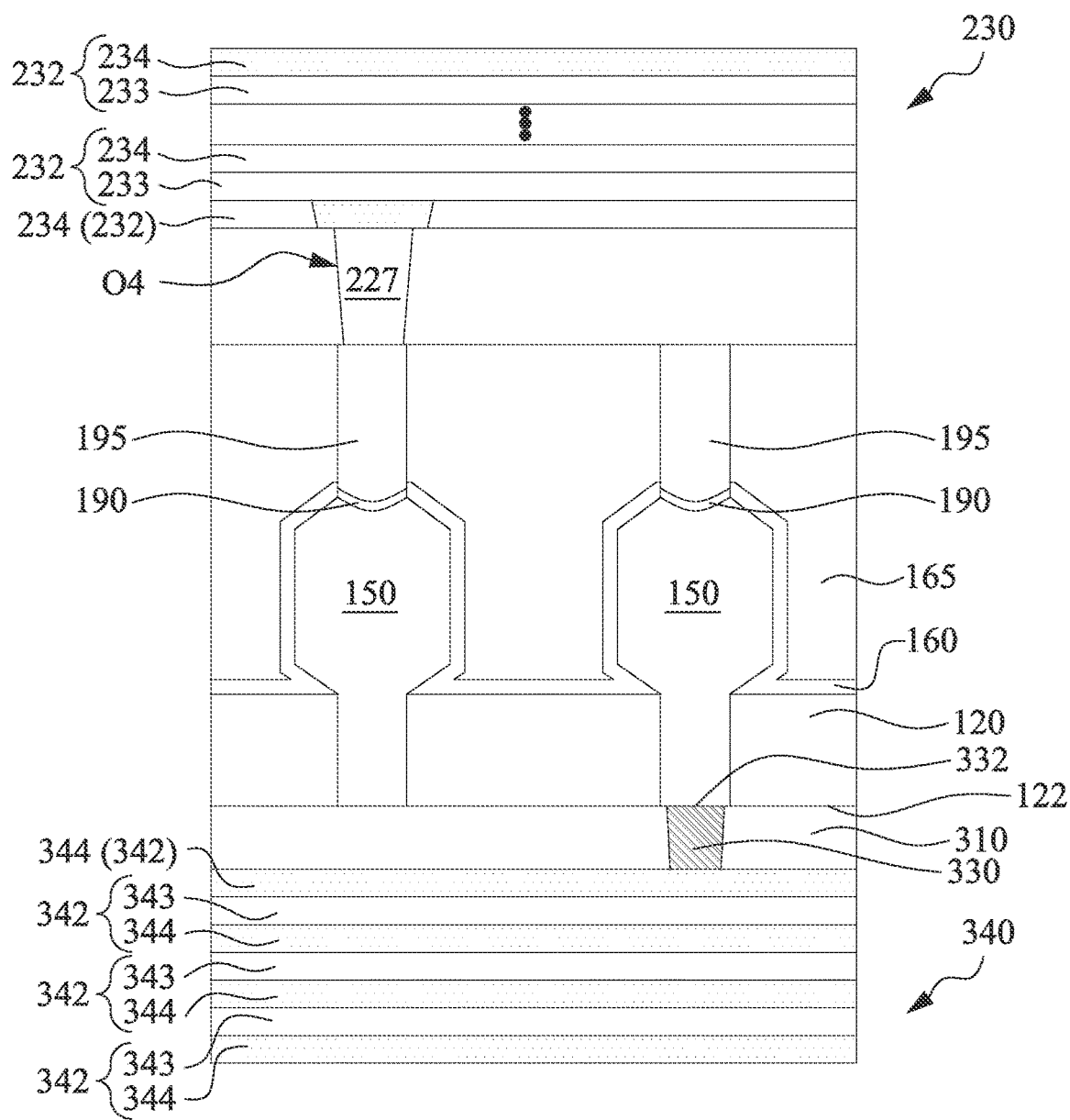

Reference is then made to FIGS. 16A-16C, where FIG. 16B is a cross-sectional view taken along line I-I of FIG. 16A, and FIG. 16C is a cross-sectional view taken along line II-II of FIG. 16A. A front-side MLI structure 230 is formed over the substrate 110. The front-side MLI structure 230 may include a plurality of front-side metallization layers 232. For clarity, the front-side metallization layers 232 are shown in FIGS. 16B-16C and are omitted in FIG. 16A. The number of front-side metallization layers 232 may vary according to design specifications of the semiconductor device. Only three front-side metallization layers 232 are illustrated in FIGS. 16B-16C for the sake of simplicity. Except the bottommost front-side metallization layers 232, the other front-side metallization layers 232 each includes a first front-side inter-metal dielectric (IMD) layer 233 and a second front-side IMD layer 234. The second front-side IMD layers 234 are formed over the corresponding first front-side IMD layers 233. The front-side metallization layers 232 include one or more horizontal interconnects, such as front-side metal lines 235, respectively extending horizontally or laterally in the second front-side IMD layers 234 and vertical interconnects, such as front-side conductive vias 236, respectively extending vertically in the first front-side IMD layers 233.

The front-side metal lines 235 and front-side metal vias 236 can be formed using, for example, a single damascene process, a dual damascene process, the like, or combinations thereof. In some embodiments, the front-side IMD layers 233-234 may include low-k dielectric materials having k values, for example, lower than about 4.0 or even 3.0 disposed between such conductive features. In some embodiments, the front-side IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines and vias 235 and 236 may include metal materials such as copper, aluminum, tungsten, combinations thereof, or the like. In some embodiments, the front-side metal lines and vias 235 and 236 may further include one or more barrier/adhesion layers (not shown) to protect the respective front-side IMD layers 233-234 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like. Optionally, the carrier substrate 240 (see FIG. 15) is then removed, as illustrated in FIGS. 16A-16C.

As shown in FIGS. 16A-16C, the semiconductor device 100 includes the semiconductor fins 112, the gate structures 170 across the semiconductor fins 112, the source/drain epitaxial structures 150 on the semiconductor fins 112 and on opposite sides of the gate structures 170, and the backside source/drain contact 330 under the at least one of the source/drain epitaxial structures 150. As such, the backside source/drain contact 330 is electrically connected to one of the source/drain epitaxial structures 150.

The semiconductor device 100 further includes the front-side MLI structure 230 and the backside MLI structure 340. As shown in FIGS. 16B and 16C, the backside source/drain contact 330 interconnects the source/drain epitaxial structure 150 and the backside MLI structure 340 and tapers downward, i.e., tapers from the source/drain epitaxial structure 150 toward the backside MLI structure 340. In some embodiments, a top surface 332 of the backside source/drain contact 330 is substantially coplanar with a bottom surface 112b of the semiconductor fin 112 as shown in FIG. 16B. In some embodiments, the top surface 332 of the backside source/drain contact 330 is substantially coplanar with a bottom surface 122 of the isolation structure as shown in FIG. 16C. Further, the metal lines 235 and the front-side conductive vias of the front-side MLI structure 230 and the metal lines 345 and the backside conductive vias 346 of the backside MLI structure 340 taper downward. In some embodiments, the semiconductor device 200 further includes the source/drain via 227 tapering downward. The source/drain via 227 has similar function of the source/drain contact 330 and this design can deliver a more flexible solution for device architecture.

FIGS. 17A-22C illustrate a method for manufacturing a semiconductor device (or an integrated circuit structure) 100a at various stages in accordance with some embodiments of the present disclosure. In addition to the semiconductor device 100a, FIGS. 17A, 18A, 19A, 20A, 21A, and 22A depict X-axis, Y-axis, and Z-axis directions. In some embodiments, the semiconductor device 100a shown in FIGS. 17A-22C may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 17A:
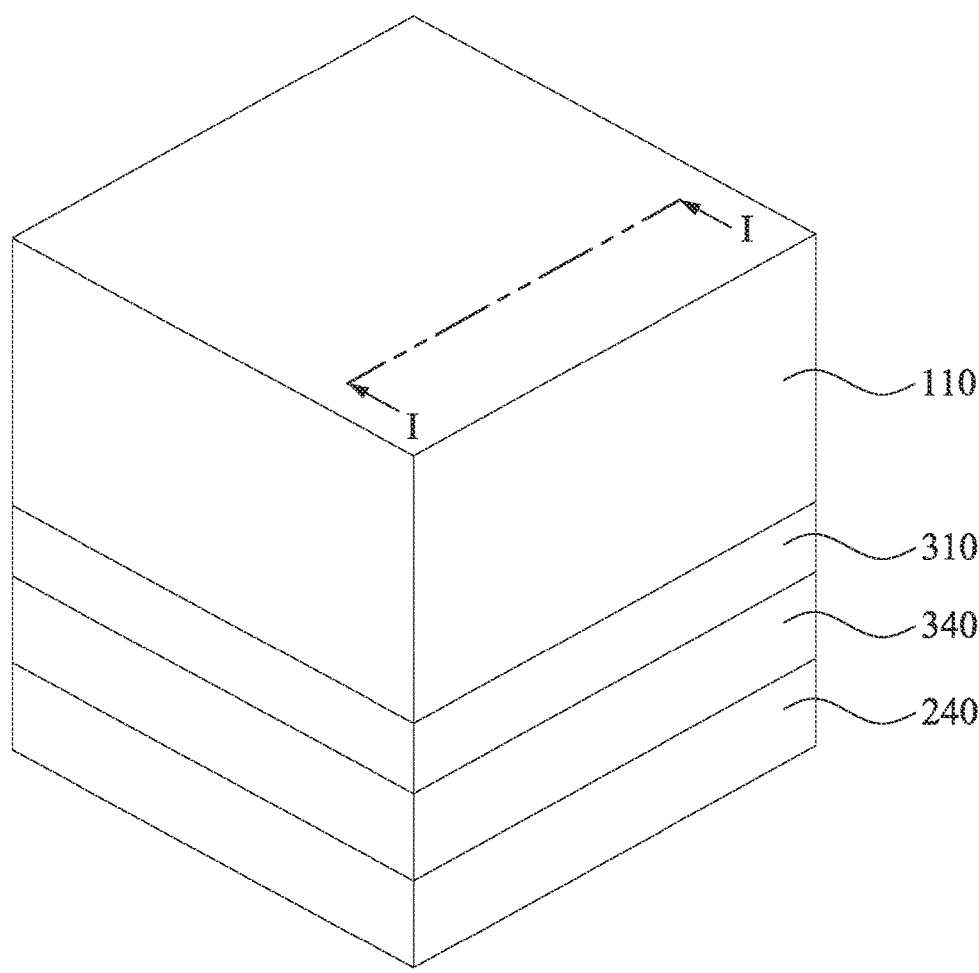
FIGS. 17A-22C illustrate a method for manufacturing a semiconductor device at various stages in accordance with some embodiments of the present disclosure.
Figure 17B:
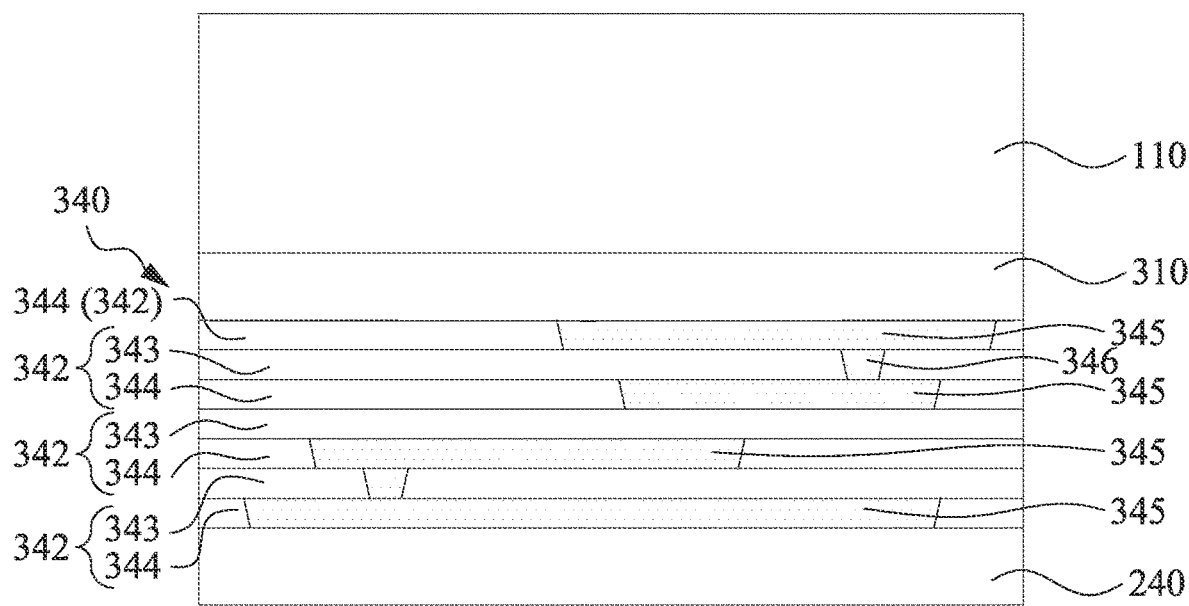

Reference is made to FIGS. 17A-17B, where FIG. 17B is a cross-sectional view taken along line I-I of FIG. 17A. A carrier substrate 240 is provided. Materials, configurations, dimensions, processes and/or operations regarding the carrier substrate 240 are similar to or the same as the carrier substrate 240 of FIG. 1A. Subsequently, a backside MLI structure 340 is formed over the carrier substrate 240. Materials, configurations, dimensions, processes and/or operations regarding the backside MLI structure 340 are similar to or the same as the backside MLI structure 340 of FIG. 1A.

A first ILD layer 310 and a substrate 110 are sequentially formed over the backside MLI structure 340. Materials, configurations, dimensions, processes and/or operations regarding the first ILD layer 310 are similar to or the same as the backside first ILD layer 310 of FIG. 1A, and materials, configurations, dimensions, processes and/or operations regarding the substrate 110 are similar to or the same as the substrate 110 of FIG. 1A.

Figure 18A:
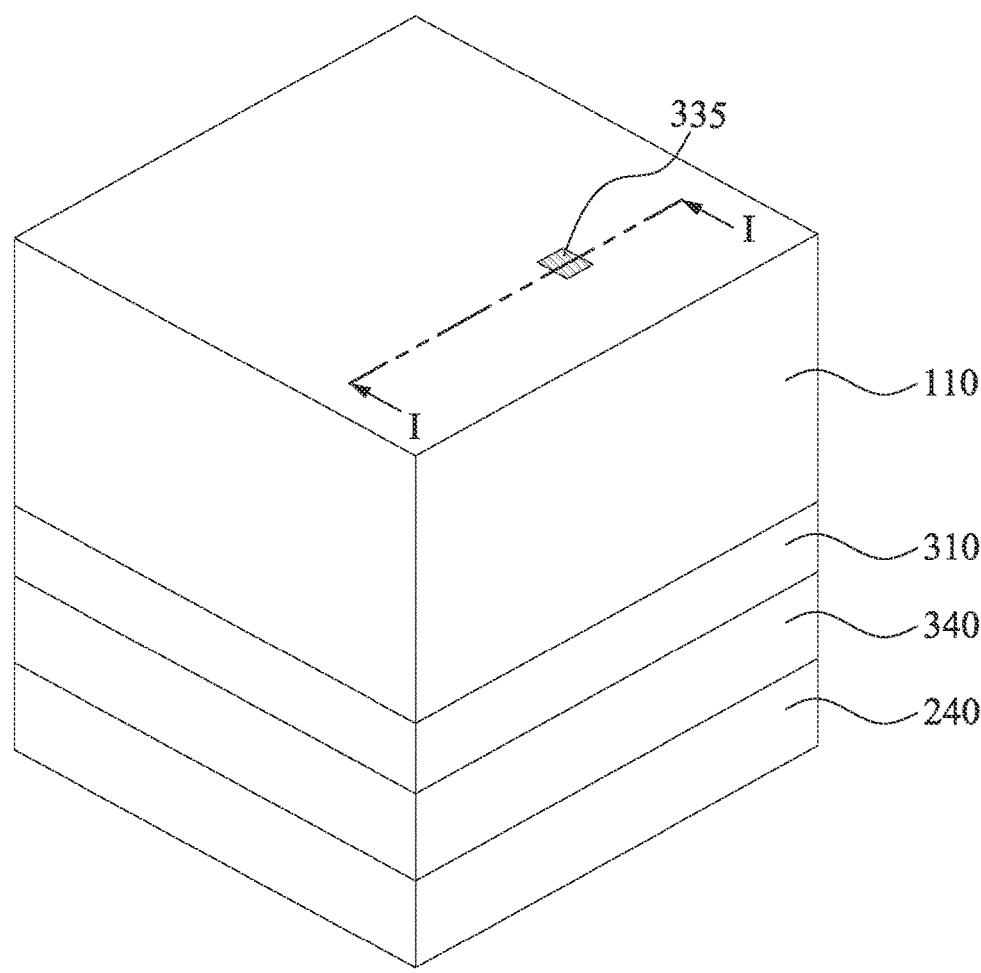
Figure 18B:
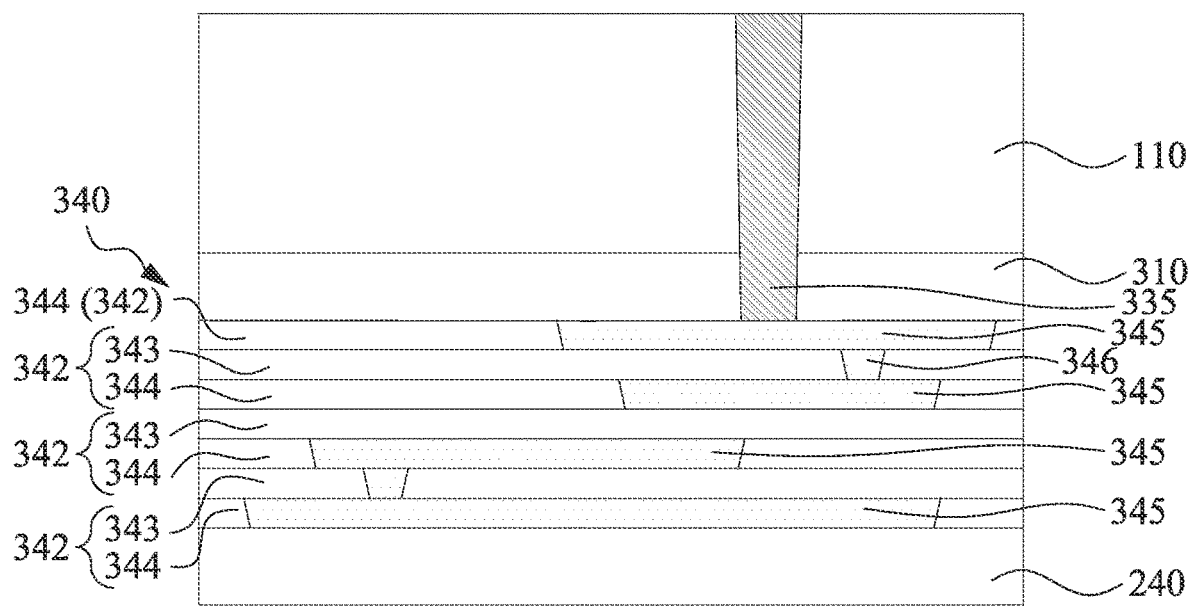

Reference is made to FIGS. 18A-18B, where FIG. 18B is a cross-sectional view taken along line I-I of FIG. 18A. A backside source/drain contact 335 is formed in the first ILD layer 310 and the substrate 110. Formation of the backside source/drain contact 335 includes forming an opening in the substrate 110 and the first ILD layer 310, depositing one or more metal materials overfilling the opening, and then performing a CMP process to remove excessive metal materials outside the opening. The backside source/drain contact 335 can be made of metals, such as tungsten, aluminum, copper, cobalt, or other suitable materials. As shown in FIG. 18B, the backside source/drain contact 335 is electrically connected to one of the backside metal lines 345 of the backside MLI structure 340.

Figure 19A:
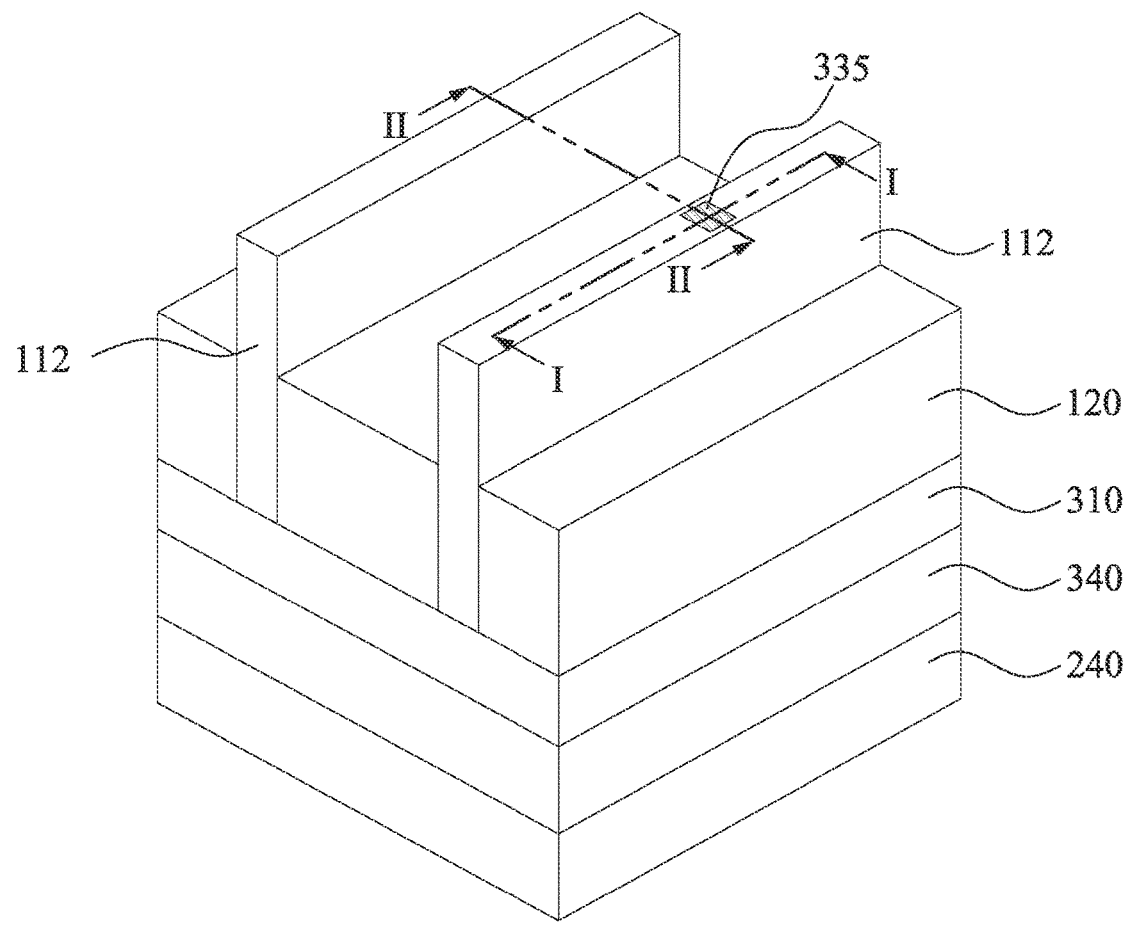
Figure 19B:
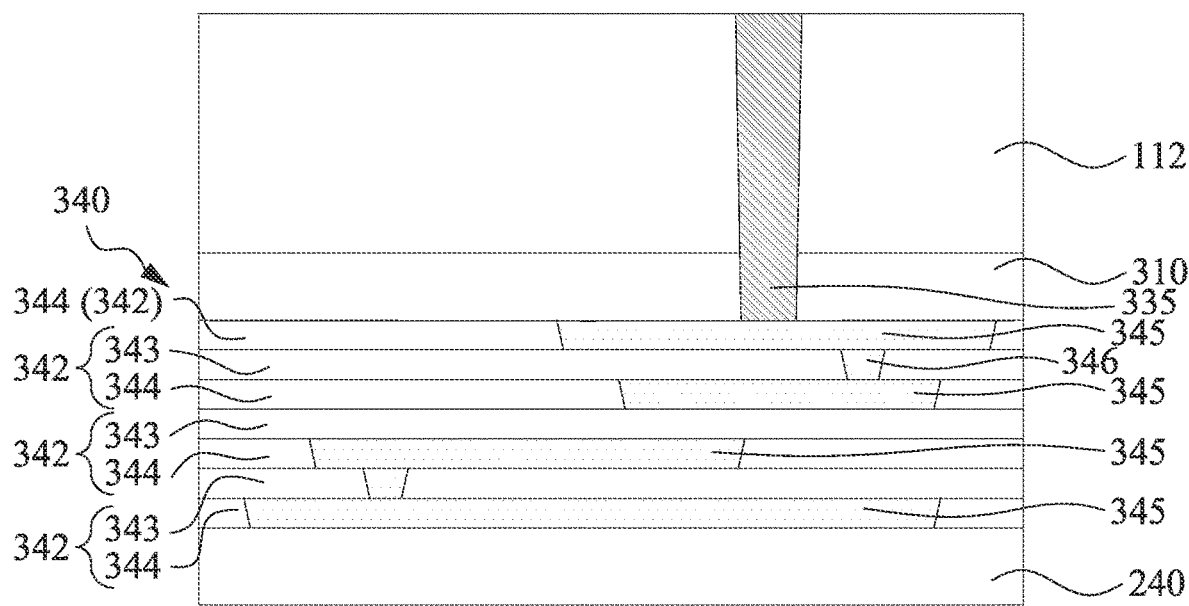
Figure 19C:
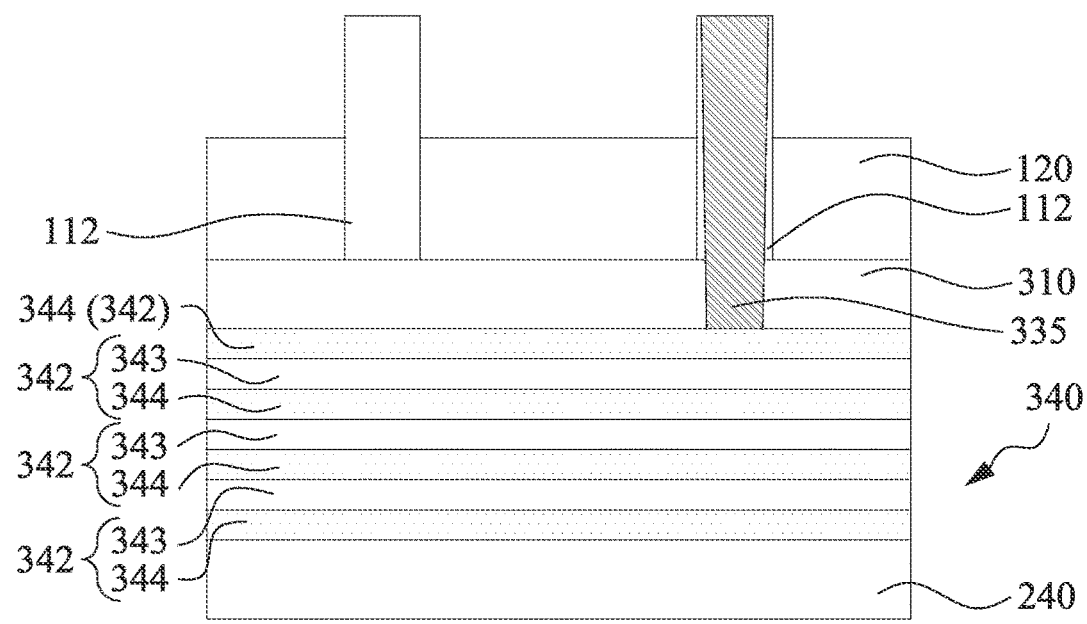

Reference is made to FIGS. 19A-19B, where FIG. 19B is a cross-sectional view taken along line I-I of FIG. 19A, and FIG. 19C is a cross-sectional view taken along line II-II of FIG. 19A. The structure of FIG. 18A undergoes the processes similar to the processes shown in FIGS. 5A-6C. That is, the substrate 110 is patterned to be semiconductor fins 112, and isolation structures 120 are formed over the first ILD layer 310. As shown in FIGS. 19A-19B, the backside source/drain contact 335 is embedded in one of the semiconductor fins 112. Materials, configurations, dimensions, processes and/or operations regarding the semiconductor fins 112 are similar to or the same as the semiconductor fins 112 of FIG. 5A, and the materials, configurations, dimensions, processes and/or operations regarding the isolation structures 120 are similar to or the same as the isolation structures 120 of FIG. 6A.

Figure 20A:
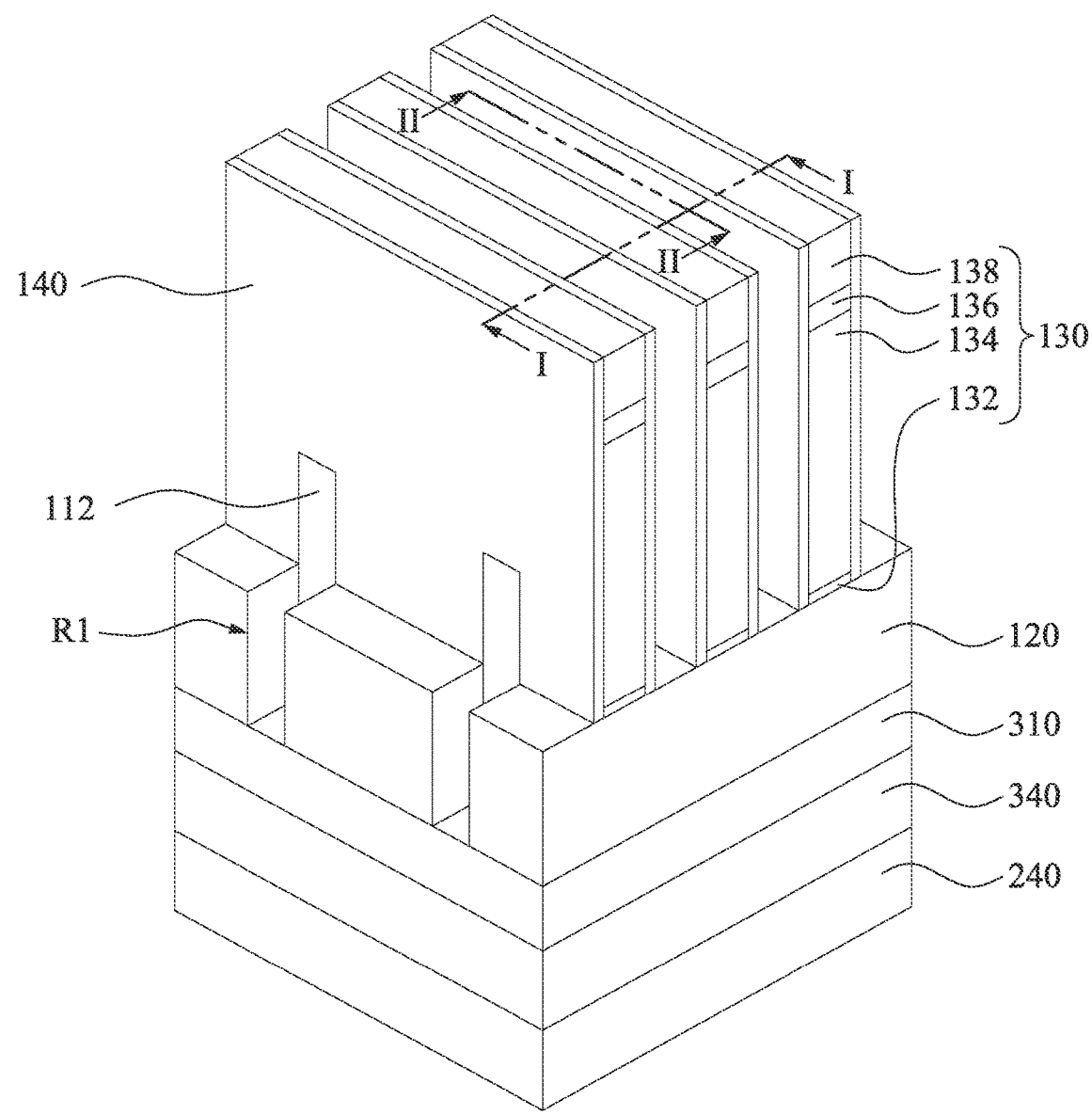
Figure 20B:
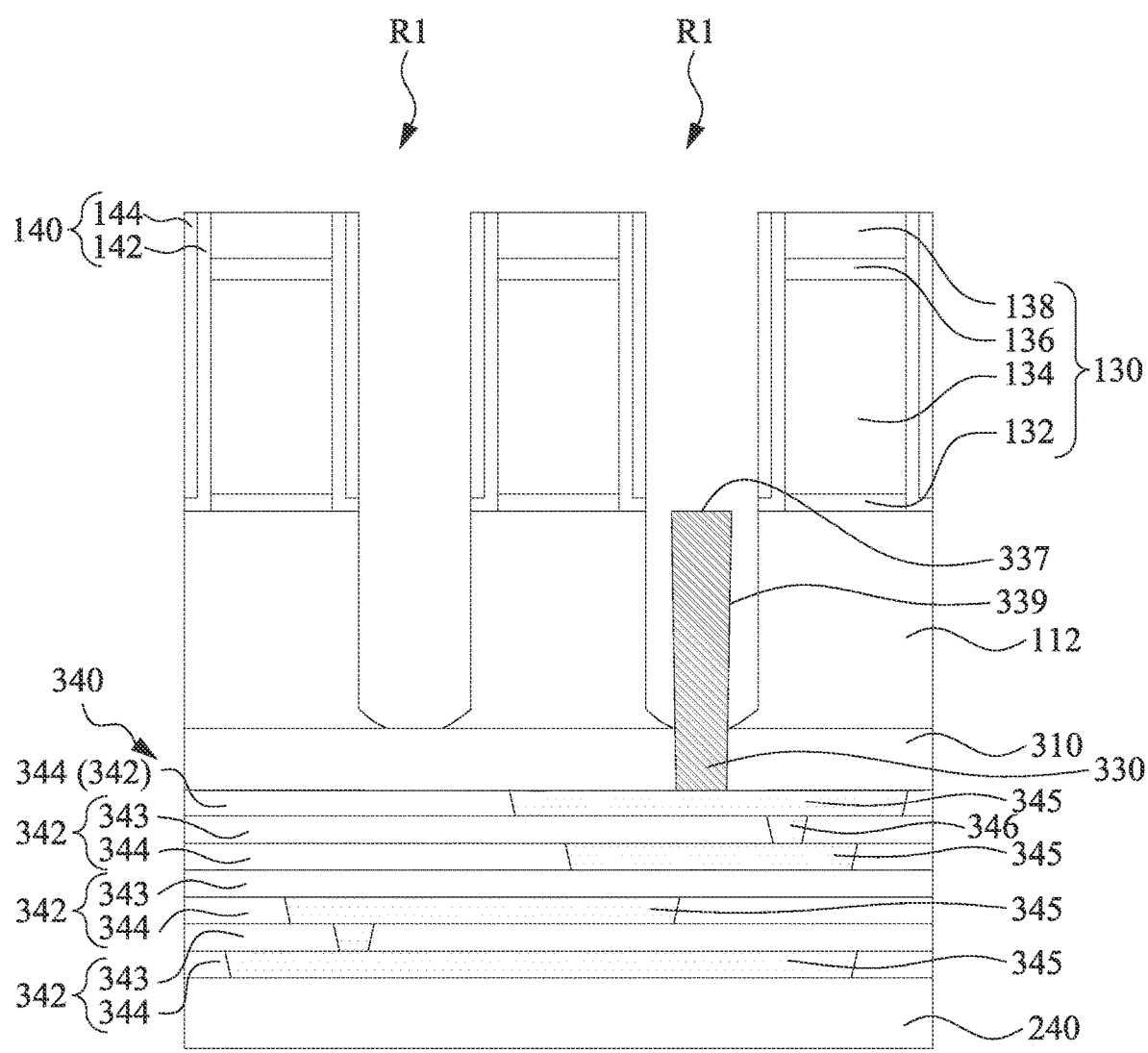
Figure 20C:
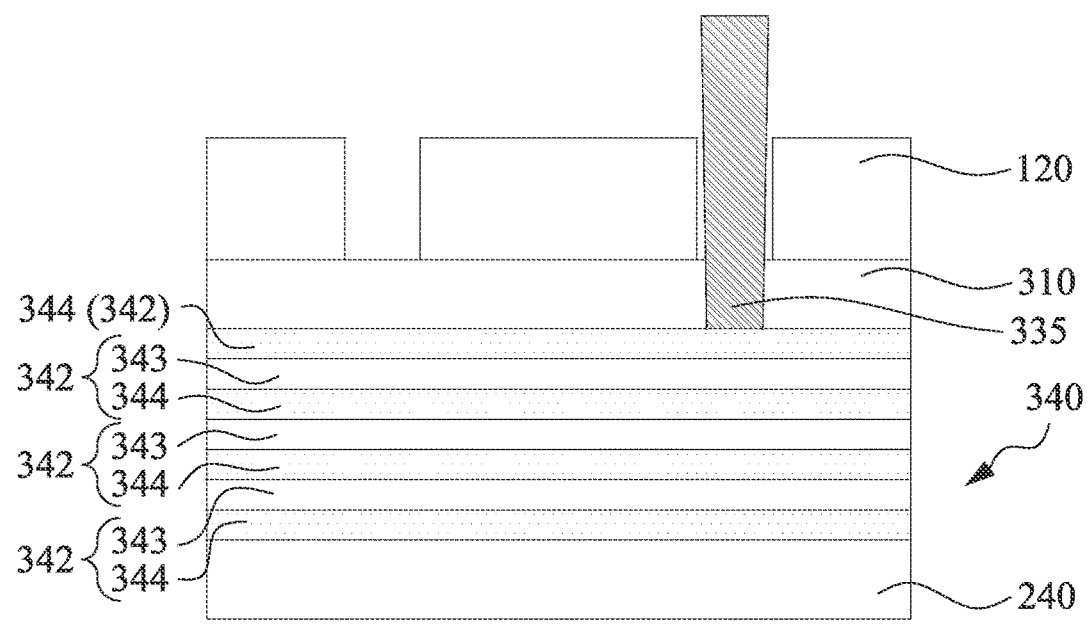

Reference is made to FIGS. 20A-20C, where FIG. 20B is a cross-sectional view taken along line I-I of FIG. 20A, and FIG. 20C is a cross-sectional view taken along line II-II of FIG. 20A. The structure of FIG. 19A undergoes the processes similar to the processes shown in FIGS. 7A-8C. That is, dummy gate structures 130 each including a dummy gate dielectric layer 132, a dummy gate electrode 134, an oxide mask layer 136, and a nitride mask layer 138 are formed over the first ILD layer 310 and at least partially disposed over the semiconductor fins 112, gate spacers 140 each including a first spacer layer 142 and a second spacer layer 144 are formed on sidewalls of the dummy gate structures 130; and recesses R1 are formed in the semiconductor fins 112. As such, at least one of the recesses R1 exposes a top surface 337 and a sidewall 339 of the backside source/drain contact 335. Materials, configurations, dimensions, processes and/or operations regarding the dummy gate structures 130 are similar to or the same as the dummy gate structures 130 of FIG. 7A, the materials, configurations, dimensions, processes and/or operations regarding the gate spacers 140 are similar to or the same as the gate spacers 140 of FIG. 7A, and dimensions, processes and/or operations regarding the formation of the recesses R1 are similar to or the same as the formation of the recesses R1 of FIG. 8A.

Figure 21A:
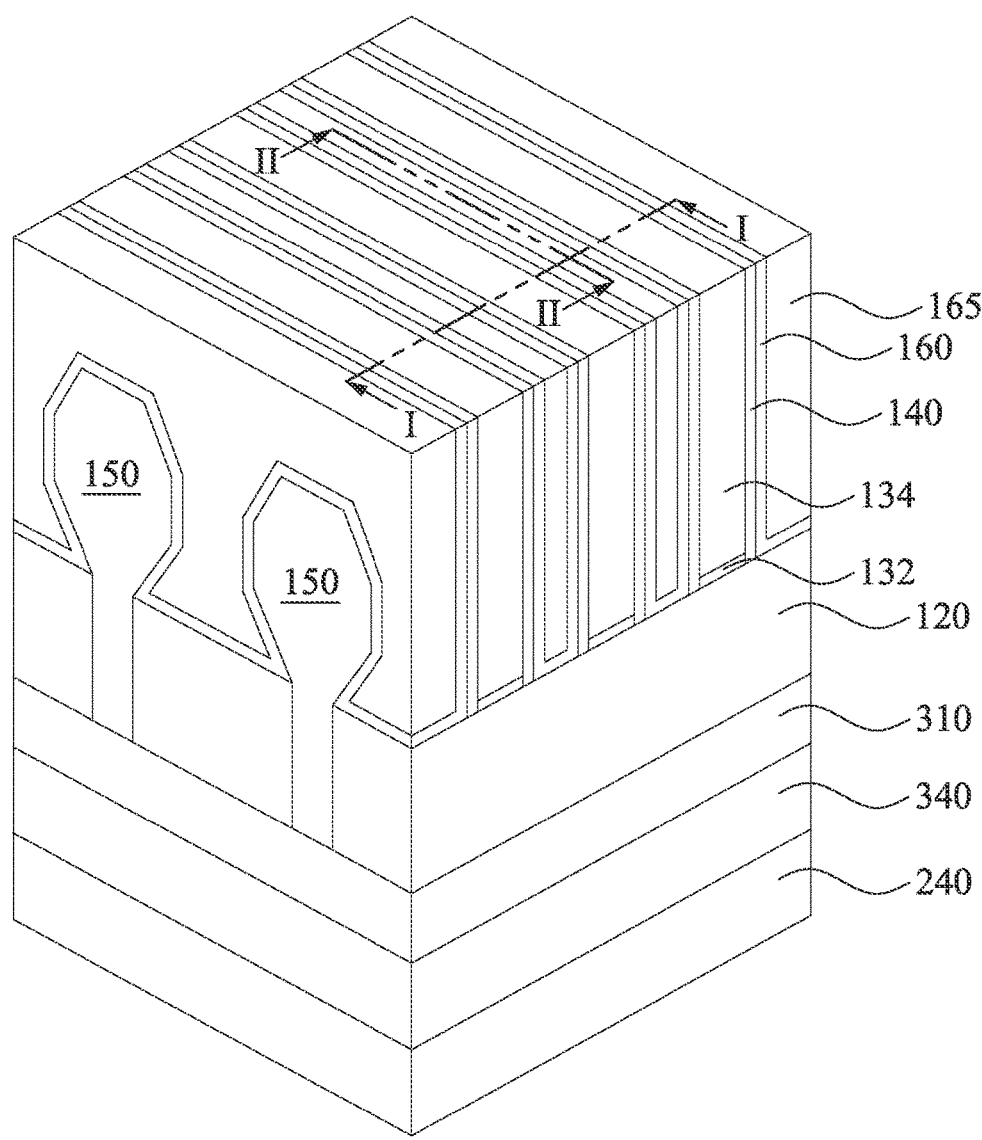
Figure 21B:
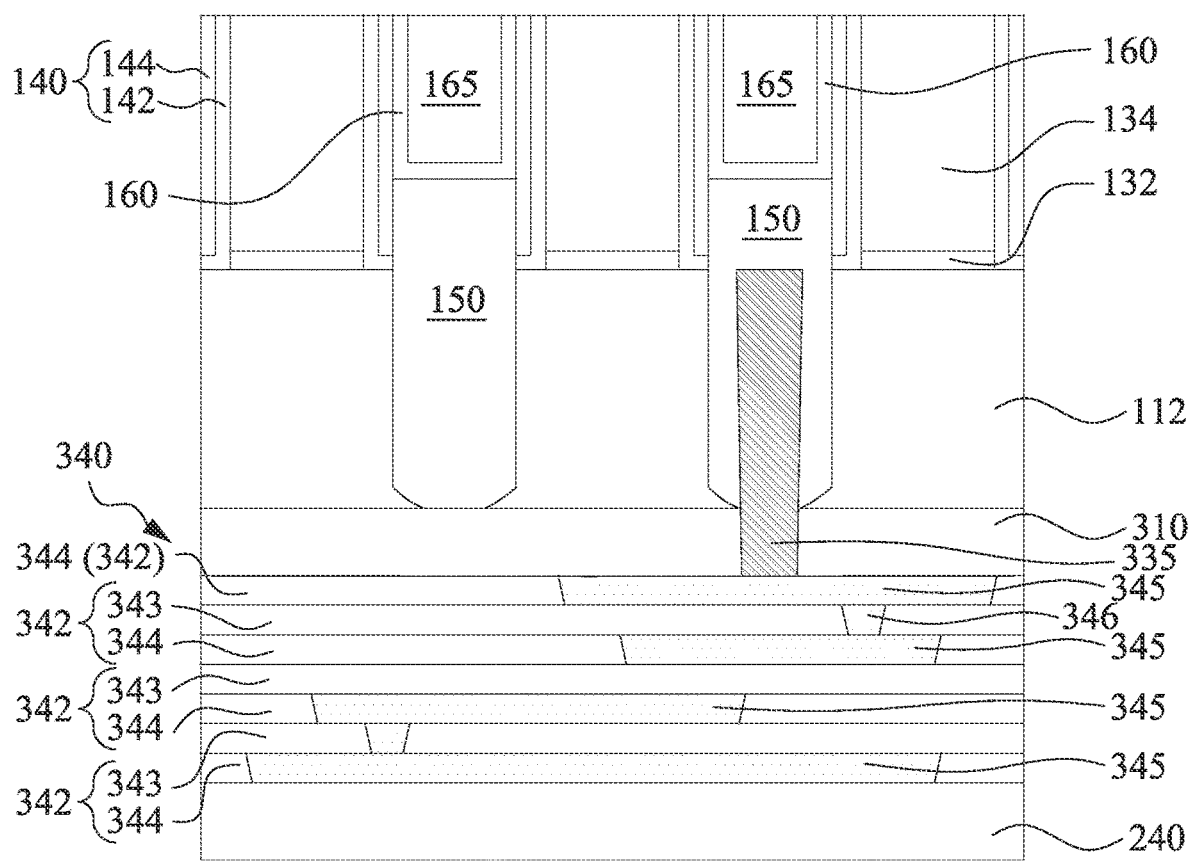
Figure 21C:
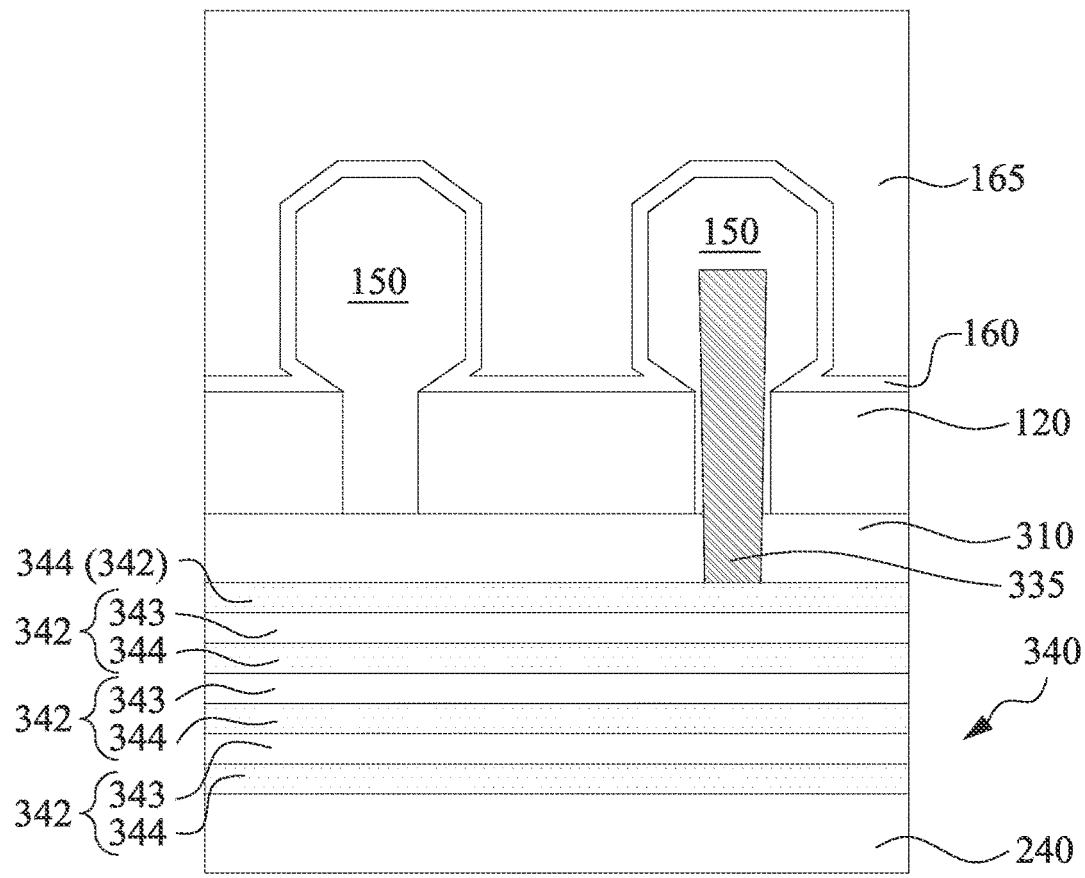

Reference is made to FIGS. 21A-21C, where FIG. 21B is a cross-sectional view taken along line I-I of FIG. 21A, and FIG. 21C is a cross-sectional view taken along line II-II of FIG. 21A. The structure of FIG. 20A undergoes the processes similar to the processes shown in FIGS. 9A-10C. That is, source/drain epitaxial structures 150 are formed in the recesses R1 in the semiconductor fins 112, and a CESL 160 and a second ILD layer 165 are sequentially formed over the first ILD layer 310. As such, at least one of the source/drain epitaxial structures 150 is electrically connected to the backside source/drain contact 335. Materials, configurations, dimensions, processes and/or operations regarding the source/drain epitaxial structures 150 are similar to or the same as the source/drain epitaxial structures 150 of FIG. 9A, and materials, configurations, dimensions, processes and/or operations regarding the CESL 160 and the second ILD layer 165 are similar to or the same as the CESL 160 and the second ILD layer 165 of FIG. 10A.

Figure 22A:
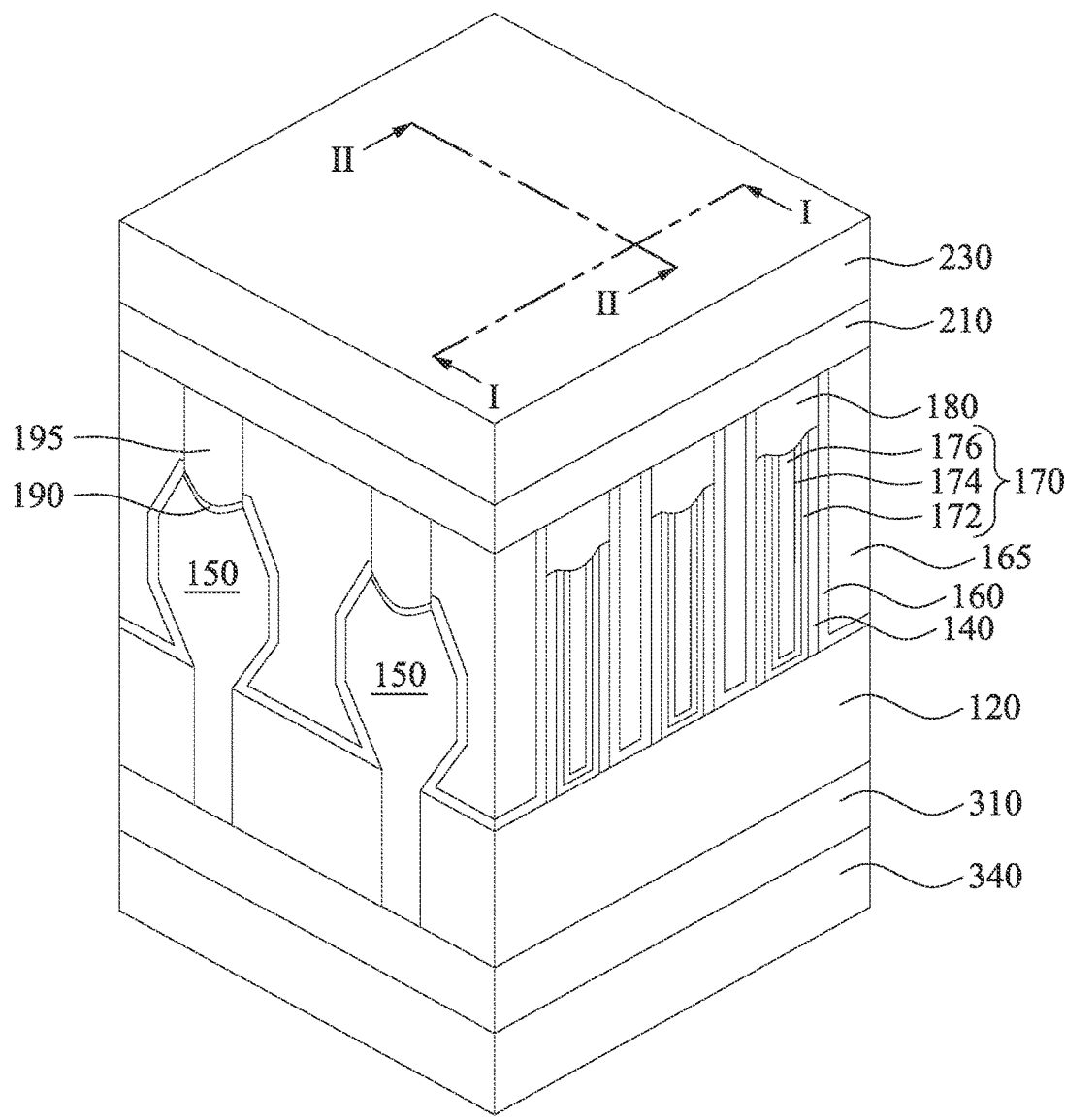
Figure 22B:
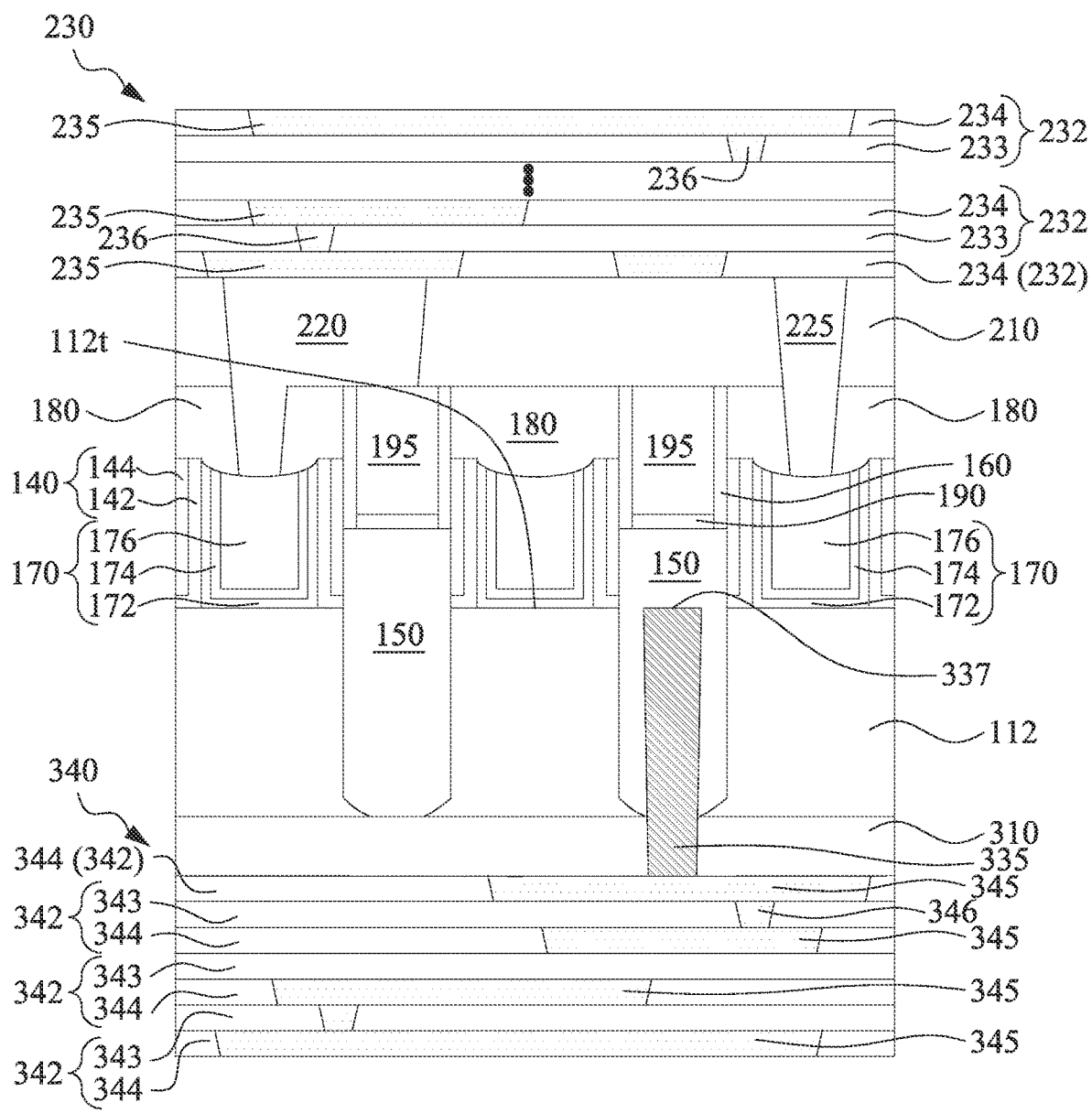
Figure 22C:
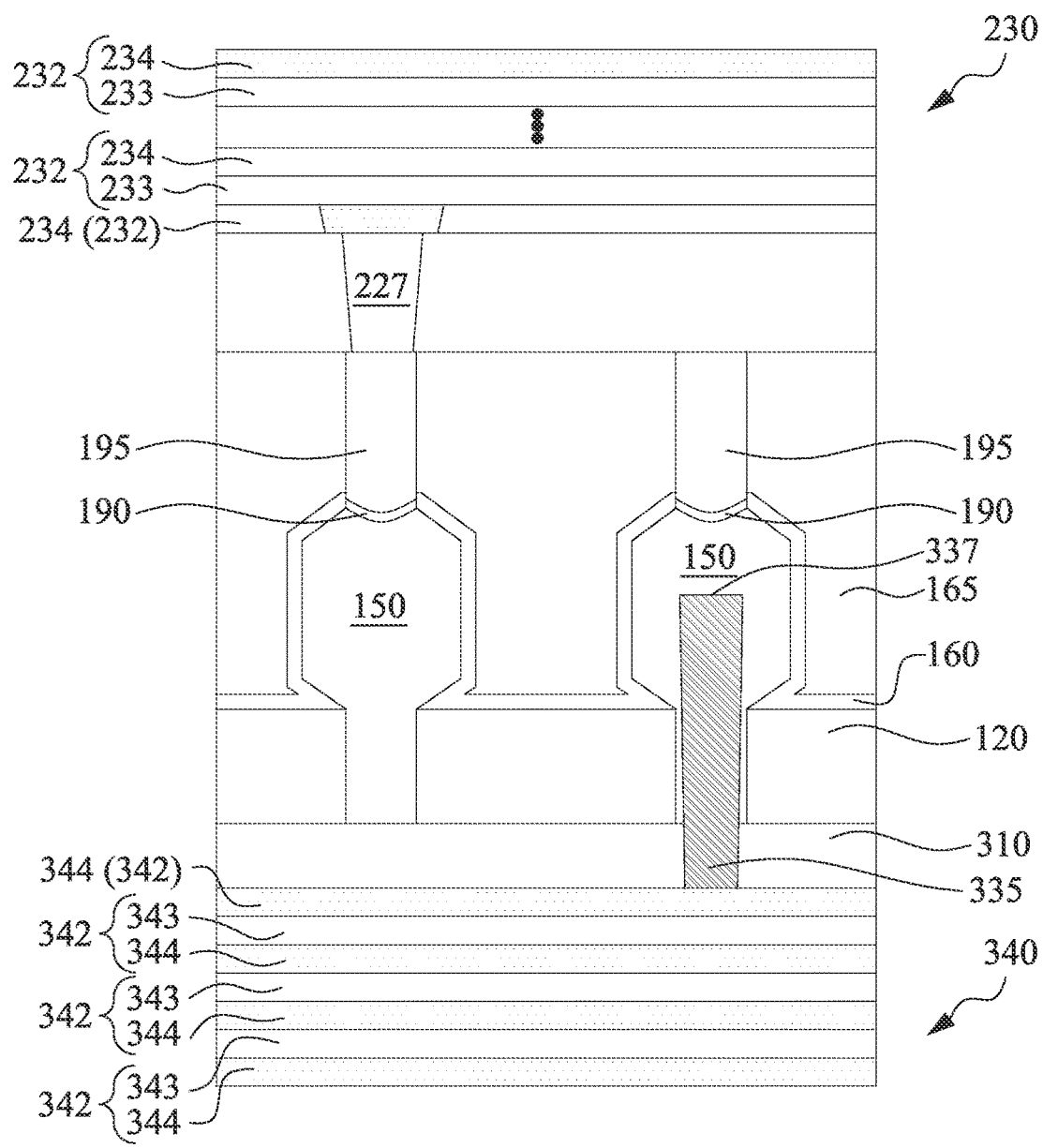

Reference is made to FIGS. 22A-22C, where FIG. 22B is a cross-sectional view taken along line I-I of FIG. 22A, and FIG. 22C is a cross-sectional view taken along line II-II of FIG. 22A. The structure of FIG. 21A undergoes the processes similar to the processes shown in FIGS. 11A-16C. That is, the dummy gate electrodes 134 and the dummy gate dielectric layers 132 (see FIGS. 21A-21C) are replaced with replacement gate structures 170. Each of the gate structures 170 includes a gate dielectric layer 172 lining the gate trench and a gate electrode over the gate dielectric layer 172. The gate electrode may include a work function metal layer 174 formed over the gate dielectric layer 172 and a fill metal 176 formed over the work function metal layer 174 and filling a remainder of gate trenches. Materials, configurations, dimensions, processes and/or operations regarding the gate structures 170 are similar to or the same as the gate structures 170 of FIG. 11A.

The gate structures 170 are then etched, and dielectric caps 180 are respectively formed on the gate structures 170. Materials, configurations, dimensions, processes and/or operations regarding the dielectric caps 180 are similar to or the same as the dielectric caps 180 of FIG. 12A.

Source/drain contacts 195 are formed extending through the second ILD layer 165. In some embodiments, metal alloy layers 190 are respectively formed above the source/drain epitaxial structures 150 prior to forming the source/drain contacts 195. Materials, configurations, dimensions, processes and/or operations regarding the source/drain contacts 195 are similar to or the same as the source/drain contacts 195 of FIG. 12A, and materials, configurations, dimensions, processes and/or operations regarding the metal alloy layers 190 are similar to or the same as the metal alloy layers 190 of FIG. 12A.

A third ILD layer 210 is formed over the substrate 110. A butted via 220, a gate via 225, and a source/drain via 227 are formed in the third ILD layer 210. Materials, configurations, dimensions, processes and/or operations regarding the third ILD layer 210 are similar to or the same as the third ILD layer 210 of FIG. 13, and materials, configurations, dimensions, processes and/or operations regarding the butted via 220, the gate via 225, and the source/drain via 227 are similar to or the same as the butted via 220, the gate via 225, and the source/drain via 227 of FIG. 15. The source/drain via 227 has similar function of the source/drain contact 335 and this design can deliver a more flexible solution for device architecture.

A front-side MLI structure 230 is formed over the third ILD layer 210. Materials, configurations, dimensions, processes and/or operations regarding the front-side MLI structure 230 are similar to or the same as the front-side MLI structure 230 of FIGS. 16A-16C.

As shown in FIGS. 22A-22C, the semiconductor device 100a includes the semiconductor fins 112, the gate structures 170 across the semiconductor fins 112, the source/drain epitaxial structures 150 on the semiconductor fins 112 and on opposite sides of the gate structures 170, and the backside source/drain contact 335 under the at least one of the source/drain epitaxial structures 150. As such, the backside source/drain contact 335 is electrically connected to one of the source/drain epitaxial structures 150.

The semiconductor device 100a further includes the front-side MLI structure 230 and the backside MLI structure 340. As shown in FIGS. 22B and 22C, the backside source/drain contact 330 interconnects the source/drain epitaxial structure 150 and the backside MLI structure 340 and tapers downward, i.e., tapers from the source/drain epitaxial structure 150 toward the backside MLI structure 340. In some embodiments, a top surface 337 of the backside source/drain contact 335 is substantially coplanar with a top surface 112t of the semiconductor fin 112 as shown in FIG. 22B. In some embodiments, the top surface 337 of the backside source/drain contact 335 is higher than a top surface 124 of the isolation structure as shown in FIG. 22C. Further, the metal lines 235 and the front-side conductive vias of the front-side MLI structure 230 and the metal lines 345 and the backside conductive vias 346 of the backside MLI structure 340 taper downward. In some embodiments, the semiconductor device 200 further includes the source/drain via 227 tapering downward.

FIGS. 23A-33C illustrate a method for manufacturing a semiconductor device (or an integrated circuit structure) 200 at various stages in accordance with some embodiments of the present disclosure. In addition to the semiconductor device 100a, FIGS. 23A, 24A, 25, 26, 27A, 28-30A, 31-32A, and 33A depict X-axis, Y-axis, and Z-axis directions. In some embodiments, the semiconductor device 200 shown in FIGS. 23A-33C may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 23A:
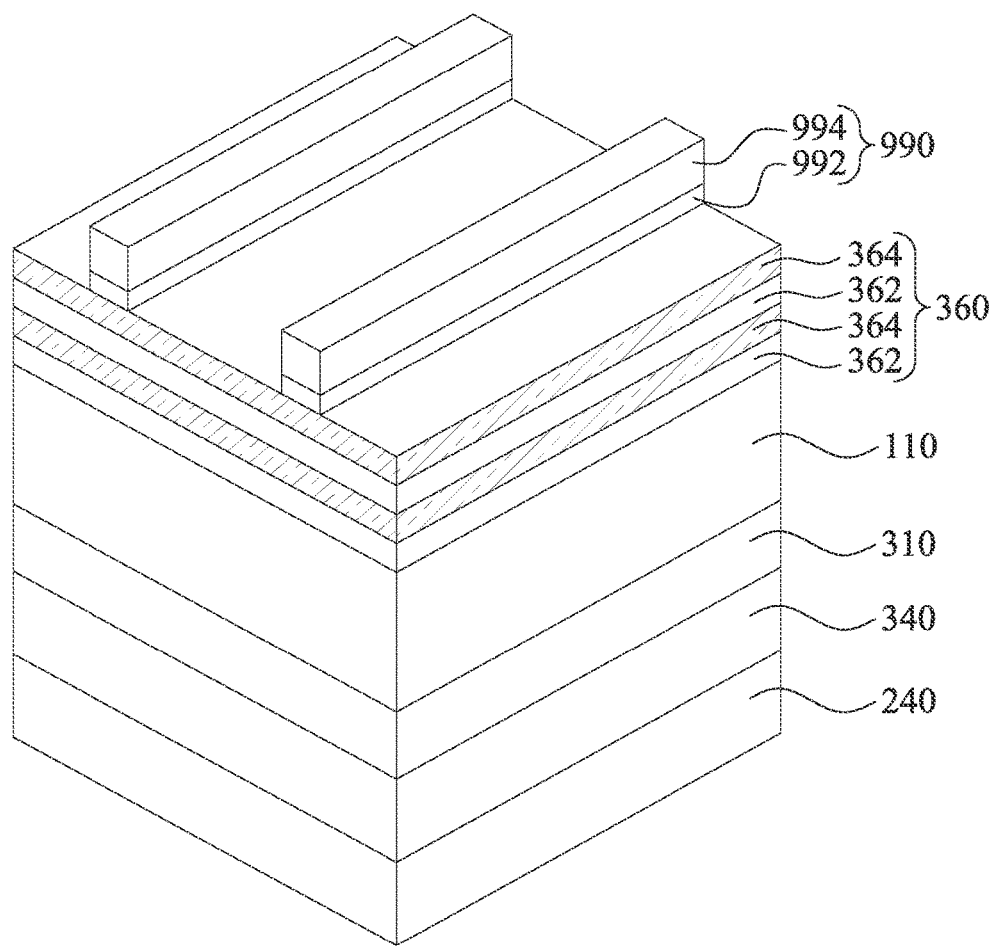
FIGS. 23A-33C illustrate a method for manufacturing a semiconductor device at various stages in accordance with some embodiments of the present disclosure.
Figure 23B:
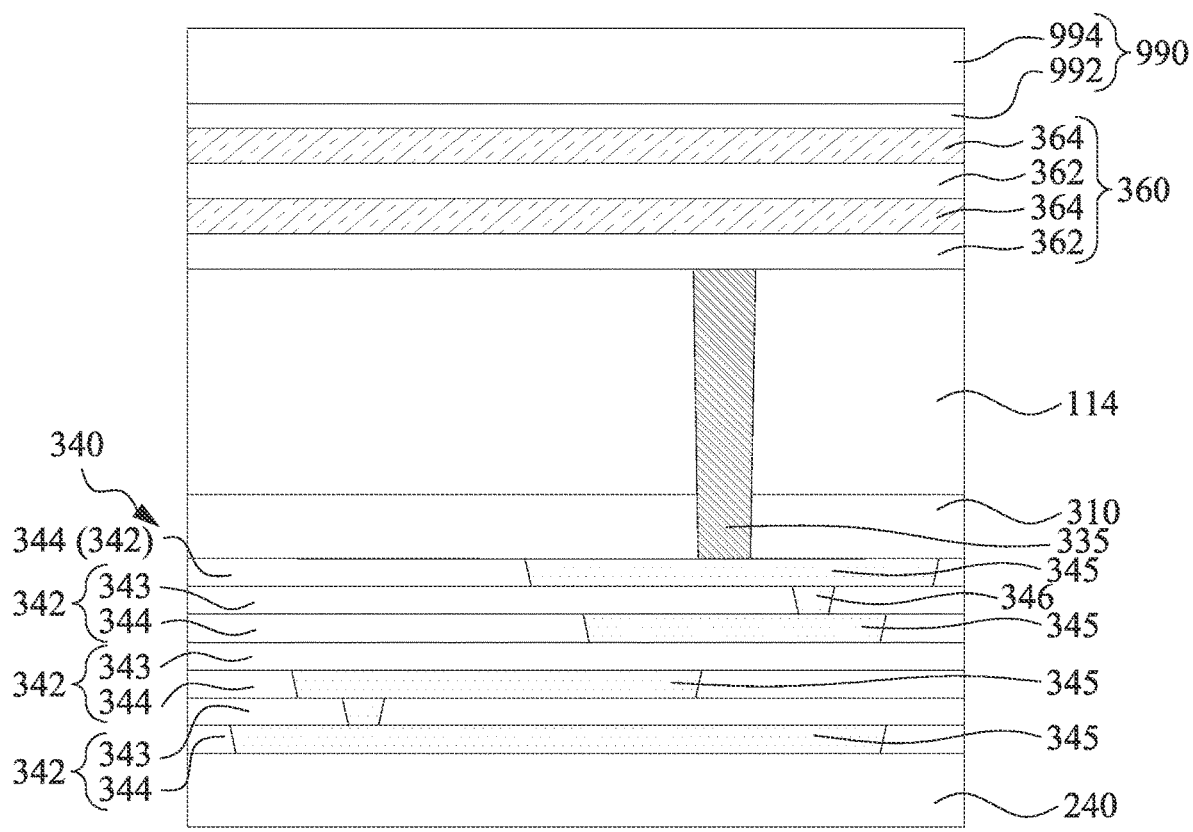

Reference is made to FIGS. 23A-23B, where FIG. 23B is a cross-sectional view taken along line I-I of FIG. 23A. In some embodiments, the manufacturing processes of FIGS. 17A-18B are performed in advance. That is, a carrier substrate 240 is provided. Materials, configurations, dimensions, processes and/or operations regarding the carrier substrate 240 are similar to or the same as the carrier substrate 240 of FIG. 1A. Subsequently, a backside MLI structure 340 is formed over the carrier substrate 240. Materials, configurations, dimensions, processes and/or operations regarding the backside MLI structure 340 are similar to or the same as the backside MLI structure 340 of FIG. 1A.

A first ILD layer 310 and a substrate 110 are sequentially formed over the backside MLI structure 340. Materials, configurations, dimensions, processes and/or operations regarding the first ILD layer 310 are similar to or the same as the backside first ILD layer 310 of FIG. 1A, and materials, configurations, dimensions, processes and/or operations regarding the substrate 110 are similar to or the same as the substrate 110 of FIG. 1A.

A backside source/drain contact 335 is formed in the first ILD layer 310 and the substrate 110. Materials, configurations, dimensions, processes and/or operations regarding the backside source/drain contact 335 are similar to or the same as the backside source/drain contact 335 of FIG. 18A.

A stacked structure 360 is formed on the substrate 110 through epitaxy, such that the stacked structure 360 forms crystalline layers. The stacked structure 360 includes first semiconductor layers 362 and second semiconductor layers 364 stacked alternately. The first semiconductor layers 362 and the second semiconductor layers 364 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 362 and the second semiconductor layers 364 are made of Si, a Si compound, SiGe, Ge or a Ge compound. In FIG. 23A, two layers of the first semiconductor layer 362 and three layers of the second semiconductor layer 364 are disposed. However, the number of the layers are not limited to five, and may be as small as 1 (each layer) and in some embodiments, 3-10 layers of each of the first and second semiconductor layers are formed. By adjusting the numbers of the stacked layers, a driving current of the GAA FET device can be adjusted.

In some embodiments, the first semiconductor layers 362 can be SiGe layers having a germanium atomic percentage greater than zero. In some embodiments, the germanium percentage of the first semiconductor layers 362 is in the range between about 10 percent and about 50 percent. In some embodiments, the second semiconductor layers 364 may be pure silicon layers that are free from germanium. The second semiconductor layers 364 may also be substantially pure silicon layers, for example, with a germanium atomic percentage lower than about 1 percent. Furthermore, the second semiconductor layers 364 may be intrinsic, which are not doped with p-type and n-type impurities. In some embodiments, the first semiconductor layers 362 are referred to as sacrificial layers, and the second semiconductor layers 364 are referred to as channel layers.

Subsequently, a patterned mask layer 990 is formed above the stacked structure 360. In some embodiments, the patterned mask layer 990 includes a first mask layer 992 and a second mask layer 994. The first mask layer 992 may be a pad oxide layer made of a silicon oxide, which can be formed by a thermal oxidation. The second mask layer 994 may be made of a silicon nitride (SiN), which is formed by chemical vapor deposition (CVD), including low pressure CVD (LPCVD) and plasma enhanced CVD (PECVD), plasma enhanced atomic layer deposition (PEALD), atomic layer deposition (ALD), or other suitable process.

Figure 24A:
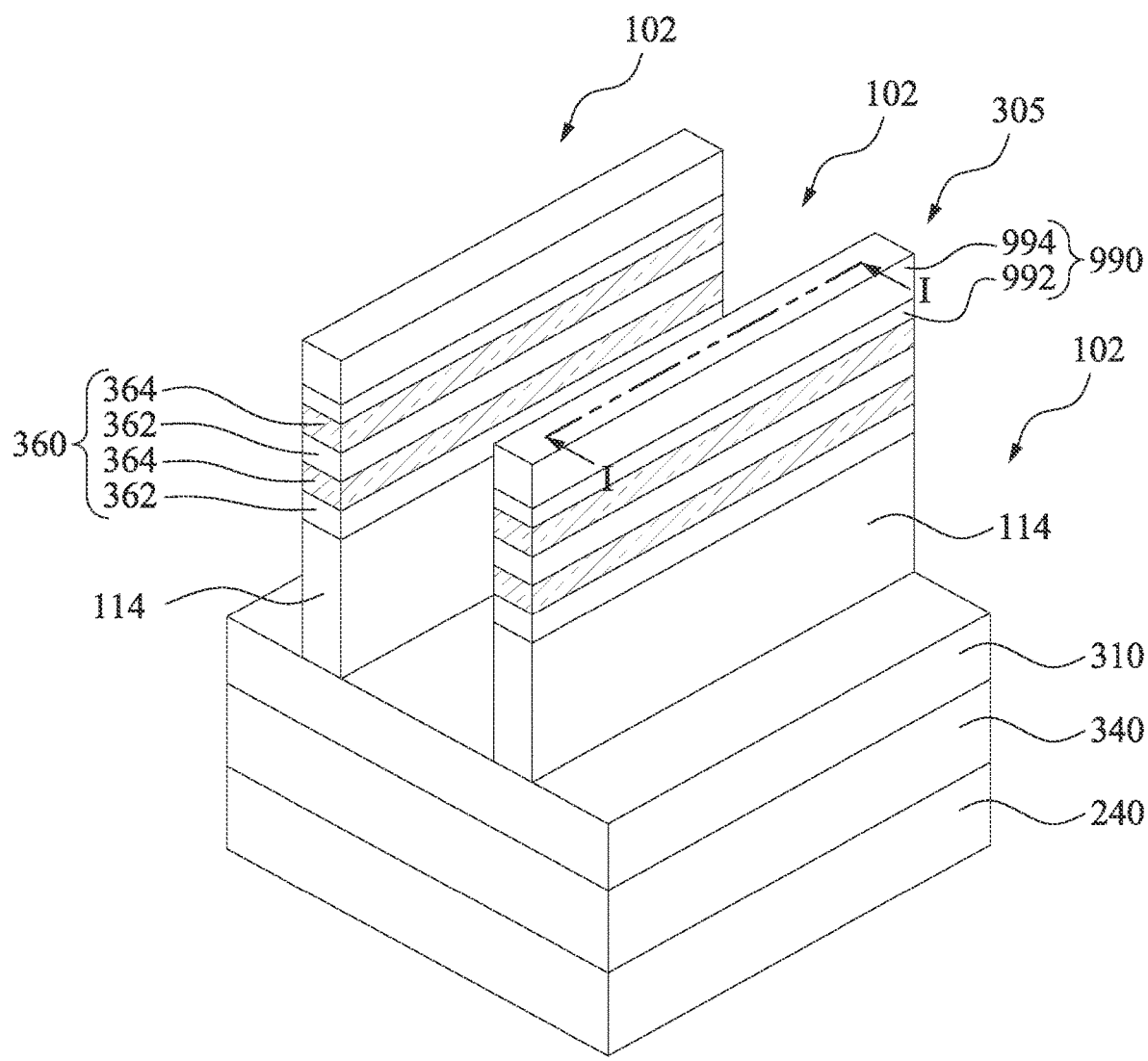
Figure 24B:
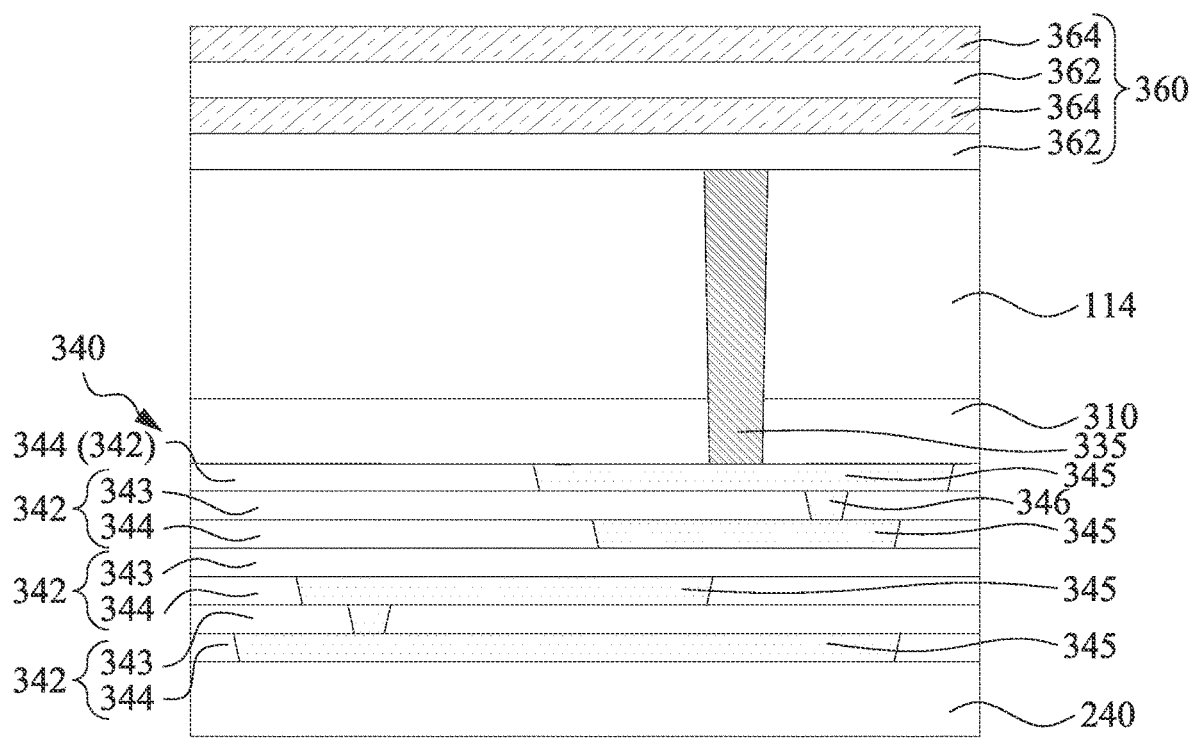

Reference is made to FIGS. 24A-24B, where FIG. 24B is a cross-sectional view taken along line I-I of FIG. 24A. The stacked structure 360 (see FIG. 23A) is patterned by using the patterned mask layer 990 as an etch mask, such that the stacked structure 360 is patterned into fin structures 305 and trenches 102 extending in the X direction. In FIG. 24A, two fin structures 305 are arranged in the Y direction. But the number of the fin structures is not limited to, and may be as small as one and three or more. In some embodiments, one or more dummy fin structures are formed on both sides of the fin structures 305 to improve pattern fidelity in the patterning operations. In some embodiments, one or more patterning process can be performed to cut at least one of the fin structures 305 into plural sections, such that active regions of the fin structures 305 can be defined according to different layout designs.

The trenches 102 extend into the substrate 110, and have lengthwise directions substantially parallel to each other. The trenches 102 form base portions 114 in the substrate 110, where the base portions 114 protrude from the substrate 110, and the fin structures 305 are respectively formed above the base portions 114 of the substrate 110. The remaining portions of the stacked structure 360 are accordingly referred to as the fin structures 305 alternatively. In FIG. 24B, the backside source/drain contact 335 is embedded in the base portion 114 of one of the fin structures 305.

Figure 25:
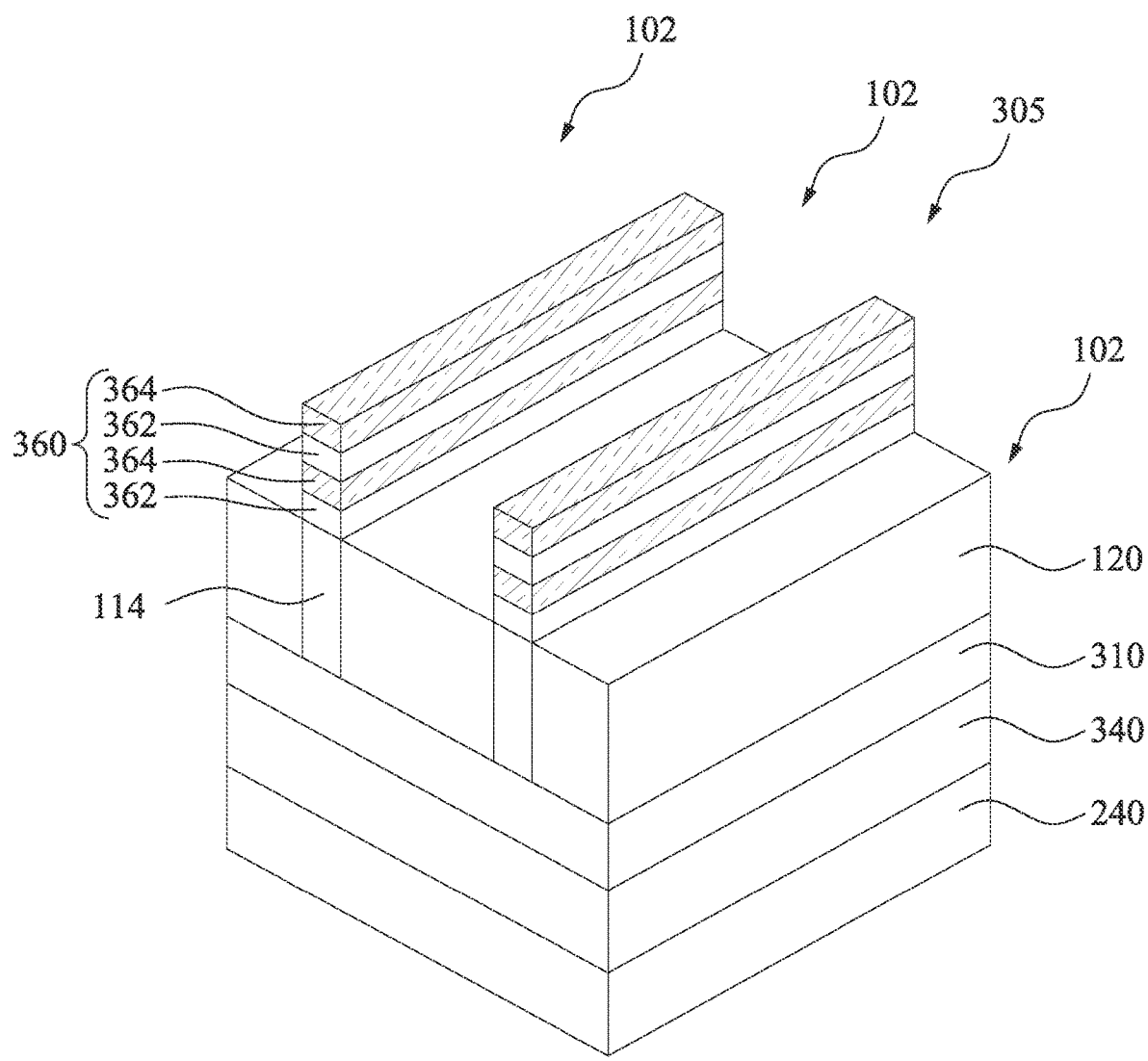

Reference is made to FIG. 25. After the fin structures 305 are formed, isolation structures 120 are formed above the structure in FIG. 25 so that the fin structures 305 are exposed. Materials, configurations, dimensions, processes and/or operations regarding the isolation structures 120 are similar to or the same as the isolation structures 120 of FIG. 6A. During the formation of the isolation structures 120, the patterned mask layer 990 is removed.

Figure 26:
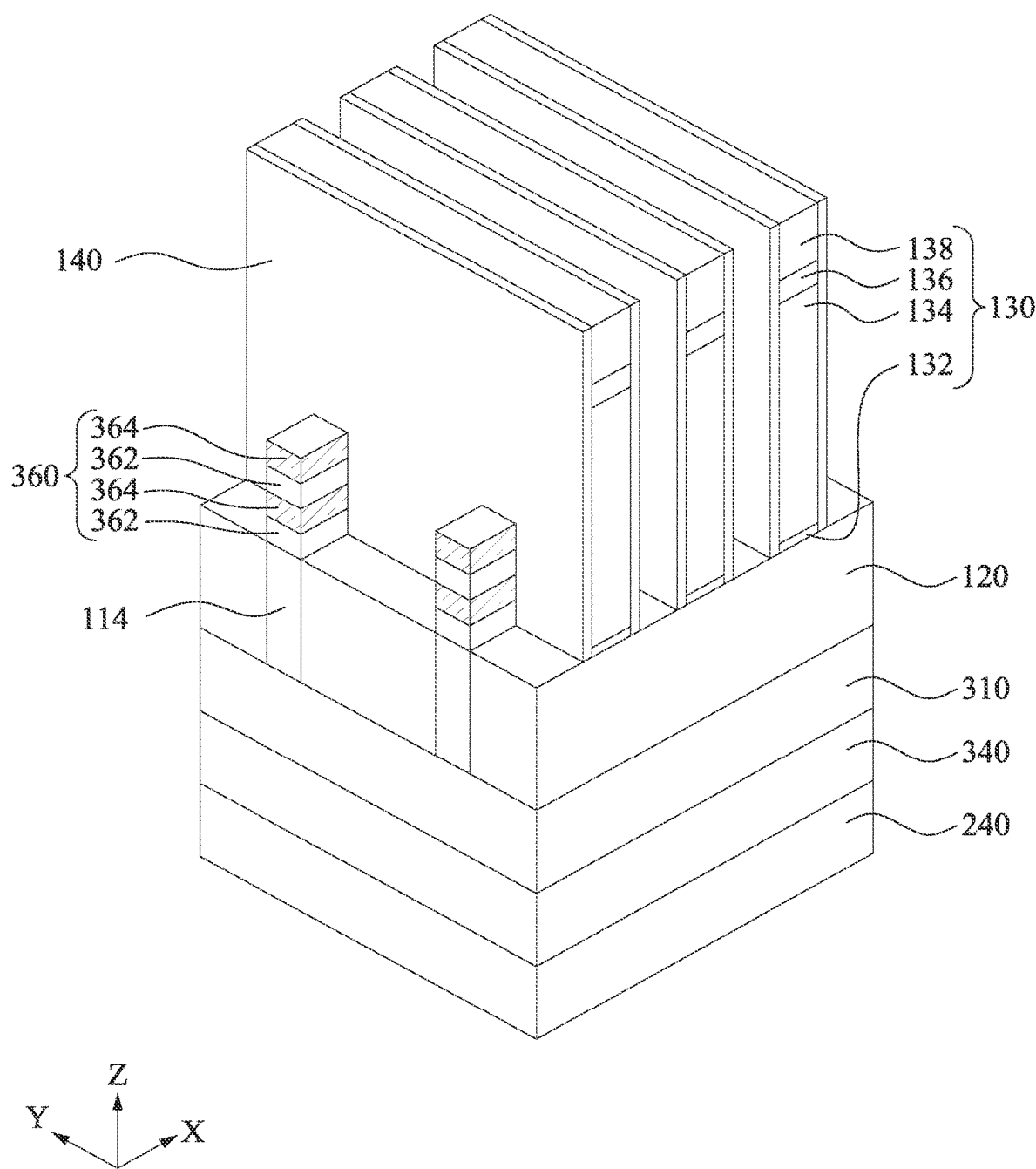

Reference is made to FIG. 26. The structure of FIG. 25 undergoes the processes similar to the processes shown in FIG. 7A. That is, dummy gate structures 130 each including a dummy gate dielectric layer 132, a dummy gate electrode 134, an oxide mask layer 136, and a nitride mask layer 138 are formed over the first ILD layer 310 and at least partially disposed over the base portions 114, and gate spacers 140 each including a first spacer layer 142 and a second spacer layer 144 are formed on sidewalls of the dummy gate structures 130. Materials, configurations, dimensions, processes and/or operations regarding the dummy gate structures 130 are similar to or the same as the dummy gate structures 130 of FIG. 7A, and the materials, configurations, dimensions, processes and/or operations regarding the gate spacers 140 are similar to or the same as the gate spacers 140 of FIG. 7A.

Figure 27A:
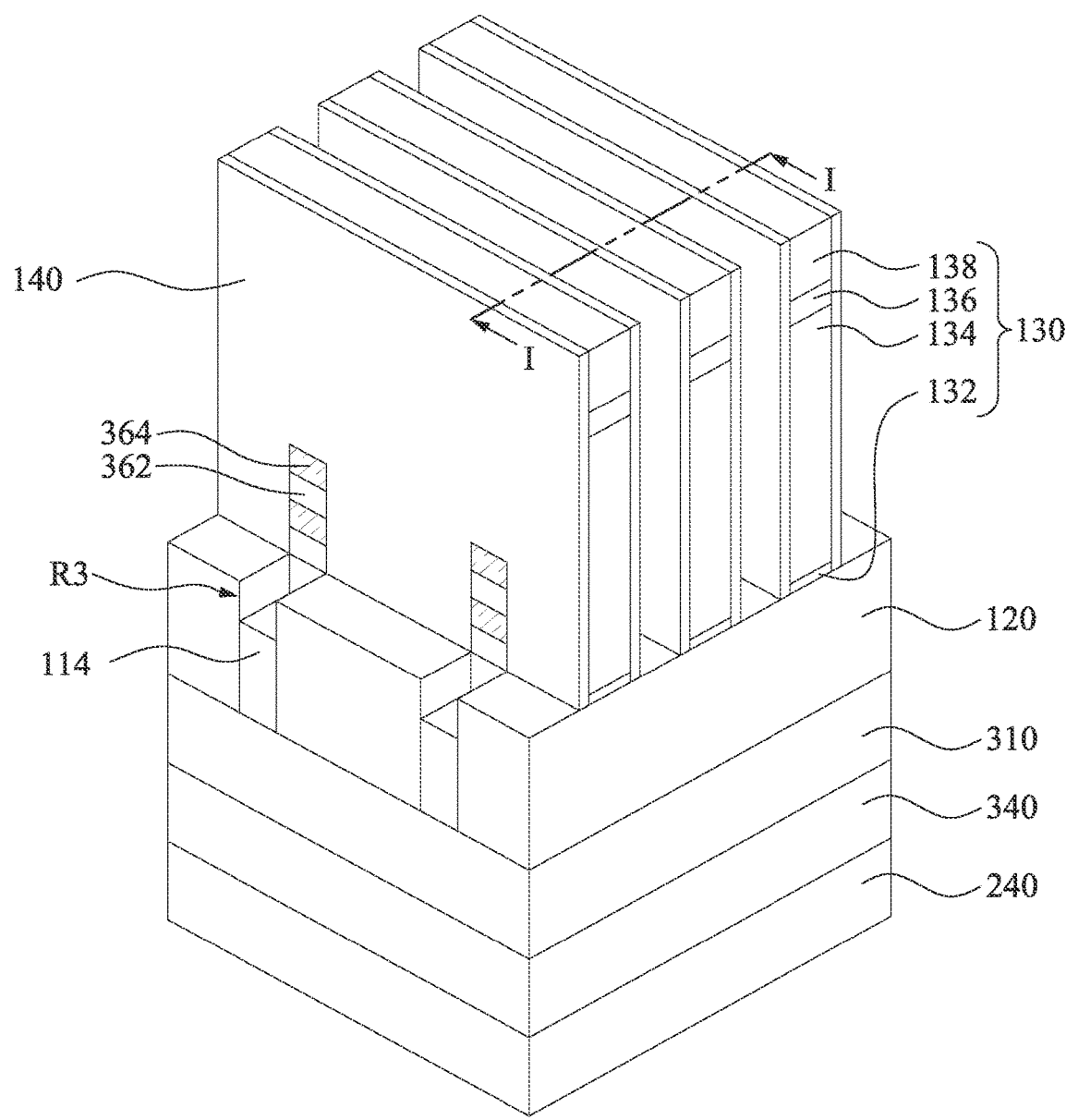
Figure 27B:
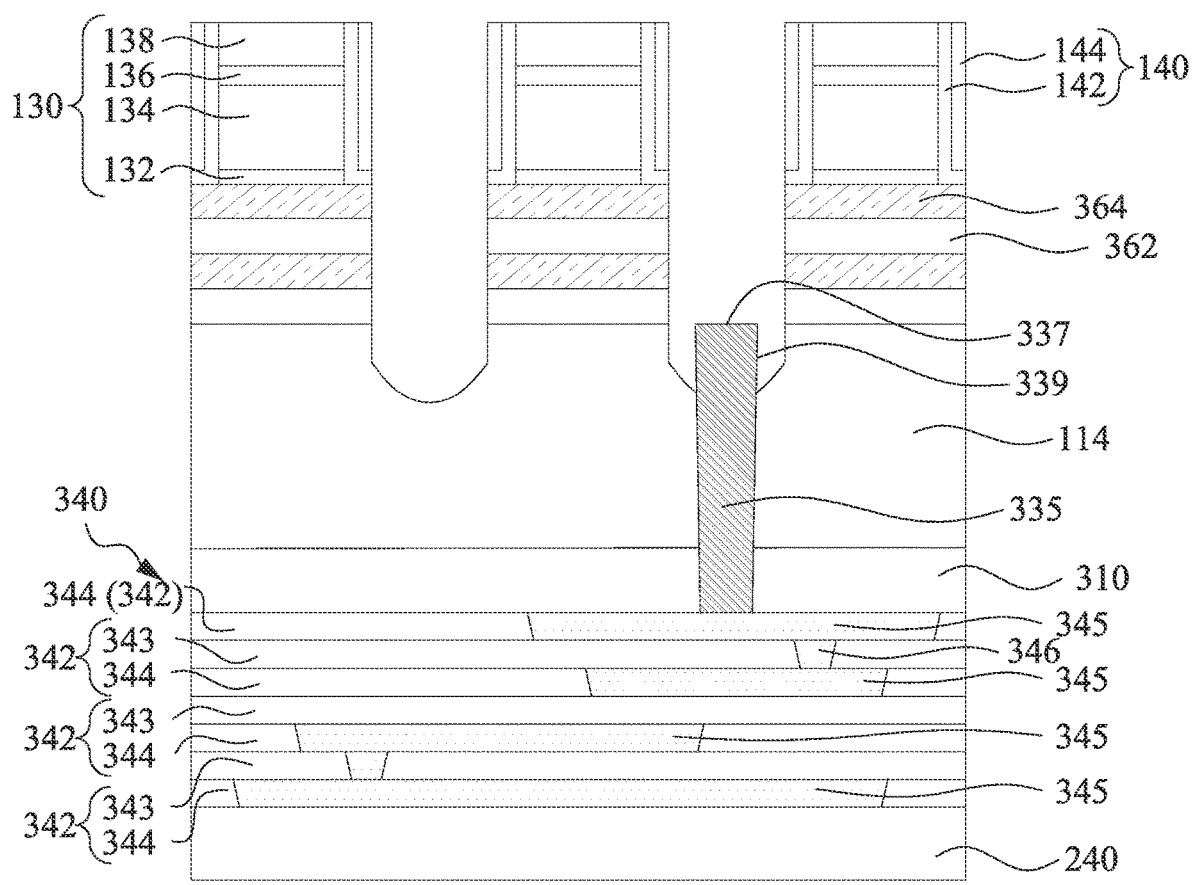

Reference is made to FIGS. 27A-27B, where FIG. 27B is a cross-sectional view taken along line I-I of FIG. 27A. Recesses R3 are formed in the base portions 114. As such, at least one of the recesses R3 exposes a top surface 337 and a sidewall 339 of the backside source/drain contact 335 as shown in FIG. 27B. Dimensions, processes and/or operations regarding the formation of the recesses R3 are similar to or the same as the formation of the recesses R1 of FIG. 8A.

Figure 28:
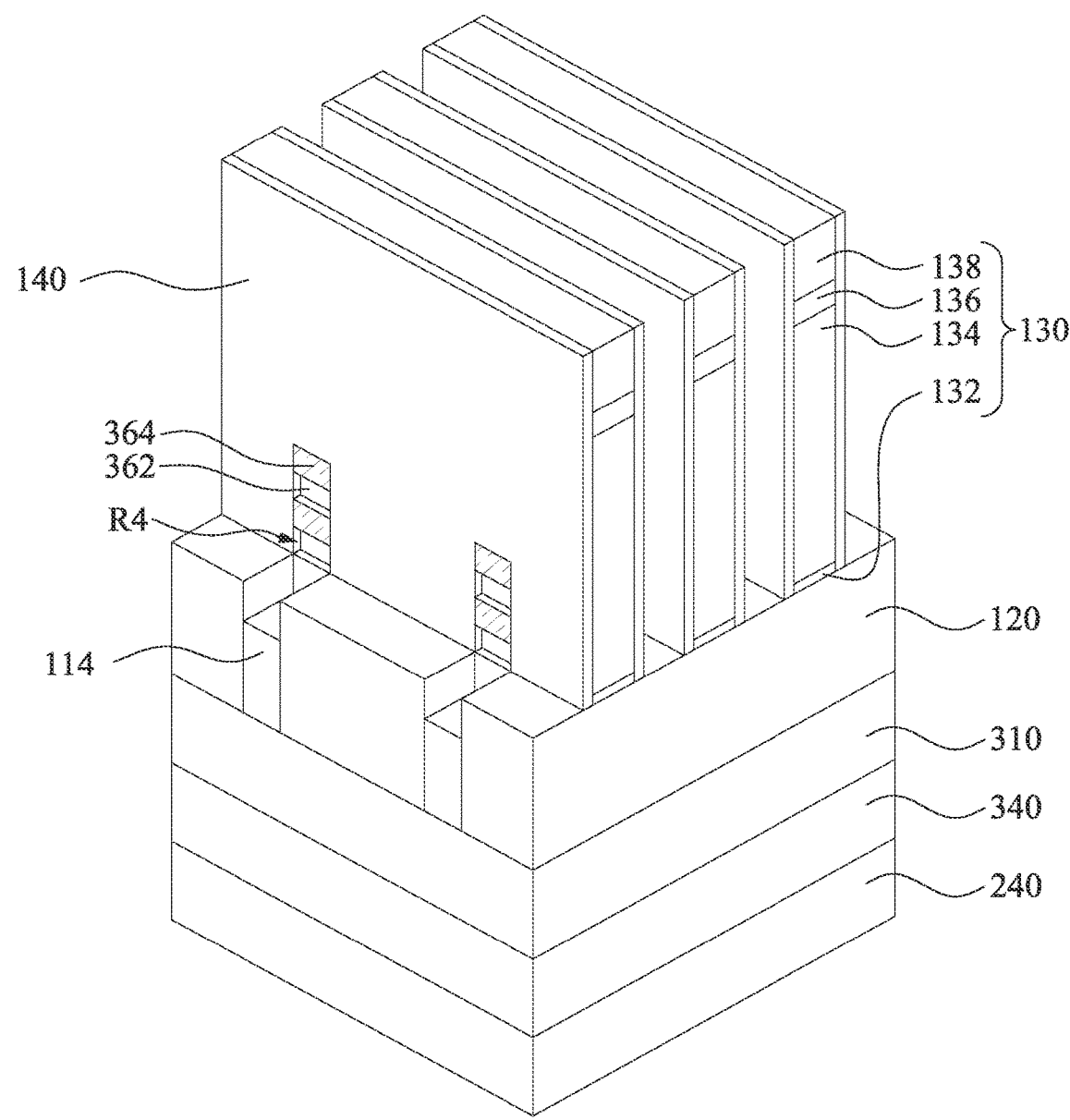

Reference is made to FIG. 28. Subsequently, the first semiconductor layers 362 are horizontally recessed (etched) to form recesses R4 so that the second semiconductor layers 364 laterally extend past opposite end surfaces of the first semiconductor layers 362. In some embodiments, end surfaces of the first semiconductor layers 362 may be substantially vertically aligned with the sidewalls of the dummy gate electrodes 134 and/or the sidewalls of the gate spacers 140.

Figure 29:
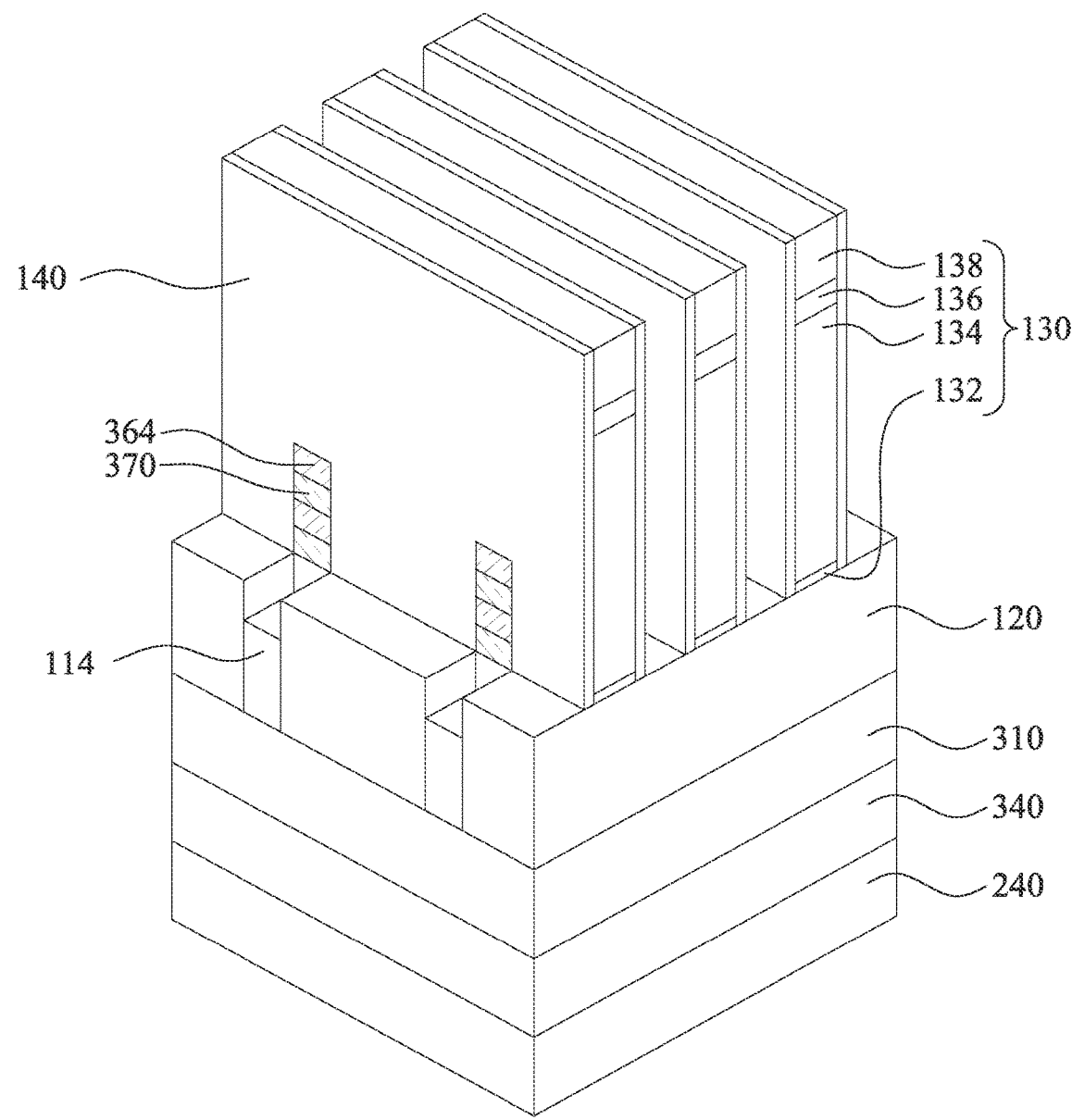

Reference is made to FIG. 29. Inner spacers 370 are respectively formed on sidewalls of the semiconductor layers 362 (see FIG. 28). For example, a dielectric material layer is formed over the structure of FIG. 28, and one or more etching operations are performed to form the inner spacers 370. In some embodiments, the inner spacers 370 includes a silicon nitride-based material, such as SiN, SiON, SiOCN or SiCN and combinations thereof and is different from the material of the gate spacers 140. In some embodiments, the inner spacers 370 are silicon nitride. The inner spacers 370 may fully fill the recesses R4 as shown in FIG. 29. The dielectric material layer can be formed using CVD, including PECVD, PEALD, ALD, or other suitable processes. The etching operations include one or more wet and/or dry etching operations. In some embodiments, the etching is an isotropic etching in some embodiments.

Figure 30A:
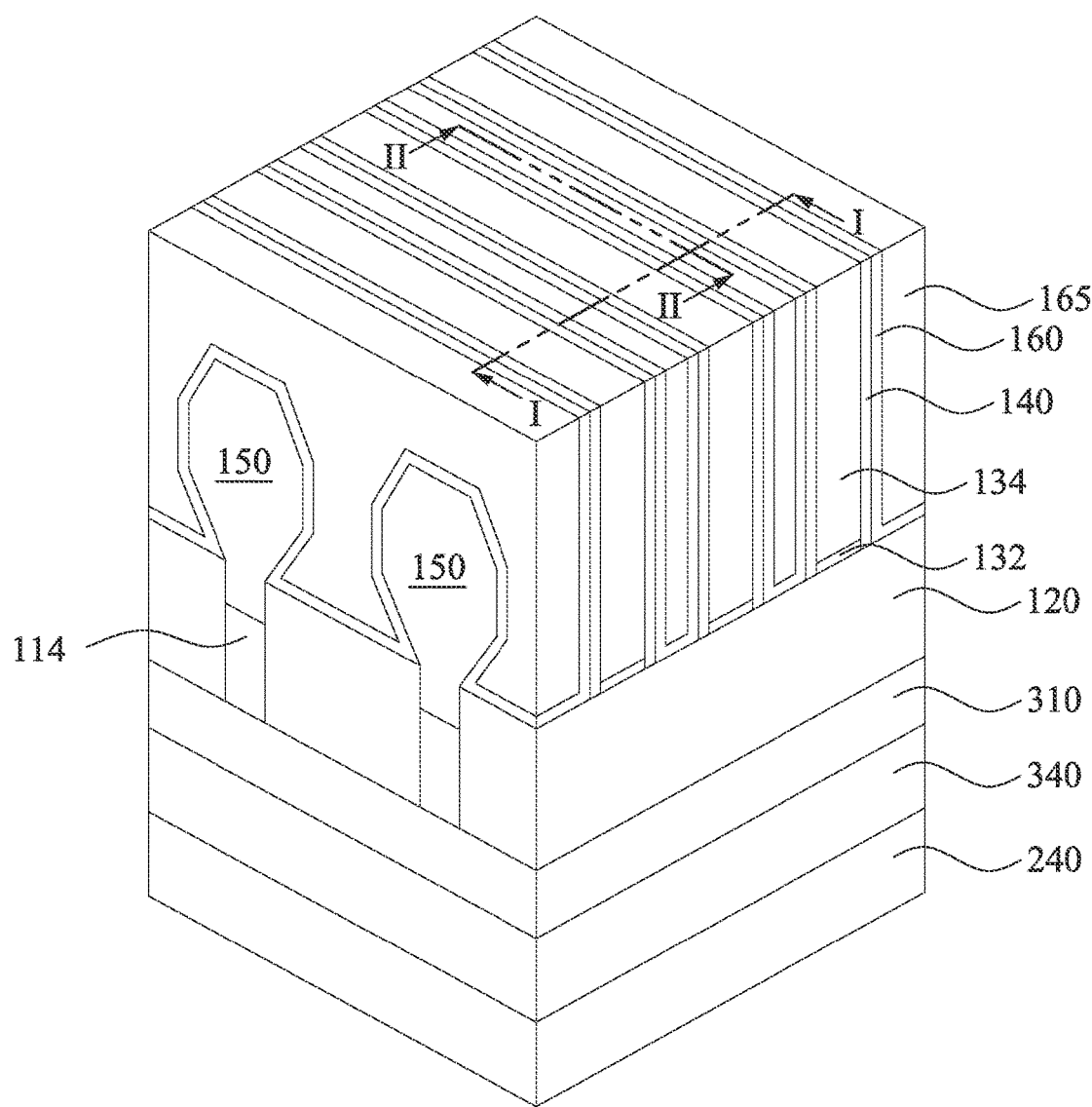
Figure 30B:
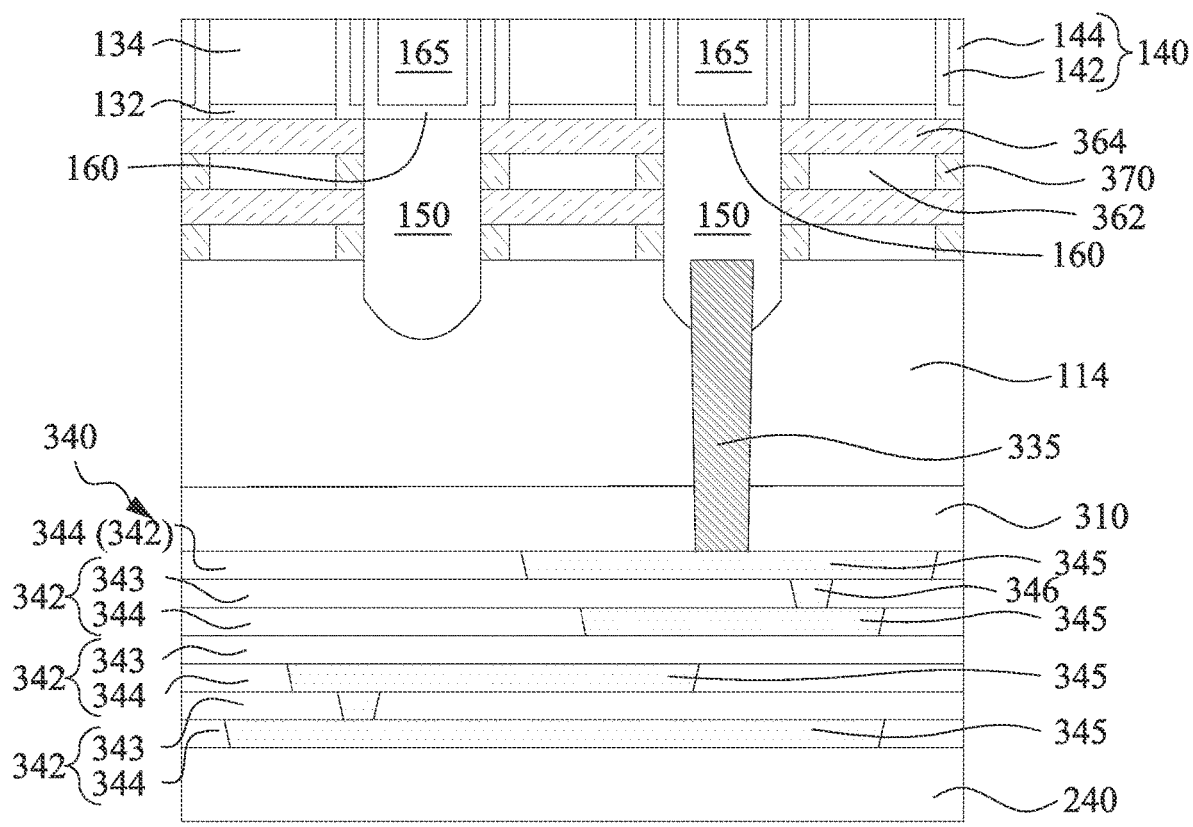
Figure 30C:
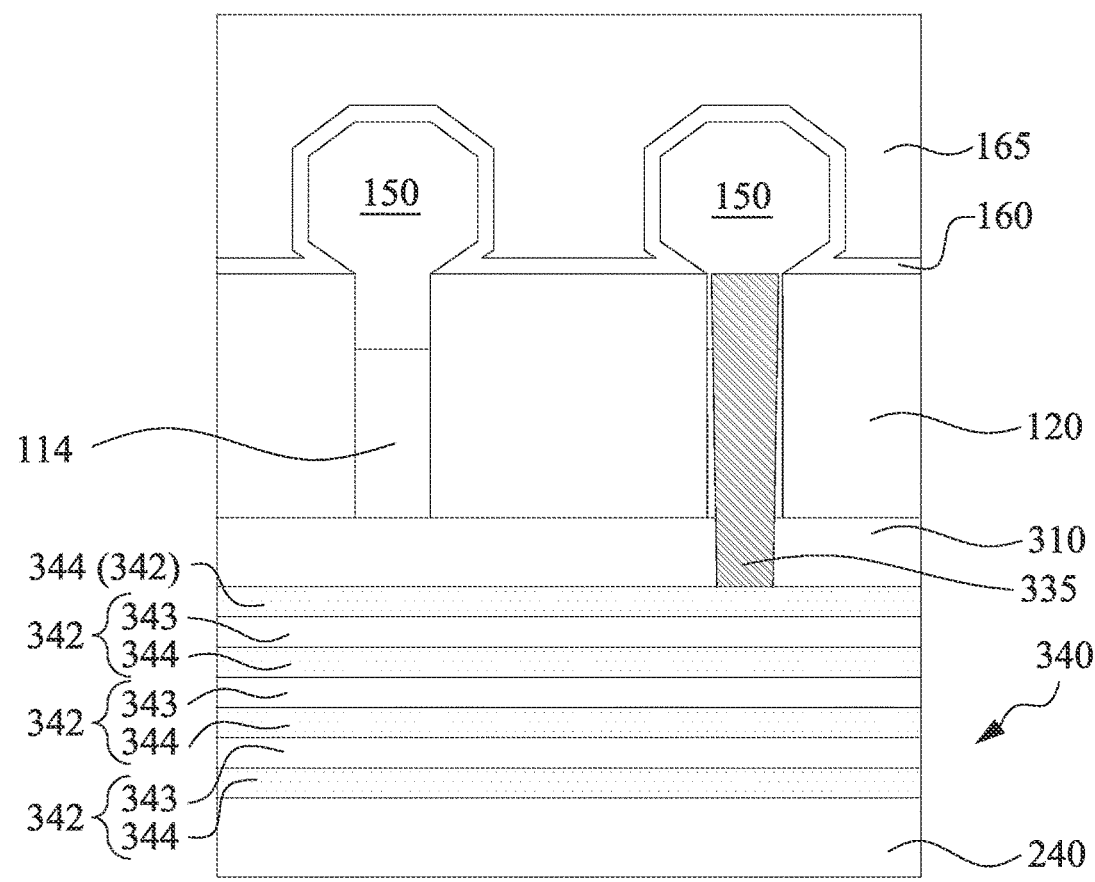

Reference is made to FIGS. 30A-30B, where FIG. 30B is a cross-sectional view taken along line I-I of FIG. 30A, and FIG. 30C is a cross-sectional view taken along line II-II of FIG. 30A. The structure of FIG. 29 undergoes the processes similar to the processes shown in FIGS. 9A-10C. That is, source/drain epitaxial structures 150 are formed on the base portions 114 that are not covered by the dummy gate structures 130 and the gate spacers 140, and a CESL 160 and a second ILD layer 165 are sequentially formed over the first ILD layer 310. As such, at least one of the source/drain epitaxial structures 150 is electrically connected to the backside source/drain contact 335 as shown in FIGS. 30B and 30C. Materials, configurations, dimensions, processes and/or operations regarding the source/drain epitaxial structures 150 are similar to or the same as the source/drain epitaxial structures 150 of FIG. 9A, and materials, configurations, dimensions, processes and/or operations regarding the CESL 160 and the second ILD layer 165 are similar to or the same as the CESL 160 and the second ILD layer 165 of FIG. 10A.

Figure 31:
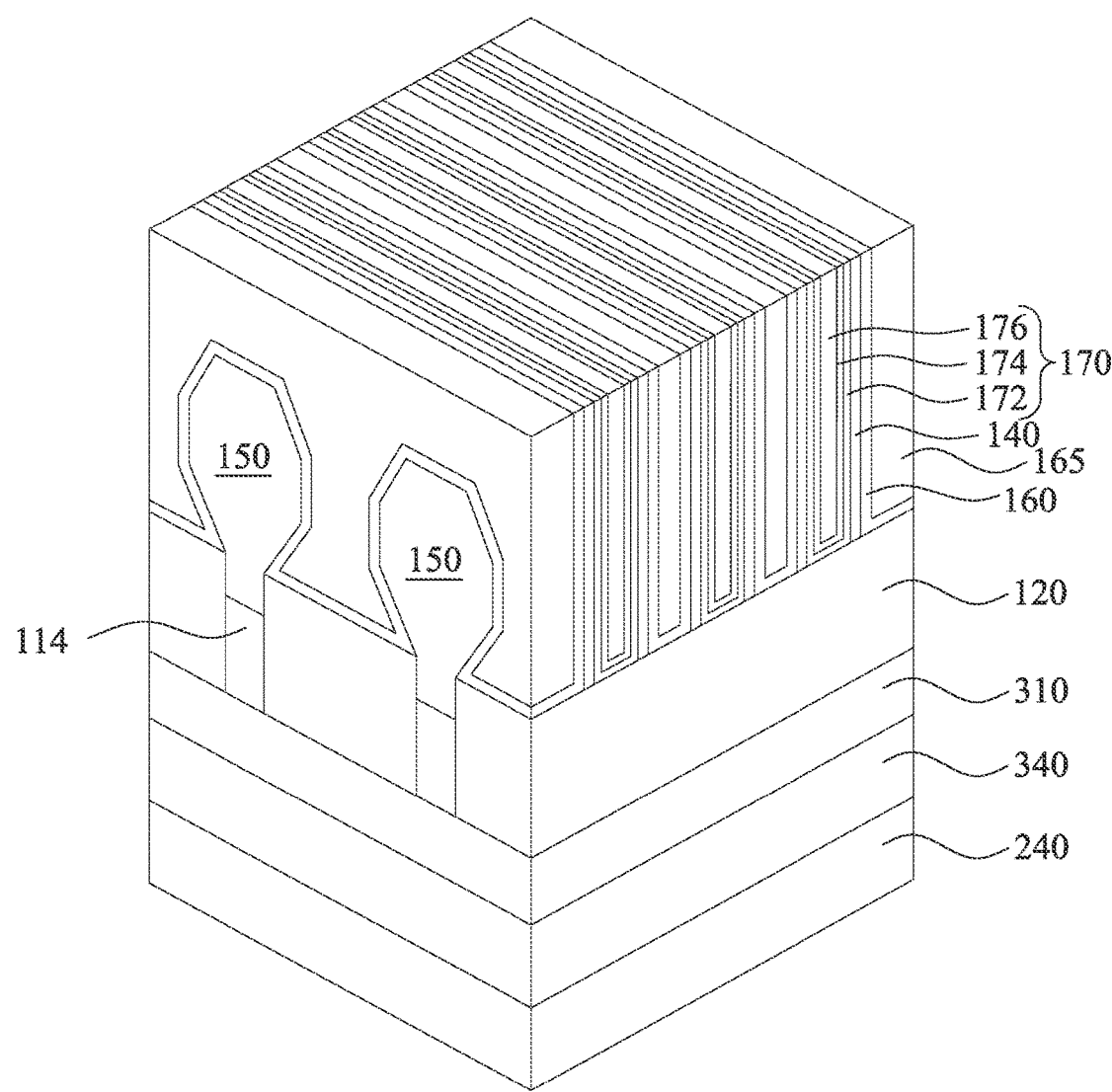

Reference is made to FIG. 31. The dummy gate electrodes 134 and the dummy gate dielectric layers 132 (see FIGS. 30A-30C) are replaced with replacement gate structures 170. Each of the gate structures 170 includes a gate dielectric layer 172 lining the gate trench and a gate electrode over the gate dielectric layer 172. The gate electrode may include a work function metal layer 174 formed over the gate dielectric layer 172 and a fill metal 176 formed over the work function metal layer 174 and filling a remainder of gate trenches. Materials, configurations, dimensions, processes and/or operations regarding the gate structures 170 are similar to or the same as the gate structures 170 of FIG. 11A.

Figure 32A:
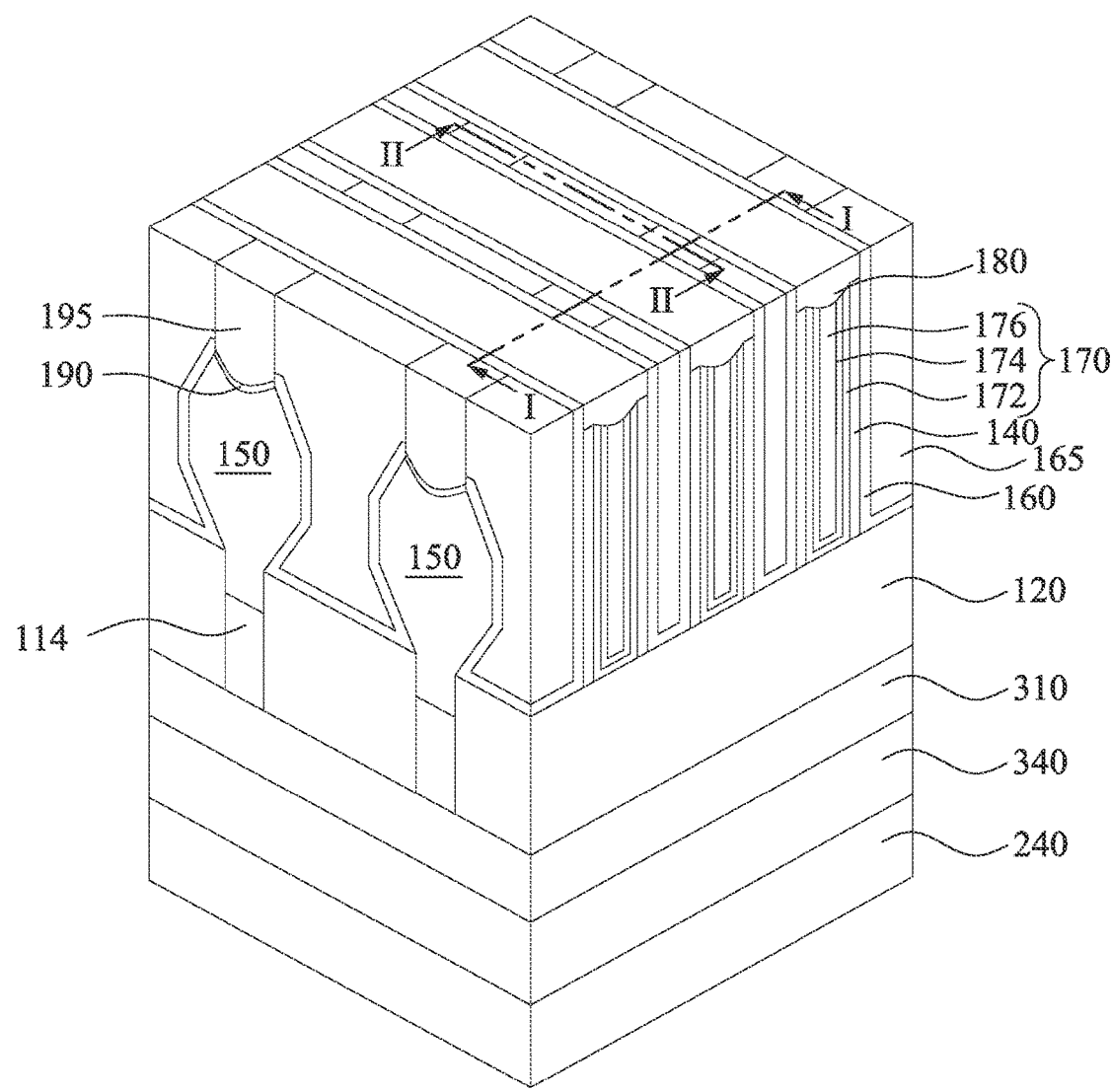
Figure 32B:
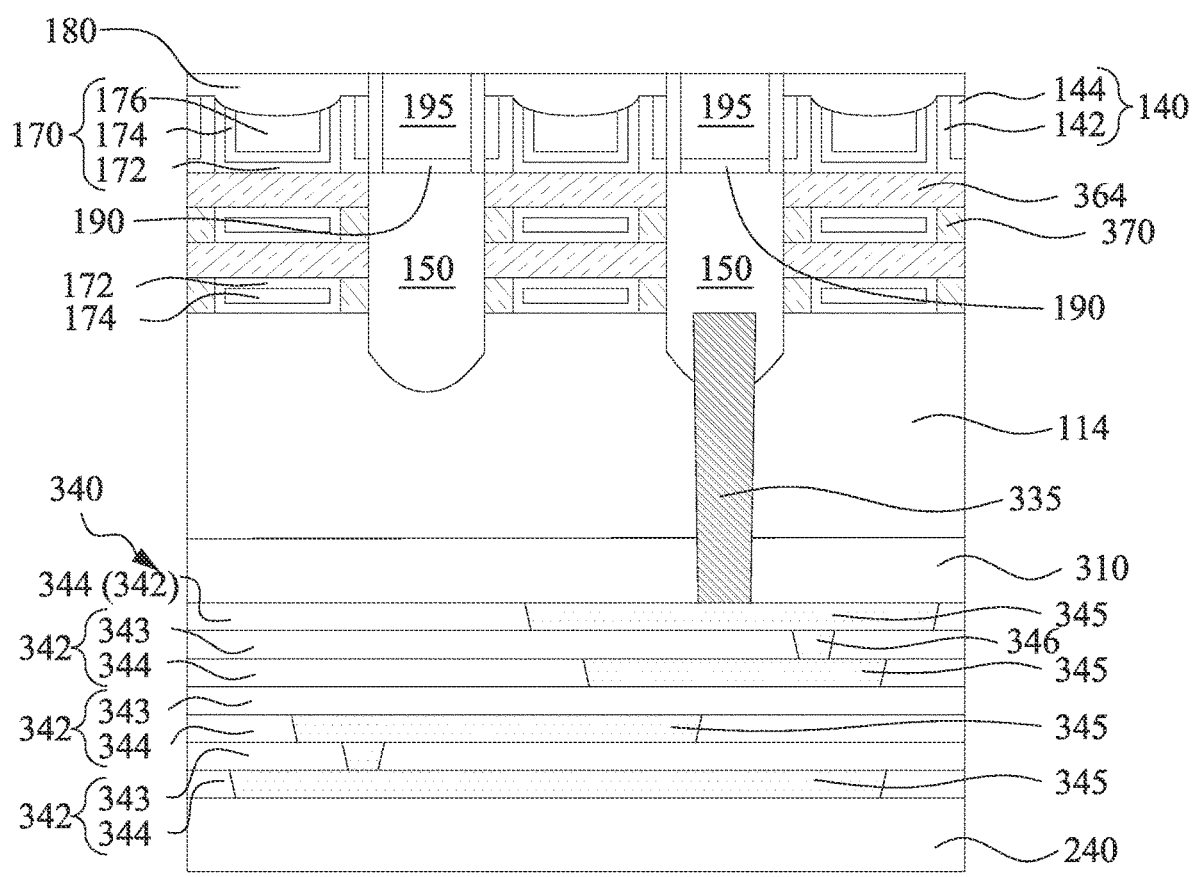
Figure 32C:
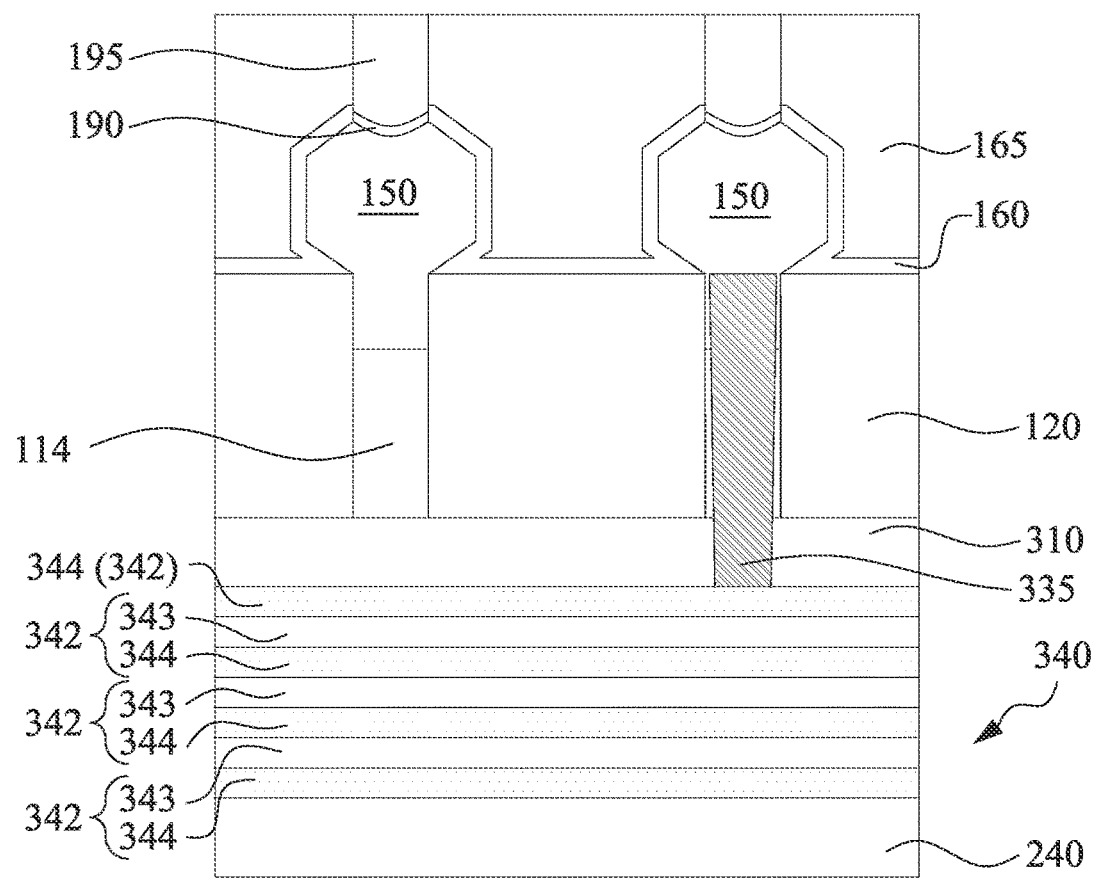

Reference is made to FIGS. 32A-32C, where FIG. 32B is a cross-sectional view taken along line I-I of FIG. 32A, and FIG. 32C is a cross-sectional view taken along line II-II of FIG. 32A. The gate structures 170 are then etched, and dielectric caps 180 are respectively formed on the gate structures 170. Materials, configurations, dimensions, processes and/or operations regarding the dielectric caps 180 are similar to or the same as the dielectric caps 180 of FIG. 12A.

Source/drain contacts 195 are formed extending through the second ILD layer 165. In some embodiments, metal alloy layers 190 are respectively formed above the source/drain epitaxial structures 150 prior to forming the source/drain contacts 195. Materials, configurations, dimensions, processes and/or operations regarding the source/drain contacts 195 are similar to or the same as the source/drain contacts 195 of FIG. 12A, and materials, configurations, dimensions, processes and/or operations regarding the metal alloy layers 190 are similar to or the same as the metal alloy layers 190 of FIG. 12A.

Figure 33A:
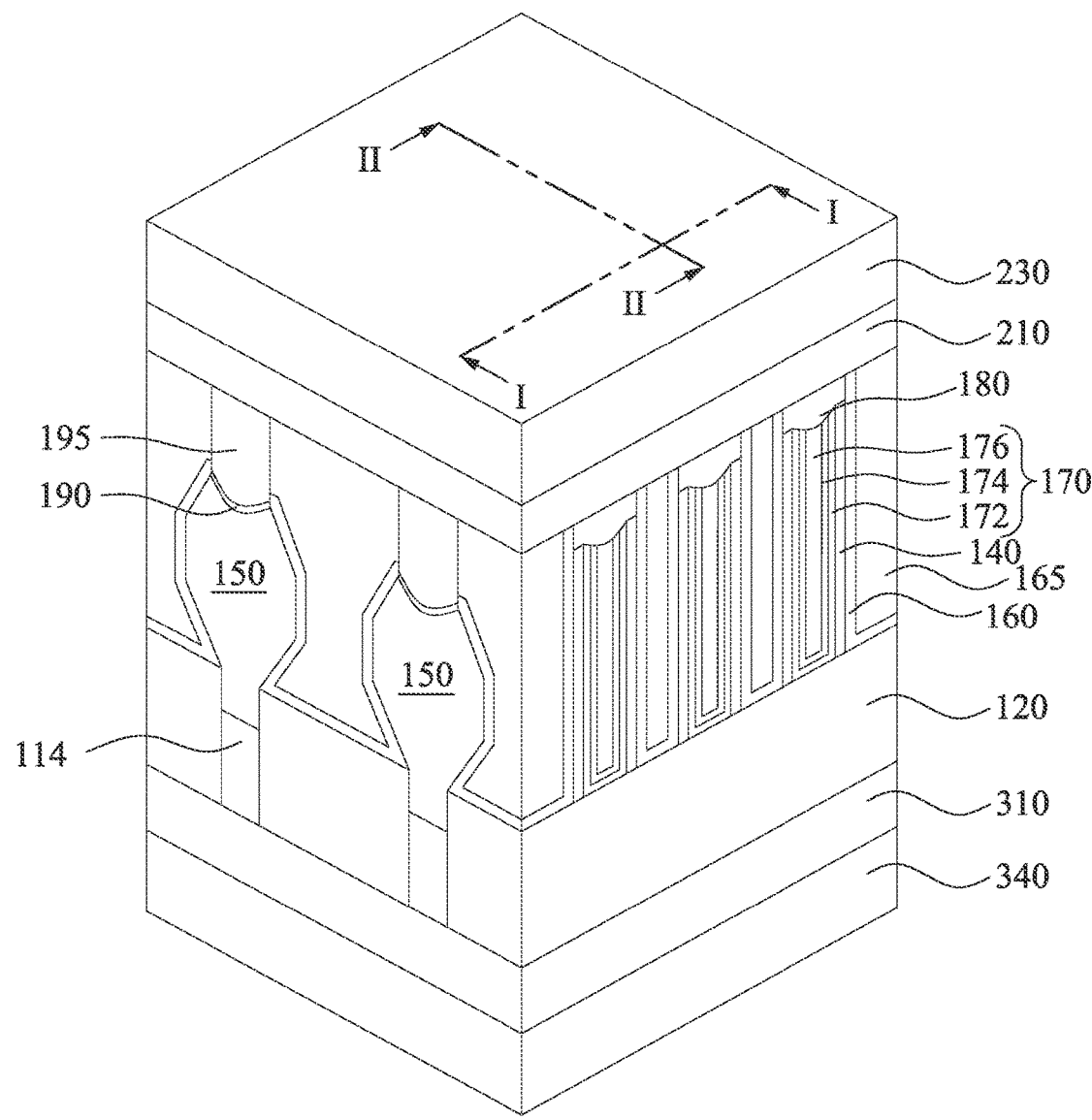
Figure 33B:
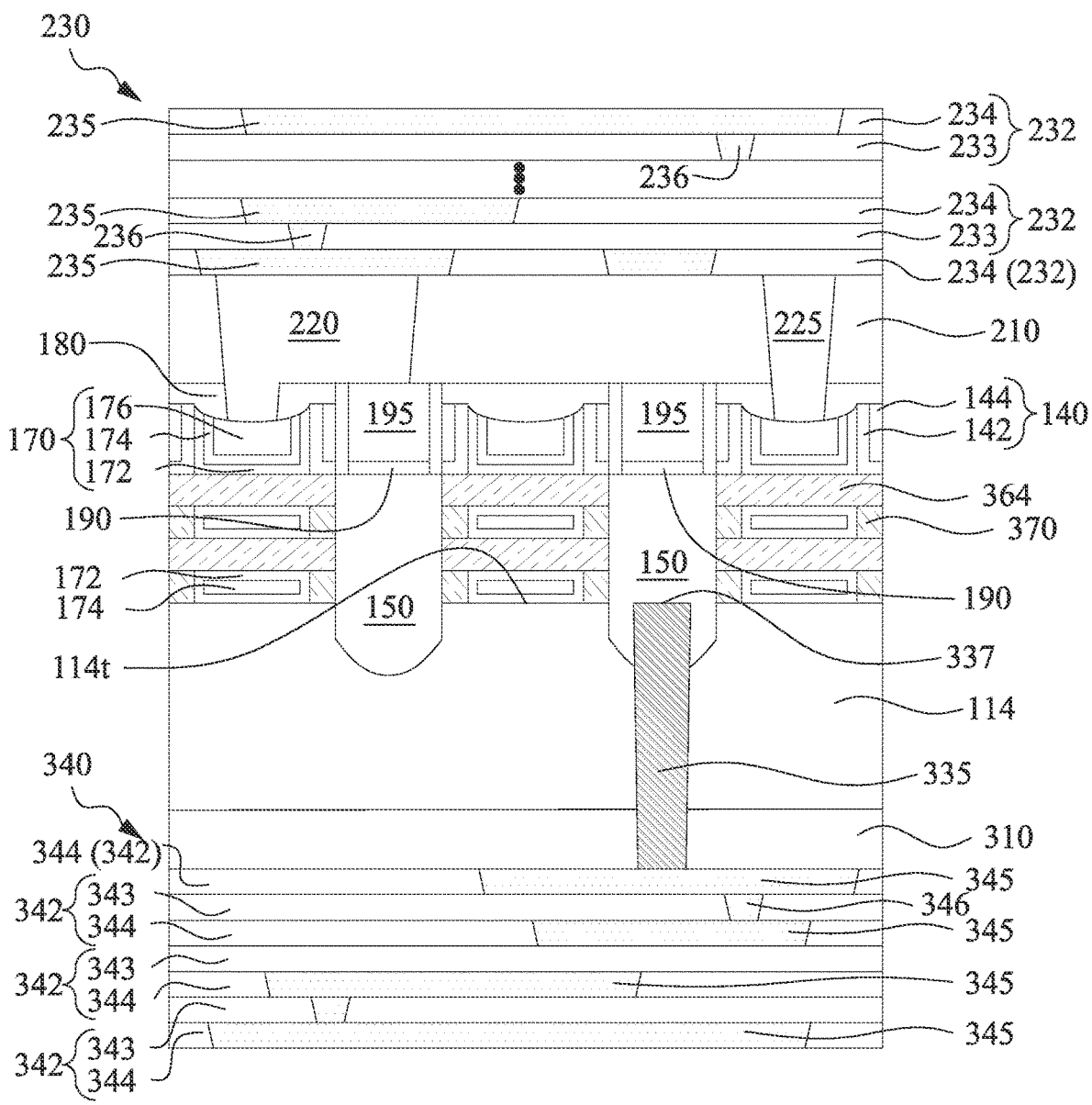
Figure 33C:
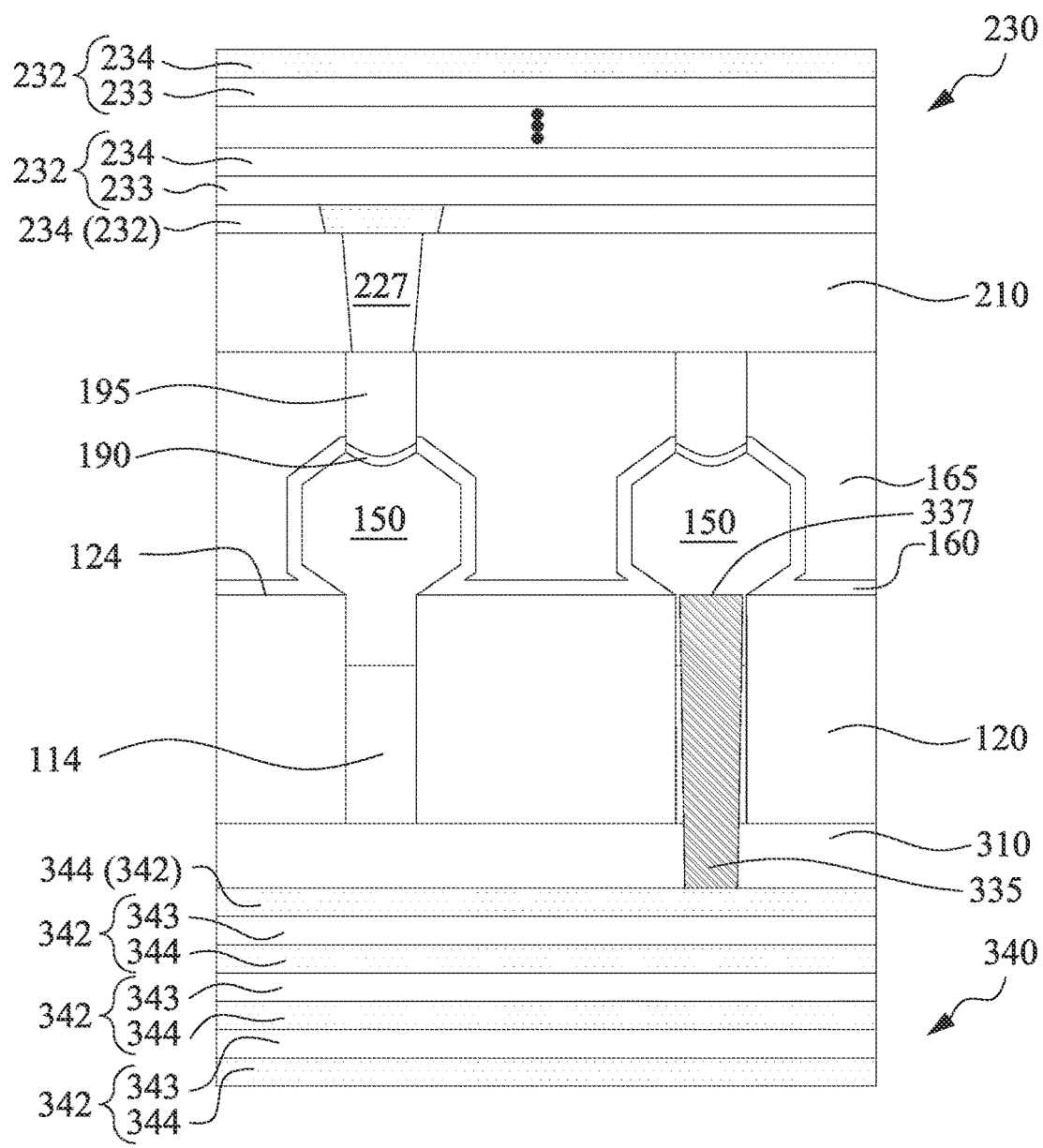

Reference is made to FIGS. 33A-33C, where FIG. 33B is a cross-sectional view taken along line I-I of FIG. 33A, and FIG. 33C is a cross-sectional view taken along line II-II of FIG. 33A. The structure of FIG. 32A undergoes the processes similar to the processes shown in FIGS. 13-16C. That is, a third ILD layer 210 is formed over the substrate 110. A butted via 220, a gate via 225, and a source/drain via 227 are formed in the third ILD layer 210. Materials, configurations, dimensions, processes and/or operations regarding the third ILD layer 210 are similar to or the same as the third ILD layer 210 of FIG. 13, and materials, configurations, dimensions, processes and/or operations regarding the butted via 220, the gate via 225, and the source/drain via 227 are similar to or the same as the butted via 220, the gate via 225, and the source/drain via 227 of FIG. 15.

A front-side MLI structure 230 is formed over the third ILD layer 210. Materials, configurations, dimensions, processes and/or operations regarding the front-side MLI structure 230 are similar to or the same as the front-side MLI structure 230 of FIGS. 16A-16C.

As shown in FIGS. 33A-33C, the semiconductor device 200 includes the second semiconductor layers 364, the gate structures 170 wrapping around the second semiconductor layers 364, the source/drain epitaxial structures 150 electrically connected to the second semiconductor layers 364 and on opposite sides of the gate structures 170, and the backside source/drain contact 335 under the at least one of the source/drain epitaxial structures 150. As such, the backside source/drain contact 335 is electrically connected to one of the source/drain epitaxial structures 150.

The semiconductor device 200 further includes the front-side MLI structure 230 and the backside MLI structure 340. As shown in FIGS. 33B and 33C, the backside source/drain contact 335 interconnects the source/drain epitaxial structure 150 and the backside MLI structure 340 and tapers downward, i.e., tapers from the source/drain epitaxial structure 150 toward the backside MLI structure 340. In some embodiments, a top surface 337 of the backside source/drain contact 335 is substantially coplanar with a top surface 114t of the base portion 114 as shown in FIG. 33B. In some embodiments, the top surface 337 of the backside source/drain contact 335 is substantially coplanar with a top surface 124 of the isolation structure as shown in FIG. 33C. Further, the metal lines 235 and the front-side conductive vias of the front-side MLI structure 230 and the metal lines 345 and the backside conductive vias 346 of the backside MLI structure 340 taper downward. In some embodiments, the semiconductor device 200 further includes the source/drain via 227 tapering downward.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the cell size of the semiconductor device can be shrinkage due to the backside source/drain contact formed at the backside of the semiconductor device. Another advantage is that the size of the backside source/drain contact can be enlarged due to the large space at the backside of the semiconductor device. With such configuration, the electrical performance of small-scaled semiconductor device can be improved.

According to some embodiments, a method includes forming a first multilayer interconnection structure over a carrier substrate. A first interlayer dielectric (ILD) layer is deposited over the first multilayer interconnection structure. A first source/drain contact is formed in the first ILD layer. After forming the first source/drain contact, a semiconductive layer is formed over the first source/drain contact and the first ILD layer. The semiconductive layer is patterned to form a semiconductor fin over the first source/drain contact. A gate structure is formed across the semiconductor fin. The semiconductor fin is patterned to form a first recess and a second recess in the semiconductor fin, such that the first recess exposes the first source/drain contact. First and second source/drain epitaxial structures are respectively formed in the first and second recesses of the semiconductor fin such that the first source/drain epitaxial structure is electrically connected to the first source/drain contact.

According to some embodiments, a method includes forming a first multilayer interconnection structure over a carrier substrate. A substrate is deposited over the first multilayer interconnection structure. A first source/drain contact is formed in the substrate and is electrically connected to the first multilayer interconnection structure. The substrate is patterned to form a semiconductive fin such that the first source/drain contact is embedded in the semiconductive fin. A gate structure is formed over the semiconductive fin. The semiconductive fin is patterned to form a recess in the semiconductive fin such that the recess exposes a top surface of the first source/drain contact. A source/drain epitaxial structure is formed in the recess and is in contact with the first source/drain contact.

According to some embodiments, a device includes a channel layer, a gate structure, first and second source/drain epitaxial structures, a second multilayer interconnection structure, and a first multilayer interconnection structure.

The gate structure is across the channel layer. The first and second source/drain epitaxial structures are connected to the channel layer and on opposite sides of the gate structure. The second multilayer interconnection structure is over the gate structure, is electrically connected to the first source/drain epitaxial structure, and includes a conductive line. The first multilayer interconnection structure is under the gate structure, is electrically connected to the second source/drain epitaxial structure, and includes a conductive line. Both the conductive line of the second multilayer interconnection structure and the conductive line of the first multilayer interconnection structure taper downward.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
  forming a first multilayer interconnection structure over a carrier substrate;
  depositing a substrate over the first multilayer interconnection structure;
  forming a first source/drain contact in the substrate and electrically connected to the first multilayer interconnection structure;
  patterning the substrate to form a semiconductive fin such that the first source/drain contact is embedded in the semiconductive fin;
  forming a gate structure over the semiconductive fin;
  patterning the semiconductive fin to form a recess in the semiconductive fin such that the recess exposes a top surface of the first source/drain contact; and
  forming a source/drain epitaxial structure in the recess and in contact with the first source/drain contact.

2. The method of claim 1, further comprising forming a semiconductive stacked structure over the substrate after forming the first source/drain contact and prior to patterning the substrate.

3. The method of claim 2, wherein forming the semiconductive stacked structure comprises:
  forming a first semiconductive layer over the substrate and in contact with the first source/drain contact; and
  forming a second semiconductive layer over the first semiconductive layer, wherein the first and second semiconductive layers comprise different materials.

4. The method of claim 3, further comprising pattering the semiconductive stacked structure to form a fin structure covering the first source/drain contact.

5. The method of claim 1, further comprising forming an isolation structure surrounding the semiconductive fin, such that a top surface of the isolation structure is lower than a top surface of the first source/drain contact.

6. The method of claim 1, further comprising forming a second multilayer interconnection structure over the gate structure and the source/drain epitaxial structure.

7. The method of claim 6, wherein forming the second multilayer interconnection structure is such that both a metal line of the second multilayer interconnection structure and a metal line of the first multilayer interconnection structure taper downward.

8. A method comprising:
  forming a first interlayer dielectric (ILD) layer over a first multilayer interconnection structure on a carrier substrate;
  forming a substrate over the first ILD layer;
  forming a first source/drain contact through the substrate and the first ILD layer to the first multilayer interconnection structure; and
  after the first source/drain contact is formed, patterning the substrate to form a semiconductive fin, wherein the first source/drain contact is embedded in the semiconductive fin and the first ILD layer.

9. The method of claim 8, further comprising:
  forming a gate structure over the semiconductive fin.

10. The method of claim 8, further comprising:
  forming a first source/drain epitaxial structure in contact with a top surface and a sidewall of the first source/drain contact.

11. The method of claim 10, wherein the first source/drain epitaxial structure extends between the first source/drain contact and the semiconductive fin.

12. The method of claim 10, further comprising:
  forming a second source/drain contact over the first source/drain epitaxial structure.

13. The method of claim 10, further comprising:
  forming a second source/drain epitaxial structure in the semiconductive fin and spaced apart from the first source/drain epitaxial structure.

14. The method of claim 8, further comprising:
  forming an isolation structure surrounding the semiconductive fin, such that a top surface of the isolation structure is lower than a top surface of the first source/drain contact.

15. A method, comprising:
  forming a first multilayer interconnection structure over a carrier substrate;
  forming a substrate over the first multilayer interconnection structure
  forming a first source/drain contact embedded in the substrate;
  patterning the substrate to form semiconductive fins, wherein the first source/drain contact is embedded in one of the semiconductive fins; and
  forming isolation structures between the semiconductive fins, wherein the first source/drain contact protrudes from the isolation structures.

16. The method of claim 15, wherein a bottom surface of the first source/drain contact is lower than bottom surfaces of the semiconductive fins.

17. The method of claim 15, further comprising:
  forming a source/drain epitaxial structure in contact with top surface and sidewall of the first source/drain contact.

18. The method of claim 17, further comprising:
  forming a second source/drain contact over the source/drain epitaxial structure.

19. The method of claim 17, further comprising:
  forming a second multilayer interconnection structure over the source/drain epitaxial structure.

20. The method of claim 19, forming the second multilayer interconnection structure is such that both a metal line of the second multilayer interconnection structure and a metal line of the first multilayer interconnection structure taper downward.

\* \* \* \* \*